US010446401B2

(12) United States Patent
Makiyama

(10) Patent No.: US 10,446,401 B2
(45) Date of Patent: Oct. 15, 2019

(54) METHOD OF MANUFACTURING SEMICONDUCTOR DEVICE

(71) Applicant: RENESAS ELECTRONICS CORPORATION, Tokyo (JP)

(72) Inventor: Hideki Makiyama, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/129,549

(22) Filed: Sep. 12, 2018

(65) Prior Publication Data
US 2019/0164764 A1    May 30, 2019

(30) Foreign Application Priority Data

Nov. 29, 2017 (JP) ................................. 2017-229011

(51) Int. Cl.
| *H01L 21/28* | (2006.01) |
| *H01L 27/1157* | (2017.01) |
| *H01L 21/324* | (2006.01) |
| *H01L 29/792* | (2006.01) |
| *H01L 29/423* | (2006.01) |
| *H01L 27/11573* | (2017.01) |

(52) U.S. Cl.
CPC ...... *H01L 21/28202* (2013.01); *H01L 21/324* (2013.01); *H01L 27/1157* (2013.01); *H01L 27/11573* (2013.01); *H01L 29/4234* (2013.01); *H01L 29/42344* (2013.01); *H01L 29/792* (2013.01); *H01L 21/28238* (2013.01)

(58) Field of Classification Search
None
See application file for complete search history.

(56) References Cited

U.S. PATENT DOCUMENTS

| 4,306,353 A * | 12/1981 | Jacobs | H01L 21/033 |
| | | | 438/200 |
| 4,319,395 A * | 3/1982 | Lund | H01L 21/0332 |
| | | | 257/346 |
| 5,120,670 A * | 6/1992 | Bergmont | H01L 21/28273 |
| | | | 257/E21.209 |
| 5,168,334 A * | 12/1992 | Mitchell | H01L 27/115 |
| | | | 257/324 |
| 5,349,221 A * | 9/1994 | Shimoji | G11C 16/0466 |
| | | | 257/324 |
| 5,677,206 A * | 10/1997 | Lee | H01L 29/78621 |
| | | | 438/151 |

(Continued)

FOREIGN PATENT DOCUMENTS

WO    2015/112245 A1    7/2015

OTHER PUBLICATIONS

Extended European Search Report issued in corresponding European Patent Application No. 18206251.3-1212, dated Apr. 16, 2019.

*Primary Examiner* — David E Graybill
(74) *Attorney, Agent, or Firm* — McDermott Will & Emery LLP

(57) ABSTRACT

Reliability of a semiconductor device is improved. In a method of manufacturing a semiconductor device, nitrogen is introduced into a surface of a substrate and a sacrificial film is formed on the surface in a field effect transistor formation region different from a memory transistor formation region. Subsequently, the sacrificial film is removed to remove the nitrogen introduced in the surface of the substrate in the field effect transistor formation region.

14 Claims, 35 Drawing Sheets

(56) References Cited

U.S. PATENT DOCUMENTS

| | | | | |
|---|---|---|---|---|
| 5,966,603 A * | 10/1999 | Eitan | H01L 27/11568 | 257/E21.679 |
| 6,069,382 A * | 5/2000 | Rahim | H01L 21/28273 | 257/316 |
| 6,225,167 B1 | 5/2001 | Yu et al. | | |
| 6,297,096 B1 * | 10/2001 | Boaz | H01L 21/28282 | 257/E21.679 |
| 6,348,711 B1 * | 2/2002 | Eitan | G11C 11/5671 | 257/316 |
| 6,399,446 B1 * | 6/2002 | Rangarajan | H01L 27/115 | 257/E21.679 |
| 6,410,388 B1 * | 6/2002 | Kluth | H01L 27/115 | 257/E21.682 |
| 6,417,081 B1 * | 7/2002 | Thurgate | H01L 27/115 | 257/E21.679 |
| 6,436,768 B1 * | 8/2002 | Yang | H01L 21/2652 | 438/266 |
| 6,468,865 B1 * | 10/2002 | Yang | H01L 27/115 | 257/314 |
| 6,475,862 B1 * | 11/2002 | Ando | H01L 21/28202 | 438/264 |
| 6,541,816 B2 * | 4/2003 | Ramsbey | H01L 27/105 | 257/324 |
| 6,562,683 B1 * | 5/2003 | Wang | H01L 21/26586 | 438/258 |
| 6,680,230 B2 * | 1/2004 | Arai | H01L 27/105 | 257/E21.689 |
| 6,806,117 B2 * | 10/2004 | King | H01L 21/265 | 438/60 |
| 6,808,991 B1 * | 10/2004 | Tung | H01L 27/11568 | 257/E21.679 |
| 6,867,463 B2 * | 3/2005 | Chang | H01L 21/28282 | 257/390 |
| 6,869,844 B1 * | 3/2005 | Liu | H01L 27/0248 | 257/173 |
| 6,908,815 B2 * | 6/2005 | Ye | H01L 21/76897 | 257/E21.507 |
| 6,958,272 B2 * | 10/2005 | Lingunis | H01L 21/26586 | 257/E21.345 |
| 6,962,849 B1 * | 11/2005 | Kamal | H01L 27/115 | 257/E21.682 |
| 6,989,320 B2 * | 1/2006 | Qian | H01L 27/115 | 257/E21.679 |
| 7,015,101 B2 * | 3/2006 | Zheng | H01L 27/105 | 257/E21.679 |
| 7,015,253 B2 * | 3/2006 | Escandon | A61B 17/32037 | 514/724 |
| 7,176,113 B1 * | 2/2007 | Wong | H01L 21/28282 | 257/E21.135 |
| 7,217,972 B2 * | 5/2007 | Mori | H01L 21/28282 | 257/314 |
| 7,227,234 B2 * | 6/2007 | Roizin | B82Y 10/00 | 257/393 |
| 7,253,046 B2 * | 8/2007 | Higashi | H01L 21/28282 | 438/216 |
| 7,320,920 B2 * | 1/2008 | Kim | H01L 21/28282 | 257/E21.21 |
| 7,410,857 B2 * | 8/2008 | Higashi | H01L 21/28282 | 438/216 |
| 7,501,683 B2 * | 3/2009 | Lai | H01L 21/31155 | 257/324 |
| 7,514,323 B2 * | 4/2009 | Dobuzinsky | H01L 21/26586 | 257/330 |
| 7,642,158 B2 * | 1/2010 | Parascandola | H01L 27/115 | 257/324 |
| 7,678,674 B1 * | 3/2010 | Sinha | H01L 21/26586 | 257/E21.147 |
| 7,763,935 B2 * | 7/2010 | Shih | H01L 21/28282 | 257/314 |
| 7,791,129 B2 * | 9/2010 | Terai | G11C 16/0466 | 257/323 |
| 7,799,670 B2 * | 9/2010 | Ramkumar | H01L 21/28282 | 257/325 |
| 7,816,728 B2 * | 10/2010 | Ho | H01L 27/115 | 257/324 |
| 7,838,923 B2 * | 11/2010 | Lue | G11C 11/5621 | 257/324 |
| 7,872,299 B2 * | 1/2011 | Won | H01L 27/115 | 257/326 |
| 8,030,166 B2 * | 10/2011 | Lue | G11C 11/5621 | 257/324 |
| 8,093,128 B2 * | 1/2012 | Koutny, Jr. | H01L 21/823412 | 257/324 |
| 8,120,095 B2 * | 2/2012 | Ho | H01L 27/1157 | 257/327 |
| 8,143,129 B2 * | 3/2012 | Ramkumar | H01L 21/823412 | 257/324 |
| 8,163,660 B2 * | 4/2012 | Puchner | H01L 21/28282 | 438/786 |
| 8,409,950 B1 * | 4/2013 | Shea | H01L 21/823456 | 257/E21.679 |
| 8,441,063 B2 * | 5/2013 | Fang | H01L 21/28282 | 257/324 |
| 8,629,025 B2 * | 1/2014 | Chen | H01L 29/792 | 257/324 |
| 8,679,927 B2 * | 3/2014 | Ramkumar | H01L 21/823412 | 257/324 |
| 8,685,813 B2 * | 4/2014 | Ramkumar | H01L 21/28282 | 438/211 |
| 8,722,496 B1 * | 5/2014 | Roizin | H01L 21/28282 | 438/142 |
| 8,796,098 B1 * | 8/2014 | Ramkumar | H01L 29/66833 | 438/287 |
| 8,883,624 B1 * | 11/2014 | Ramkumar | H01L 21/28282 | 438/587 |
| 8,916,432 B1 | 12/2014 | Ramkumar et al. | | |
| 9,202,701 B1 * | 12/2015 | Chou | H01L 29/66833 | |
| 2001/0031532 A1 * | 10/2001 | Tsugane | H01L 27/10894 | 438/258 |
| 2002/0016081 A1 * | 2/2002 | Aloni | H01L 21/31116 | 438/714 |
| 2002/0119645 A1 * | 8/2002 | Chang | H01L 21/26586 | 438/514 |
| 2002/0146885 A1 * | 10/2002 | Chen | H01L 27/115 | 438/288 |
| 2002/0164855 A1 * | 11/2002 | Pan | H01L 29/66833 | 438/257 |
| 2002/0182829 A1 * | 12/2002 | Chen | H01L 21/26586 | 438/514 |
| 2003/0040152 A1 * | 2/2003 | Liu | H01L 27/115 | 438/239 |
| 2003/0067032 A1 * | 4/2003 | Caprara | H01L 27/115 | 257/324 |
| 2003/0232507 A1 * | 12/2003 | Chen | H01L 21/28158 | 438/763 |
| 2004/0043622 A1 * | 3/2004 | Chen | H01L 27/115 | 438/735 |
| 2004/0082198 A1 * | 4/2004 | Nakamura | H01J 37/32192 | 438/787 |
| 2004/0108540 A1 * | 6/2004 | Yoshino | H01L 27/115 | 257/315 |
| 2004/0119108 A1 * | 6/2004 | Chang | H01L 21/28282 | 257/315 |
| 2005/0214996 A1 * | 9/2005 | Yoshino | H01L 27/115 | 438/197 |
| 2005/0255651 A1 * | 11/2005 | Qian | H01L 27/115 | 438/257 |
| 2006/0091424 A1 * | 5/2006 | Strassburg | H01L 27/115 | 257/208 |
| 2006/0205148 A1 * | 9/2006 | Deppe | H01L 21/28282 | 438/257 |
| 2006/0211188 A1 * | 9/2006 | Lusky | H01L 27/115 | 438/201 |
| 2006/0261418 A1 * | 11/2006 | Eitan | H01L 27/115 | 257/390 |

(56) References Cited

U.S. PATENT DOCUMENTS

| | | | |
|---|---|---|---|
| 2006/0281255 A1* | 12/2006 | Chiu | H01L 21/26586 438/257 |
| 2006/0292800 A1* | 12/2006 | Shih | H01L 21/28282 438/261 |
| 2007/0026621 A1* | 2/2007 | Cho | H01L 27/10852 438/314 |
| 2007/0048940 A1* | 3/2007 | Eitan | H01L 21/0337 438/257 |
| 2007/0132041 A1 | 6/2007 | Yoon | |
| 2007/0173017 A1* | 7/2007 | Eitan | H01L 27/115 438/257 |
| 2008/0116447 A1* | 5/2008 | Lojek | H01L 21/28282 257/24 |
| 2008/0145985 A1* | 6/2008 | Chi | B82Y 10/00 438/199 |
| 2008/0150008 A1* | 6/2008 | Kim | H01L 21/28282 257/324 |
| 2008/0283905 A1* | 11/2008 | Won | H01L 27/115 257/326 |
| 2009/0181530 A1* | 7/2009 | Lisiansky | H01L 21/02178 438/591 |
| 2010/0041222 A1* | 2/2010 | Puchner | H01L 21/28282 438/591 |
| 2010/0080244 A1* | 4/2010 | Staehling | H04J 3/1611 370/468 |
| 2013/0178031 A1* | 7/2013 | Ramkumar | H01L 21/823412 438/287 |
| 2014/0091383 A1* | 4/2014 | Chen | H01L 29/792 257/324 |
| 2014/0103418 A1* | 4/2014 | Puchner | H01L 21/28282 257/324 |
| 2014/0209994 A1* | 7/2014 | Roizin | H01L 29/792 257/324 |
| 2015/0287811 A1* | 10/2015 | Ramkumar | H01L 21/28282 438/287 |
| 2019/0164764 A1* | 5/2019 | Makiyama | H01L 21/28202 |

* cited by examiner

LARGE LEAKAGE CURRENT

SMALL LEAKAGE CURRENT

METHOD OF MANUFACTURING SEMICONDUCTOR DEVICE

CROSS-REFERENCE TO RELATED APPLICATIONS

The disclosure of Japanese Patent Application No. 2017-229011 filed on Nov. 29, 2017 including the specification, drawings and abstract is incorporated herein by reference in its entirety.

BACKGROUND

The present invention relates to a method of manufacturing a semiconductor device. For example, the invention is effectively used for a manufacturing technique of a semiconductor device including a nonvolatile memory cell.

An electrically erasable and programmable read only memory (EEPROM) and a flash memory are each widely used as an electrically writable and erasable nonvolatile memory cell. Such a nonvolatile memory cell includes a floating gate electrode surrounded by an insulating film such as an oxide film or a trapping insulating film below a gate electrode of a metal insulator semiconductor field effect transistor (MISFET), and uses a charge state stored in the floating gate electrode or the trapping insulating film as storage information. The trapping insulating film refers to a charge-storable insulating film, and exemplarily includes a silicon nitride film. A metal-oxide-nitride-oxide-semiconductor (MONOS) transistor (memory transistor) is widely used as such a nonvolatile memory cell.

For example, International Publication No. WO 2015/112245 describes a manufacturing technique of a semiconductor device including a nonvolatile memory and a field effect transistor.

SUMMARY

A gate insulating film of a memory transistor is configured of a lower film including a silicon oxide film formed by thermally oxidizing a semiconductor substrate, a charge storage film including a silicon nitride film formed on the lower film, and an upper film including a silicon oxide film formed on the charge storage film. The lower film is subjected to heat treatment in an NO or $N_2O$ atmosphere to introduce nitrogen into an interface between the lower film and a semiconductor substrate in order to improve nonvolatile memory characteristics such as a retention characteristic. However, the heat treatment is performed on the entire (the entire surface of the) semiconductor substrate, and thus may vary or deteriorate characteristics of a field effect transistor formed in a region different from a region of the memory transistor.

Other objects and novel features will be clarified from the description of this specification and the accompanying drawings.

In a method of manufacturing a semiconductor device according to one embodiment, a sacrificial film is formed on a surface of a substrate, in which nitrogen is segregated, in a field effect transistor formation region different from a memory transistor formation region, and then the sacrificial film is removed, thereby the nitrogen segregated in the surface of the substrate is removed in the field effect transistor formation region.

According to the one embodiment, reliability of the semiconductor device can be improved.

DETAILED DESCRIPTION

Although each of the following embodiments may be dividedly described in a plurality of sections or embodiments for convenience as necessary, they are not unrelated to one another except for the particularly defined case, and are in a relationship where one is a modification, detailed explanation, supplementary explanation, or the like of part or all of another one.

In each of the following embodiments, when the number of elements and others (including the number, a numerical value, amount, and a range) is mentioned, the number is not limited to a specified number except for the particularly defined case and for the case where the number is principally clearly limited to the specified number. In other words, the number may be not less than or not more than the specified number.

In each of the following embodiments, a constitutional element (including an element step etc.) of the embodiment is not necessarily indispensable except for the particularly defined case and for the case where the constitutional element is considered to be indispensable in principle.

Similarly, in the following embodiment, when a shape of a constitutional element, a positional relationship, and others are described, any configuration substantially closely related to or similar to such a shape or the like should be included except for the particularly defined case and for the case where such a configuration is considered to be not included in principle. The same holds true in the numerical value and the range.

In all drawings for explaining the embodiments, components having the same function are designated by the same numeral in principle, and duplicated description is omitted. A plan view may be hatched for better viewability.

First Embodiment

Layout Configuration of Semiconductor Chip

Figure 1:
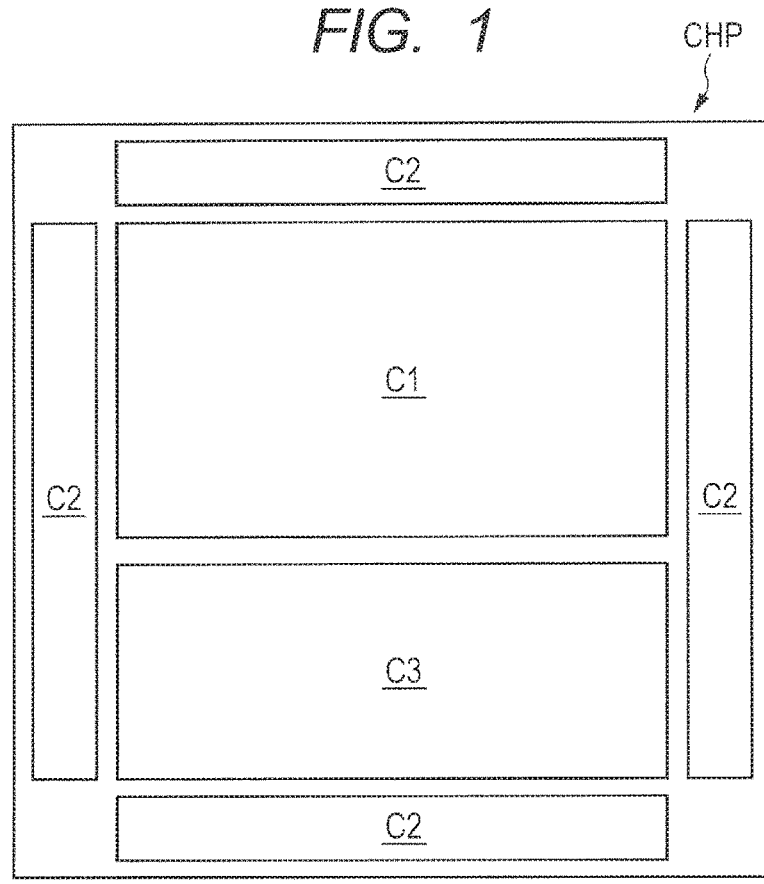
FIG. 1 is a circuit block diagram illustrating a schematic layout configuration of a semiconductor chip of a first embodiment.

FIG. 1 is a circuit block diagram illustrating a schematic layout configuration of a semiconductor chip CHP of a first embodiment.

A circuit block C1 configures a nonvolatile memory circuit including EEPROM and a flash memory, and is a region in which a plurality of memory cells MC are formed as semiconductor elements.

A circuit block C2 configures an input-output circuit, and is a region in which a high-withstand-voltage MISFET driven by a voltage of about 3.3V is formed as a semiconductor element.

A circuit block C3 configures a logic circuit including a central processing unit (CPU) and a static random access memory (SRAM), and is a region in which a low-withstand-voltage MISFET, which has a lower withstand voltage than the high-withstand-voltage MISFET and is driven by a voltage of about 0.75 V, is formed as a semiconductor element.

Circuit Configuration of Memory Cell

Figure 2:
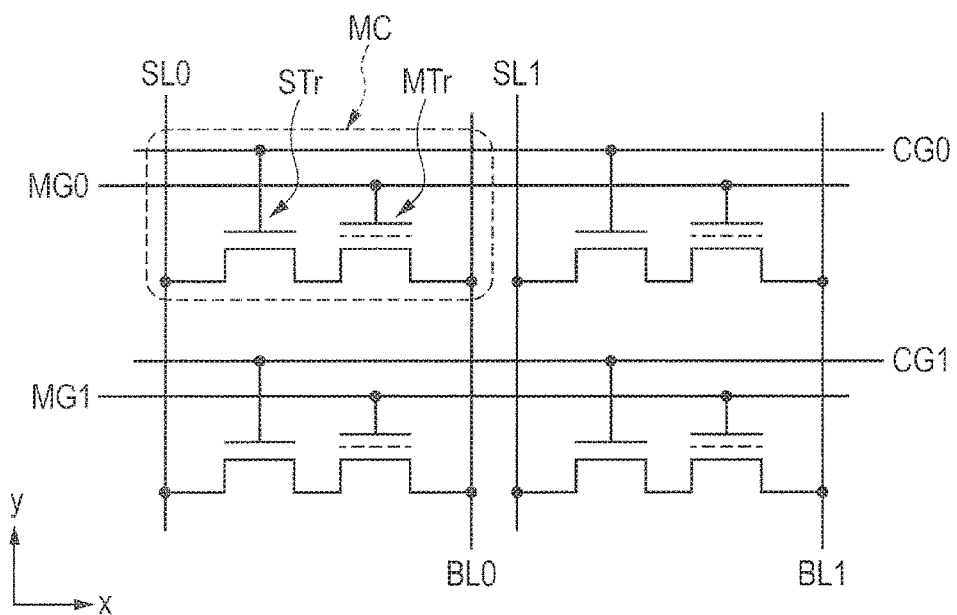
FIG. 2 is a circuit diagram of four memory cells (nonvolatile memory cells), showing part of a nonvolatile memory circuit of a first circuit block.

FIG. 2 is a circuit diagram of four memory cells (nonvolatile memory cells) MC, showing part of the nonvolatile memory circuit of the circuit block C1.

One memory cell MC includes a memory transistor MTr and a selection transistor STr, and is connected with a memory gate line MG0, a control gate line CG0, a bit line BL0, and a source line SL0, for example. The memory cells MC are formed in an active region partitioned by an element isolation part. In the active region, the source region and the drain region of the memory cell MC are mainly formed.

In FIG. 2, each of the memory gate lines MG0 and MG1 extends in an x direction, and is connected with the memory cells MC adjacent in the x direction.

Each of the control gate lines CG0 and CG1 extends in the x direction, and is connected with the memory cells MC adjacent in the x direction.

Each of the bit lines BL0 and BL1 extends in a y direction, and is connected with the memory cells MC adjacent in the y direction.

Each of the source lines SL0 and SL1 extends in the y direction, and is connected with the memory cells MC adjacent in the y direction.

Necessity of Introduction of Nitrogen into Memory Transistor

As described above, the memory cell is configured of the memory transistor and the selection transistor, and memorizes information in the memory transistor. Specifically, the memory transistor includes a first potential barrier film formed on a channel formation region, a charge storage film formed on the first potential barrier film, and a second potential barrier film formed on the charge storage film, and a memory gate electrode formed on the second potential barrier film. The charge storage film includes, for example, an insulating film having a trap level typified by a silicon nitride film. Capture of electrons in the trap level increases a threshold voltage for forming an inversion layer in the channel formation region. Hence, when electrons are stored in the charge storage film, a read voltage applied to the memory gate electrode is beforehand set so as to be smaller than the threshold voltage. On the other hand, when no electron is stored in the charge storage film, the read voltage applied to the memory gate electrode is beforehand set so as to be larger than the threshold voltage. As a result, when the read voltage is applied to the memory gate electrode, whether the inversion layer is formed in the channel formation region depends on whether electrons are stored in the charge storage film. That is, when electrons are stored in the charge storage film, even if the read voltage is applied to the memory gate electrode, the inversion layer is not formed in the channel formation region, and no read current flows. On the other hand, when no electron is stored in the charge storage film, and if the read voltage is applied to the memory gate electrode, the inversion layer is formed in the channel formation region, and the read current flows. In this way, for example, a state where electrons are stored in the charge storage film and no read current flows is set in correspondence to "1", and a state where no electron is stored in the charge storage film and the read current flows is set in correspondence to "0", thereby information can be memorized in the memory transistor. If the electrons stored in the charge storage film escape from the charge storage film toward the substrate, the information of "1" memorized in the memory transistor may be changed to the information of "0". This means loss of information stored in the memory transistor. For the memory transistor, therefore, it is important to improve retention characteristics of the charge storage film.

With this regard, in the memory transistor, a first potential barrier film formed between the charge storage film and the substrate is devised to improve the retention characteristics of the charge storage film. Specifically, nitrogen is typically introduced into the first potential barrier film including, for example, a silicon oxide film. This is because potential of the first potential barrier film with respect to electron can be increased by introducing nitrogen into the first potential barrier film including the silicon oxide film. Specifically, increasing the potential of the first potential barrier film with respect to electron makes it possible to reduce leakage of electrons stored in the charge storage film toward the substrate. Hence, introduction of nitrogen into the first potential barrier film including the silicon oxide film makes it possible to improve the retention characteristics of the charge storage film. As described above, nitrogen is introduced into the first potential barrier film configuring the memory transistor in light of improving the retention characteristics of the memory transistor. In other words, in the memory transistor, nitrogen needs to be introduced into the first potential barrier film to improve the retention characteristics.

Nitrogen Introduction Method

In a first possible method of introducing nitrogen into the first potential barrier film configuring the memory transistor, plasma nitriding treatment is performed on the first potential barrier film including the silicon oxide film. However, the plasma nitriding treatment damages the first potential barrier film, and thus rather deteriorates the retention characteristics of the memory transistor. Consequently, a method of heating the substrate in an atmosphere containing nitrogen typified by an NO atmosphere or $N_2O$ atmosphere is used as a method of introducing nitrogen into the first potential barrier film configuring the memory transistor. However, unlike the plasma nitriding treatment that nitrides the surface of the first potential barrier film, the heating treatment in the atmosphere containing nitrogen induces a phenomenon where nitrogen penetrates to the inside of the first potential barrier film and is thus segregated at an interface between the first potential barrier film and the channel formation region. As a result, a secondary effect occurs due to the heating treatment in the atmosphere containing nitrogen. The secondary effect associated with such nitrogen introduction is described below.

Secondary Effect Associated with Nitrogen Introduction

For example, the heating treatment in the atmosphere containing nitrogen is performed after the silicon oxide film to be the first potential barrier film is formed on the substrate. Specifically, the heating treatment in the atmosphere containing nitrogen is performed in a state where the silicon oxide film to be the first potential barrier film is formed on the entire main surface of the substrate. This means that the heating treatment in the atmosphere containing nitrogen is performed in the state where the silicon oxide film is formed not only in a memory transistor formation region but also in a field effect transistor formation region other than the memory transistor formation region. In such a case, the heating treatment in the atmosphere containing nitrogen causes nitrogen to be also introduced into (segregated at) an interface between the channel formation region of the memory transistor formation region and the first potential barrier film, or an interface between the channel formation region of the field effect transistor formation region and a gate insulating film. That is, nitrogen is also segregated at the interface between the channel formation region of the field effect transistor formed in the field effect transistor formation region and the gate insulating film, causing deterioration in characteristics of the field effect transistor. In detail, when the field effect transistor is a p-channel-type field effect transistor, negative bias temperature instability (NBTI) is induced. The NBTI means a phenomenon where when substrate temperature increases while a substrate potential is negative with respect to a gate electrode of a p-channel-type field effect transistor, an absolute value of the threshold voltage of the p-channel-type field effect transistor gradually increases, leading to variations in the characteristics (drain current and threshold voltage) of the p-channel-type field effect transistor. If such NBTI occurs, poor operation of the p-channel-type field effect transistor is finally caused. In particular, the NBTI tends to be easily actualized in the gate insulating film containing a large amount of nitrogen. Hence, when the heating treatment is performed in the atmosphere containing nitrogen and thus nitrogen is segregated at the interface between the channel formation region of the p-channel-type field effect transistor formation region and the gate insulating film, the NBTI, causing deterioration in the p-channel-type field effect transistor, is actualized.

On the other hand, when the field effect transistor is an n-channel-type field effect transistor, nitrogen may also be segregated at an interface between a channel formation region of an n-channel-type field effect transistor formation region and a gate insulating film by the heating treatment in the atmosphere containing nitrogen, causing a variation in threshold voltage of the n-channel-type field effect transistor. Consequently, deterioration in characteristics of the transistor due to the heating treatment in the atmosphere containing nitrogen is actualized in the case where the field effect transistor is each of the p-channel-type field effect transistor and the n-channel-type field effect transistor. That is, the heating treatment in the atmosphere containing nitrogen is useful in light of introducing nitrogen into the interface with the first potential barrier film formed in the memory transistor formation region to improve the retention characteristics of the memory transistor. On the other hand, the heating treatment in the atmosphere containing nitrogen causes segregation of nitrogen at the interface between the channel formation region of the field effect transistor formed in the field effect transistor formation region and the gate insulating film, resulting in the secondary effect of deterioration in characteristics of the field effect transistor.

For example, in a technique (hereinafter, referred to as "2-poly technique"), the polysilicon film configuring the memory gate electrode of the memory transistor and the polysilicon film configuring the gate electrode of the field effect transistor are separately formed. In such a technique, the secondary effect due to the heating treatment in the atmosphere containing nitrogen is not actualized, that is, the characteristics of the field effect transistor are not deteriorated. The reason for this is as follows. In the 2-poly technique, the heating treatment in the atmosphere containing nitrogen is performed while the polysilicon film exists on the gate insulating film in the field effect transistor formation region. That is, in the 2-poly technique, since the heating treatment in the atmosphere containing nitrogen is performed while the polysilicon film exists on the gate insulating film in the field effect transistor formation region, no nitrogen is segregated at the interface between the gate insulating film and the channel formation region in the field effect transistor formation region.

Figure 3:
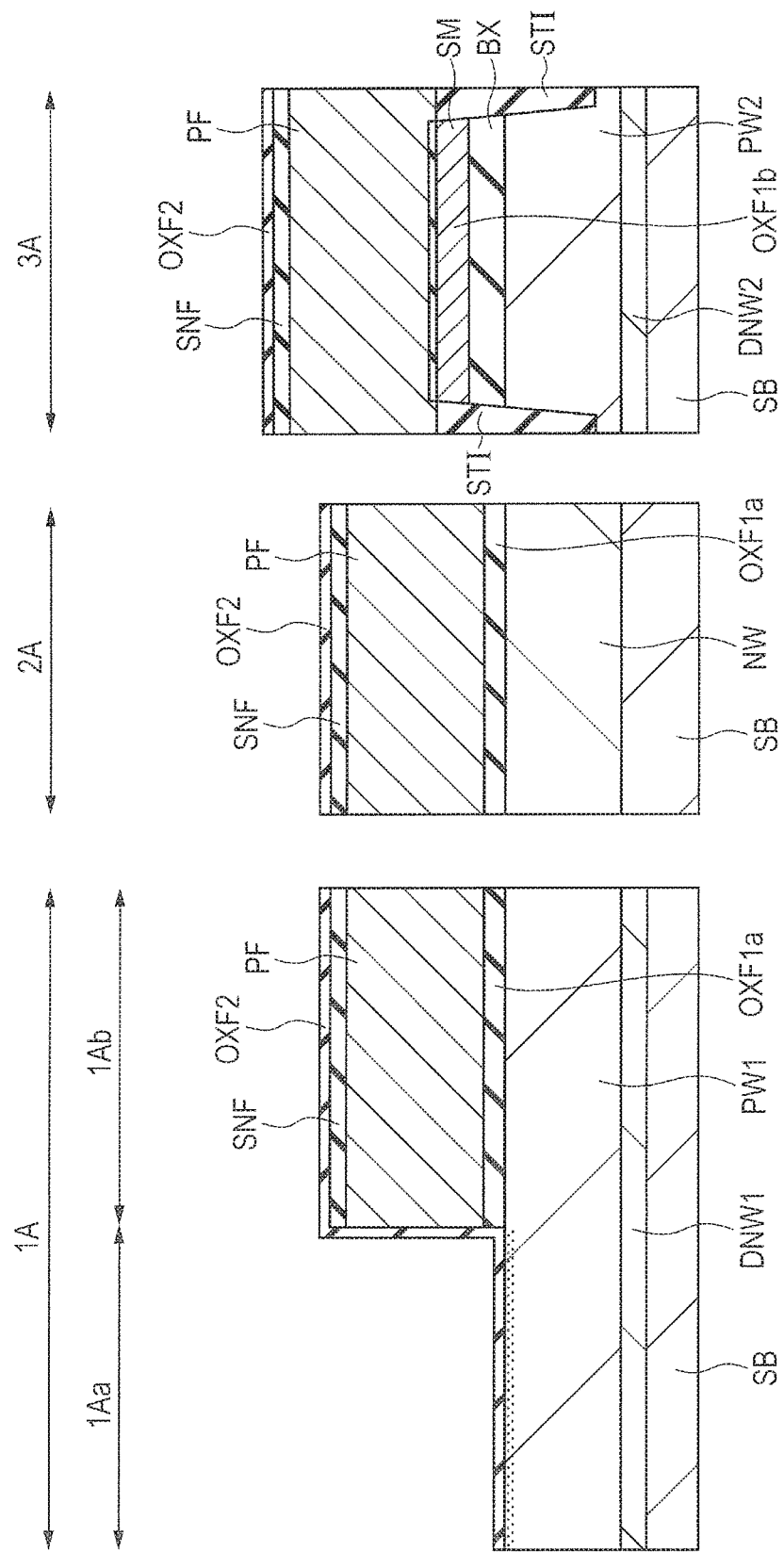
FIG. 3 is a view illustrating "2-poly technique".

Specifically, the 2-poly technique is described with reference to drawings. FIG. 3 illustrates a memory cell formation region 1A, a high-withstand-voltage field effect transistor formation region 2A, and a low-withstand-voltage field effect transistor formation region 3A. In FIG. 3, the memory cell formation region 1A has, for example, the memory cell configuring a nonvolatile memory circuit formed in the circuit block C1 shown in FIG. 1. The memory cell formation region 1A includes a memory transistor formation region 1Aa in which the memory transistor is formed, and a selection transistor formation region 1Ab in which the selection transistor is formed. In FIG. 3, the high-withstand-voltage field effect transistor formation region 2A has the high-withstand-voltage field effect transistor formed in the circuit block C2 shown in FIG. 1, for example. In FIG. 3, the low-withstand-voltage field effect transistor formation region 3A has the low-withstand-voltage field effect transistor formed in the circuit block C3 shown in FIG. 1, for example.

In FIG. 3, a part of a support substrate SB is arranged in the memory cell formation region 1A, and an n-type well DNW1 and a p-type well PW1 are formed in the part of the support substrate SB. A silicon oxide film OXF1a is formed on the p-type well PW1 in the selection transistor formation region 1Ab included in the memory cell formation region 1A, a polysilicon film PF is formed on the silicon oxide film OXF1a, and a silicon nitride film SNF is formed on the polysilicon film PF. On the other hand, a silicon oxide film OXF2 is formed on the surface of the p-type well PW1 in the memory transistor formation region 1Aa included in the memory cell formation region 1A. The silicon oxide film OXF2 is also formed on the silicon nitride film SNF formed in the selection transistor formation region 1Ab.

In FIG. 3, a part of the support substrate SB is arranged in the high-withstand-voltage field effect transistor formation region 2A, and an n-type well NW is formed in the part of the support substrate SB. A silicon oxide film OXF1a is formed on the n-type well NW, the polysilicon film PF is formed on the silicon oxide film OXF1a, the silicon nitride film SNF is formed on the polysilicon film PF, and the silicon oxide film OXF2 is formed on the silicon nitride film SNF.

In FIG. 3, a part of the support substrate SB is arranged in the low-withstand-voltage field effect transistor formation region 3A, and an n-type well DNW2 and a p-type well PW2 are formed in the part of the support substrate SB. A buried insulating layer BX is formed on the p-type well PW2, and a semiconductor layer SM is formed on the buried insulating layer BX. An element isolation part STI is formed in the low-withstand-voltage field effect transistor formation region 3A so as to extend up to the support substrate SB through the semiconductor layer SM and the buried insulating layer BX. In FIG. 3, a silicon oxide film OXF1b is formed on the semiconductor layer SM in the low-withstand-voltage field effect transistor formation region 3A, the polysilicon film PF is formed on the silicon oxide film OXF1b, the silicon nitride film SNF is formed on the polysilicon film PF, and the silicon oxide film OXF2 is formed on the silicon nitride film SNF.

Figure 4:
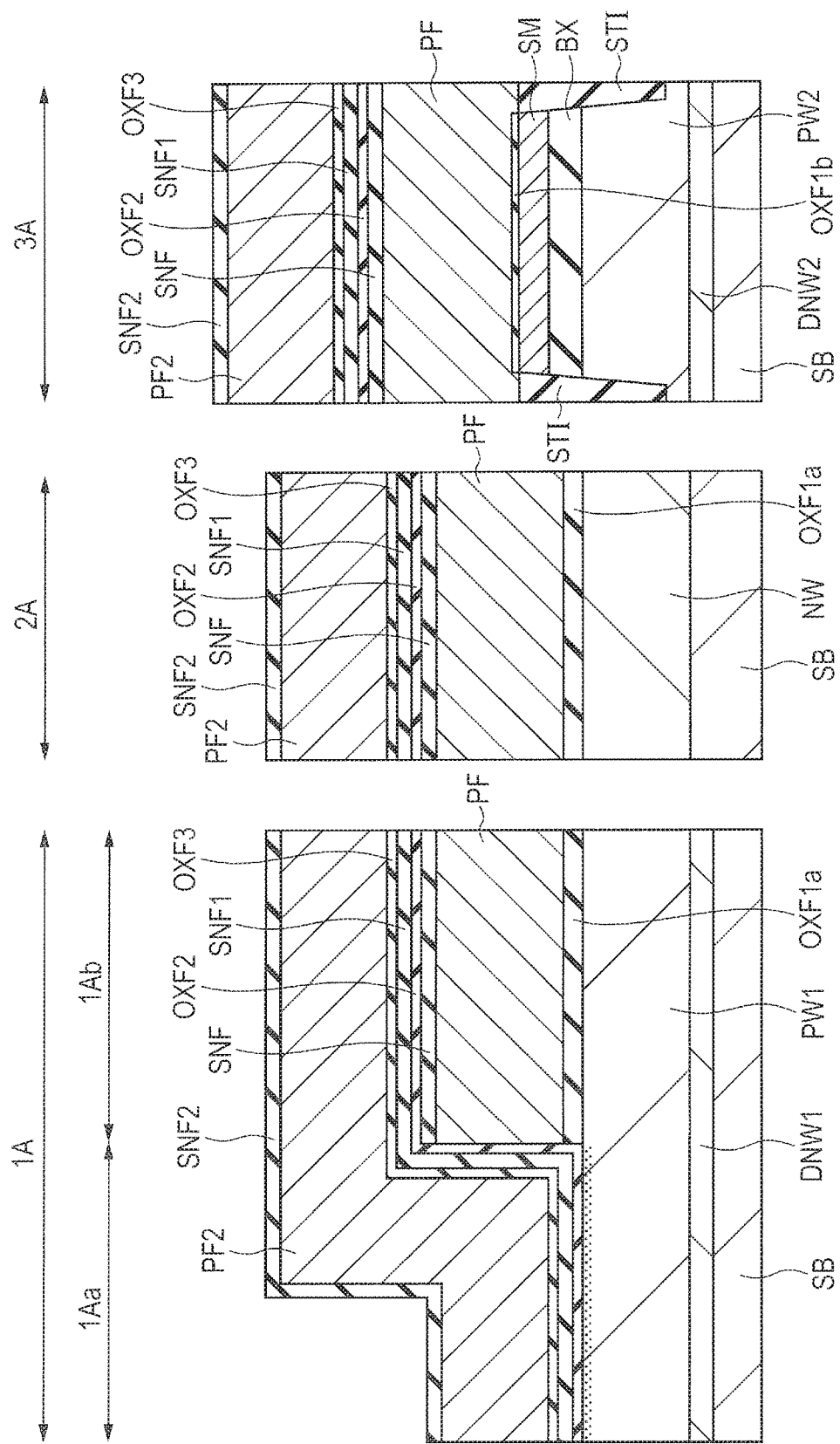
FIG. 4 is a view illustrating the 2-poly technique.

In the 2-poly technique, the heating treatment in the atmosphere containing nitrogen is performed in the state shown in FIG. 3. In such a case, as shown in FIG. 3, since only the silicon oxide film OXF2 exists on the p-type well PW1 in the memory transistor formation region 1Aa, nitrogen is segregated at the interface between the p-type well PW1 and the silicon oxide film OXF2 (dotted portion) by the heating treatment in the atmosphere containing nitrogen. On the other hand, in the selection transistor formation region 1Ab, since the polysilicon film PF is also formed in addition to the silicon oxide film OXF1a on the p-type well PW1, no nitrogen is segregated at the interface between the p-type well PW1 and the silicon oxide film OXF1a even if the heating treatment is performed in the atmosphere containing nitrogen. Similarly, in the high-withstand-voltage field effect transistor formation region 2A, since the polysilicon film PF is also formed in addition to the silicon oxide film OXF1a on the n-type well NW, no nitrogen is segregated at the interface between the n-type well NW and the silicon oxide film OXF1a even if the heating treatment is performed in the atmosphere containing nitrogen. In addition, in the low-withstand-voltage field effect transistor formation region 3A, since the polysilicon film PF is also formed in addition to the silicon oxide film OXF1b on the semiconductor layer SM, no nitrogen is segregated at the interface between the semiconductor layer SM and the silicon oxide film OXF1b even if the heating treatment is performed in the atmosphere containing nitrogen. In the 2-poly technique, as shown in FIG. 4, a silicon nitride film SNF1 is then formed on the silicon oxide film OXF2 formed on the memory cell formation region 1A, on the high-withstand-voltage field effect transistor formation region 2A, and on the low-withstand-voltage field effect transistor formation region 3A, and a silicon oxide film OXF3 is formed on the silicon nitride film SNF1. A polysilicon film PF2 is formed on the silicon oxide film OXF3 that are formed on the memory cell formation region 1A, on the high-withstand-voltage field effect transistor formation region 2A, and on the low-withstand-voltage field effect transistor formation region 3A, and a silicon nitride film SNF2 is formed on the polysilicon film PF2. As described above, as shown in FIGS. 3 and 4, the 2-poly technique uses the polysilicon film PF and the polysilicon film PF2 formed in different steps.

In the 2-poly technique, the heating treatment in the atmosphere containing nitrogen is performed while the polysilicon film PF is formed on the selection transistor formation region 1Ab, on the high-withstand-voltage field effect transistor formation region 2A, and on the low-withstand-voltage field effect transistor formation region 3A. Hence, no nitrogen is segregated in the surface of the channel formation region in each of the selection transistor formation region 1Ab, the high-withstand-voltage field effect transistor formation region 2A, and the low-withstand-voltage field effect transistor formation region 3A. That is, the secondary effect of deterioration in characteristics of the field effect transistor due to the heating treatment in the atmosphere containing nitrogen is not actualized in the 2-poly technique.

For example, in a technique (hereinafter, referred to as "1-poly technique"), the polysilicon film configuring the memory gate electrode of the memory transistor and the polysilicon film configuring the gate electrode of the field effect transistor are formed together. In such a case, the secondary effect due to the heating treatment in the atmosphere containing nitrogen is actualized, that is, the characteristics of the field effect transistor are deteriorated. This point is described with reference to drawings.

Figure 5:
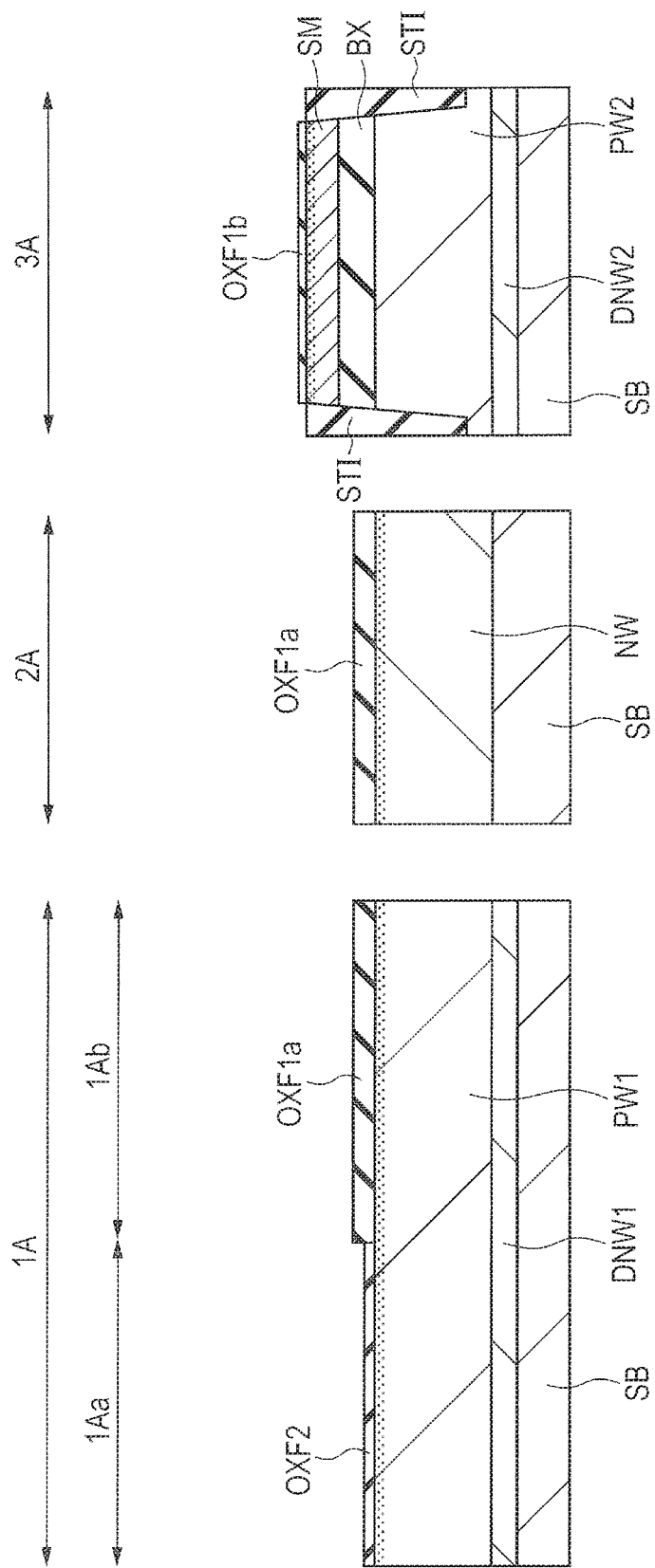
FIG. 5 is a view illustrating "1-poly technique" (related art).

First, as shown in FIG. 5, the silicon oxide film OXF2 is formed on the p-type well PW1 in the memory transistor formation region 1Aa. On the other hand, the silicon oxide film OXF2 is not formed on the silicon oxide film OXF1a in the selection transistor formation region 1Ab and the high-withstand-voltage field effect transistor formation region 2A, because a thermal oxidation process is used. The silicon oxide film OXF2 is also not formed on the silicon oxide film OXF1b in the low-withstand-voltage field effect transistor formation region 3A, because the thermal oxidation process is used.

In the 1-poly technique, the heating treatment in the atmosphere containing nitrogen is performed in a condition shown in FIG. 5. As a result, nitrogen is segregated at the interface between the silicon oxide film OXF2 and the p-type well PW1 (channel formation region) in the memory transistor formation region 1Aa. Furthermore, in the 1-poly technique, since the thick polysilicon film PF does not exist in the selection transistor formation region 1Ab unlike in the 2-poly technique, nitrogen is also segregated at the interface between the silicon oxide film OXF1a and the p-type well PW1 (channel formation region) in the selection transistor formation region 1Ab. Similarly, in the 1-poly technique, since the thick polysilicon film PF does not exist in the high-withstand-voltage field effect transistor formation region 2A unlike in the 2-poly technique, nitrogen is segregated at the interface between the silicon oxide film OXF1a and the n-type well NW (channel formation region) in the high-withstand-voltage field effect transistor formation region 2A. Furthermore, in the 1-poly technique, since the thick polysilicon film PF does not exist in the low-withstand-voltage field effect transistor formation region 3A unlike in the 2-poly technique, nitrogen is also segregated at the interface between the silicon oxide film OXF1b and the semiconductor layer SM (channel formation region) in the low-withstand-voltage field effect transistor formation region 3A.

Figure 6:
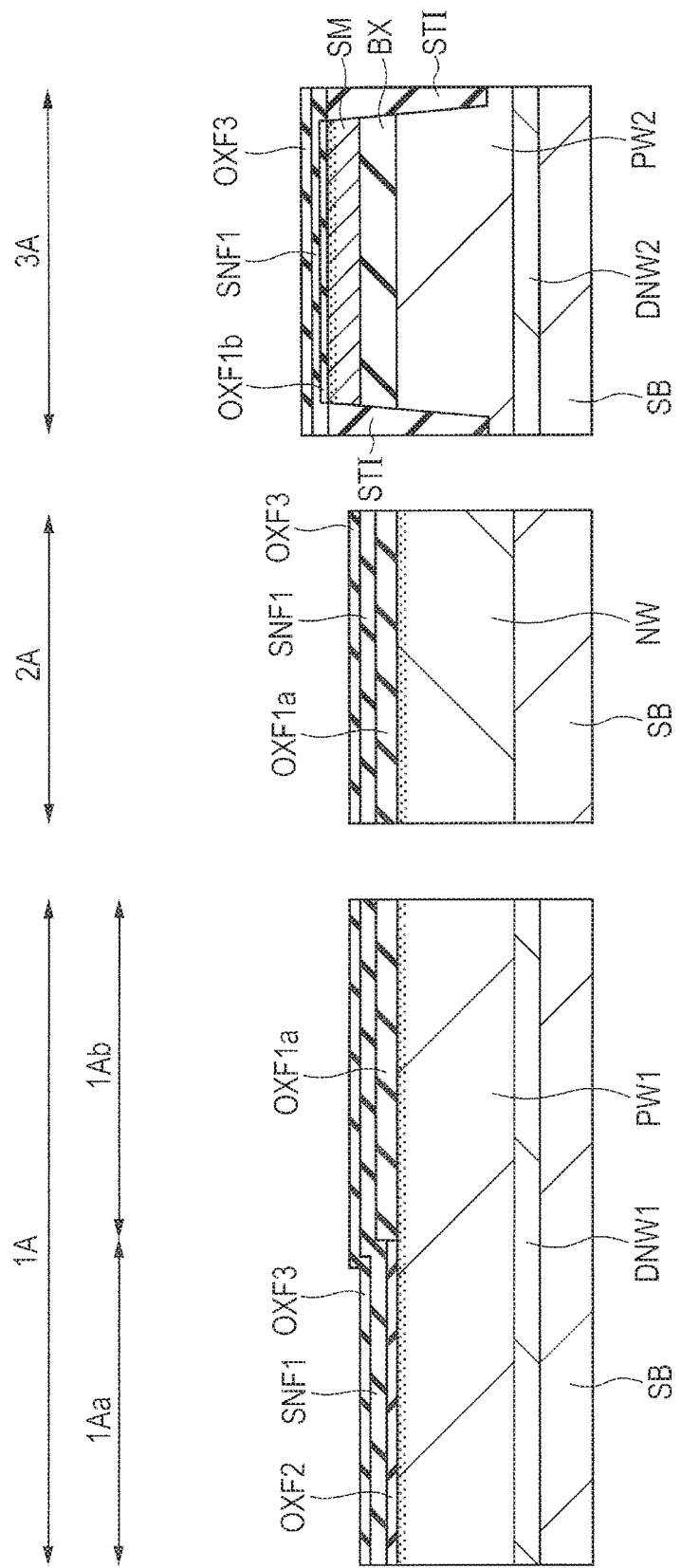
FIG. 6 is a view illustrating the 1-poly technique (related art).
Figure 7:
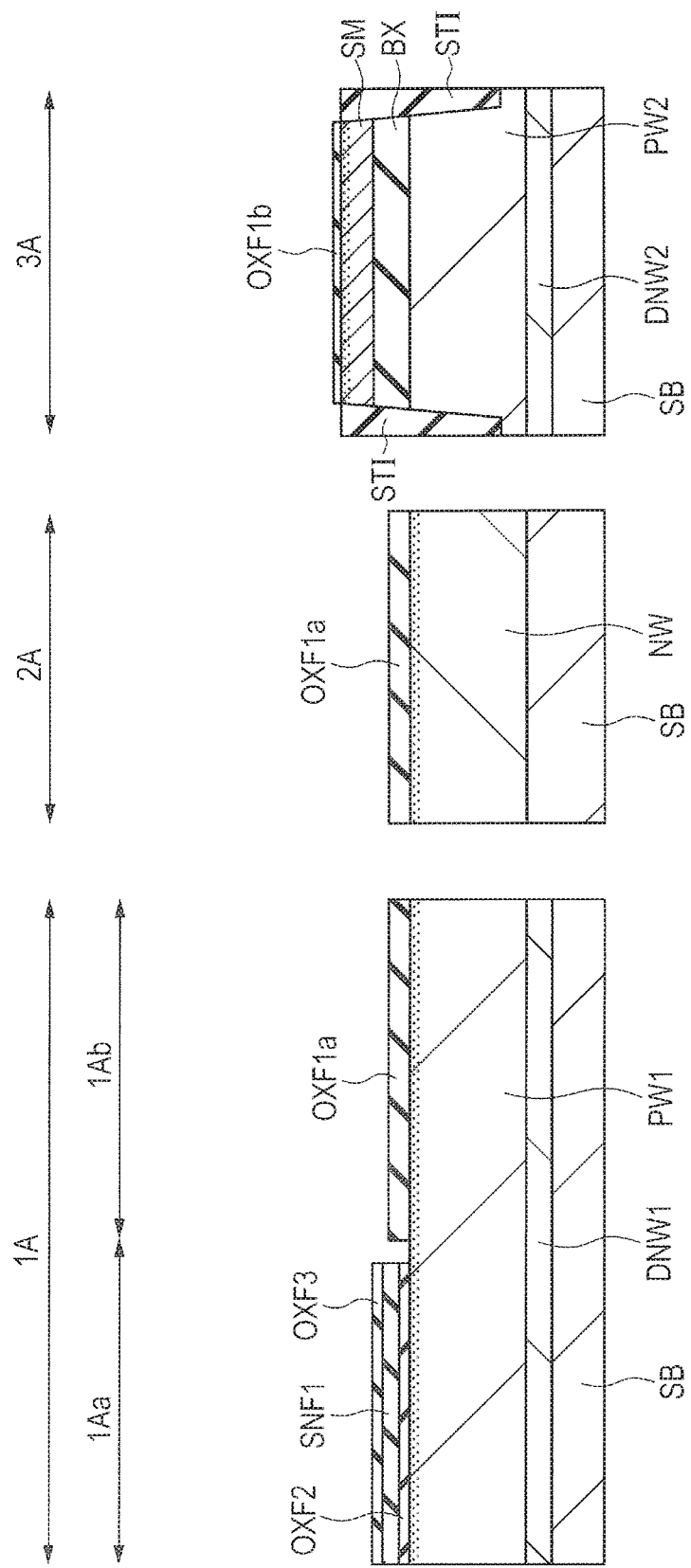
FIG. 7 is a view illustrating the 1-poly technique (related art).

In the 1-poly technique, as shown in FIG. 6, the silicon nitride film SNF1 is then formed on the memory cell formation region 1A, on the high-withstand-voltage field effect transistor formation region 2A, and on the low-withstand-voltage field effect transistor formation region 3A, and the silicon oxide film OXF3 is formed on the silicon nitride film SNF1. As shown in FIG. 7, a photolithography technique and an etching technique are used to leave a stacked insulating film of the silicon oxide film OXF2, the silicon nitride film SNF1, and the silicon oxide film OXF3 in the memory transistor formation region 1Aa. On the other hand, the stacked insulating film is removed from the selection transistor formation region 1Ab, from the high-withstand-voltage field effect transistor formation region 2A, and from the low-withstand-voltage field effect transistor formation region 3A.

Figure 8:
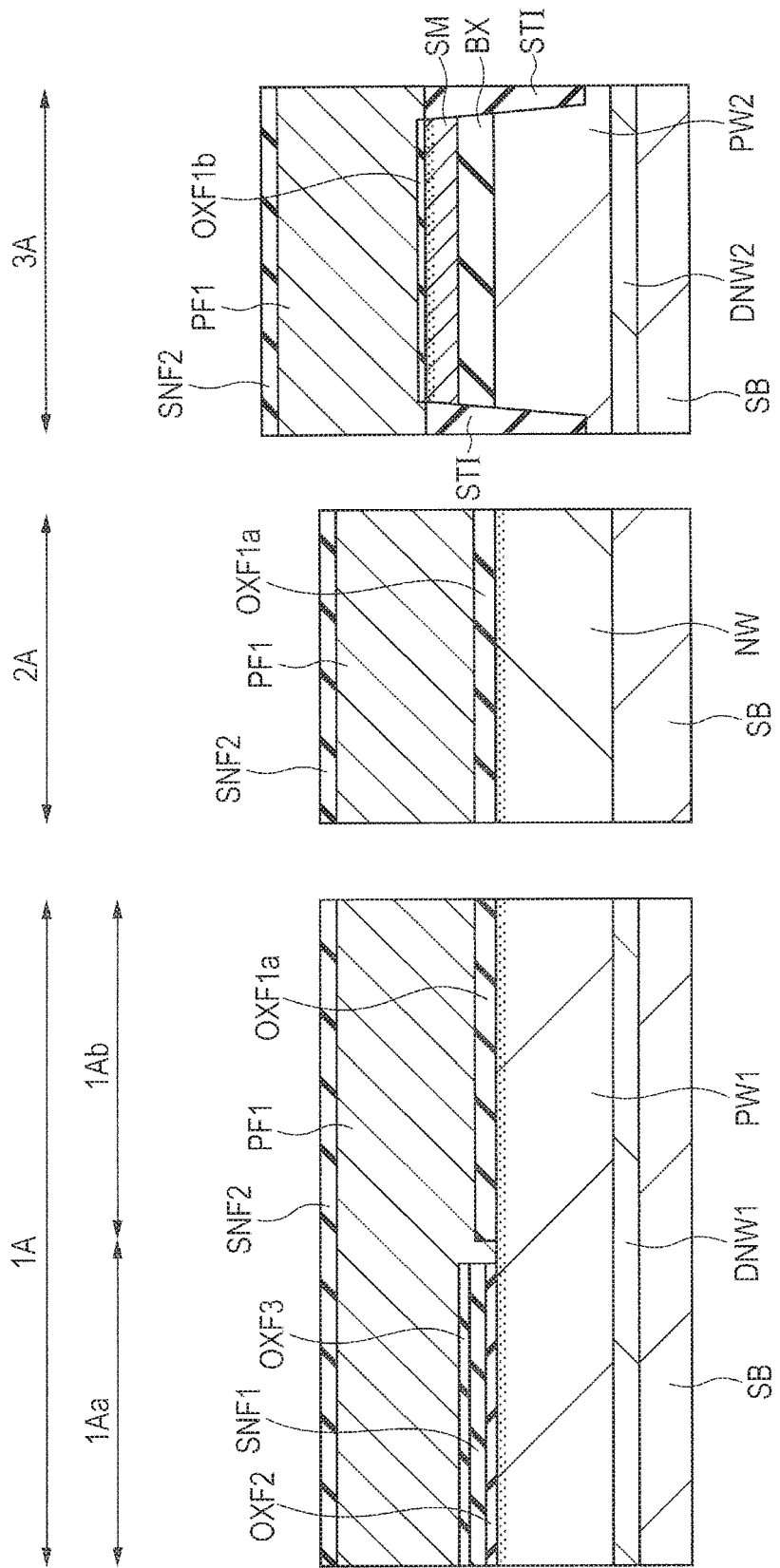
FIG. 8 is a view illustrating the 1-poly technique (related art).

Subsequently, as shown in FIG. 8, a polysilicon film PF1 is formed on the memory cell formation region 1A, on the high-withstand-voltage field effect transistor formation region 2A, and on the low-withstand-voltage field effect transistor formation region 3A, and a silicon nitride film SNF2 is formed on the polysilicon film PF1. In the 1-poly technique, as shown in FIG. 8, the polysilicon film PF1, which has been formed on the memory cell formation region 1A, on the high-withstand-voltage field effect transistor formation region 2A, and on the low-withstand-voltage field effect transistor formation region 3A, is then processed. As a result, in the 1-poly technique, the memory gate electrode of the memory transistor, the gate electrode of the selection transistor, and the gate electrode of the field effect transistor are formed.

In the 1-poly technique configured in this way, unlike the 2-poly technique, the heating treatment in the atmosphere containing nitrogen is performed without the polysilicon film PF in each of the selection transistor formation region 1Ab, the high-withstand-voltage field effect transistor formation region 2A, and the low-withstand-voltage field effect transistor formation region 3A. Consequently, nitrogen is segregated in the surface of the channel formation region not only in the memory transistor formation region 1Aa, but also in each of the selection transistor formation region 1Ab, the high-withstand-voltage field effect transistor formation region 2A, and the low-withstand-voltage field effect transistor formation region 3A. As a result, in the 1-poly technique, the secondary effect is actualized due to the heating treatment in the atmosphere containing nitrogen, that is, the characteristics of the field effect transistor are deteriorated. The first embodiment is therefore devised so as to suppress the secondary effect unique to the 1-poly technique in the nitrogen introduction step. The technical idea of the first embodiment devised in such a manner is described below.

Device Structure of Semiconductor Device

Figure 9:
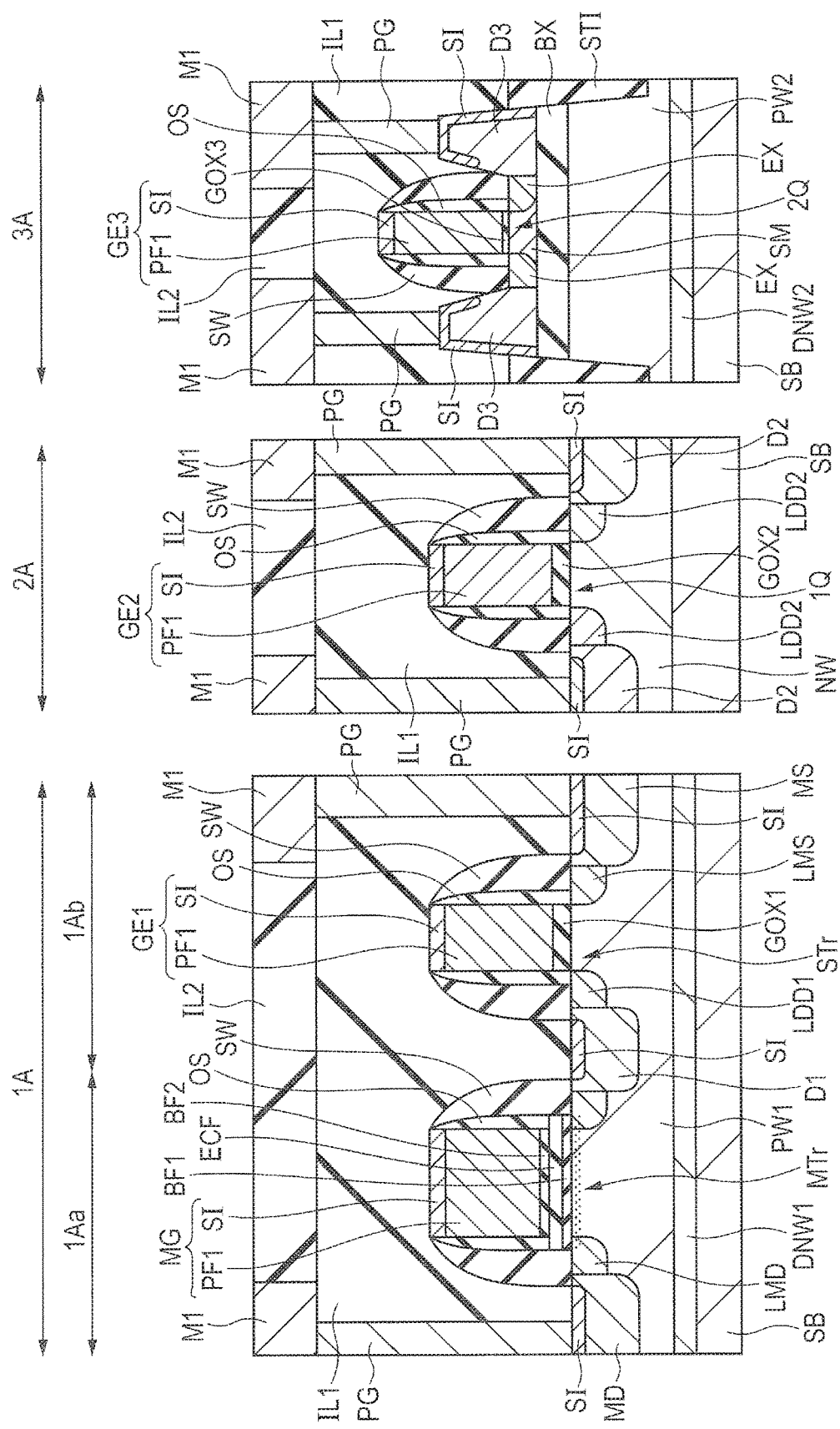
FIG. 9 is a sectional view illustrating a device structure of a semiconductor device of the first embodiment.

FIG. 9 is a sectional view schematically illustrating a device structure of the semiconductor device of the first embodiment. A memory cell is formed in the memory cell formation region 1A in FIG. 9, and a device structure of the memory cell is now described. The memory cell is configured of the memory transistor MTr formed in the memory transistor formation region 1Aa and the selection transistor STr formed in the selection transistor formation region 1Ab.

First, a device structure of the memory transistor MTr, which is formed in the memory transistor formation region 1Aa, is described. In FIG. 9, the n-type well DNW1 and the p-type well PW1 are formed in the support substrate SB, and the memory transistor MTr is formed from the inside to the upper side of the p-type well PW1. Specifically, as shown in FIG. 9, the memory transistor MTr includes a pair of impurity regions (n-type semiconductor regions) LMD that are formed in the surface of the p-type well PW1 while being separated from each other, and a diffusion region MD formed on the outer side of the left impurity region LMD. The memory transistor MTr further includes a diffusion region D1 formed on the outer side of the right impurity region LMD. A channel formation region is formed at a position between the pair of impurity regions LMD separated from each other. Nitrogen is segregated in the surface of the channel formation region of the memory transistor MTr in the first embodiment. The memory transistor MTr further includes a potential barrier film BF1 formed on the channel formation region, a charge storage film ECF formed on the potential barrier film BF1, and a potential barrier film BF2 formed on the charge storage film ECF. Each of the potential barrier films BF1 and BF2 includes, for example, a silicon oxide film. On the other hand, the charge storage film ECF includes, for example, an insulating film having a trap level typified by a silicon nitride film.

The memory transistor MTr further includes a memory gate electrode MG formed on the potential barrier film BF2. The memory gate electrode MG is configured of the polysilicon film PF1 and a silicide film SI, for example. As shown in FIG. 9, the memory transistor MTr further includes offset spacers OS formed on sidewalls on both sides of the memory gate electrode MG, and sidewall spacers SW formed on respective outer sides of the offset spacers OS. The offset spacers OS and the sidewall spacers SW are each formed of a silicon oxide film, for example. In this way, the memory transistor MTr is configured.

A device structure of the selection transistor STr, which is formed in the selection transistor formation region 1Ab, is now described. In FIG. 9, the selection transistor STr is formed from the inside to the upper side of the p-type well PW1. Specifically, as shown in FIG. 9, the selection transistor STr includes an impurity region (n-type semiconductor region) LDD1 and an impurity region LMS that are formed in the surface of the p-type well PW1 while being separated from each other, and a diffusion region D1 formed on the outer side of the impurity region LDD1. The selection transistor STr further includes a diffusion region MS formed on the outer side of the impurity region LMS. The channel formation region is formed at a position between the impurity regions LDD1 and LMS separated from each other. No (substantially no) nitrogen is segregated in the surface of the channel formation region of the selection transistor STr in the first embodiment. The selection transistor STr further includes a gate insulating film GOX1 formed on the channel formation region. The gate insulating film GOX1 includes, for example, a silicon oxide film.

The selection transistor STr further includes a gate electrode GE1 formed on the gate insulating film GOX1. The gate electrode GE1 is configured of the polysilicon film PF1 and the silicide film SI, for example. As shown in FIG. 9, the selection transistor STr further includes offset spacers OS formed on sidewalls on both sides of the gate electrode GE1, and sidewall spacers SW formed on respective outer sides of the offset spacers OS. The offset spacers OS and the sidewall spacers SW are each formed of a silicon oxide film, for example. In this way, the selection transistor STr is configured.

A device structure of a high-withstand-voltage field effect transistor 1Q, which is formed in the high-withstand-voltage field effect transistor formation region 2A, is now described. In FIG. 9, the n-type well NW is formed in the support substrate SB, and the high-withstand-voltage field effect transistor 1Q is formed from the inside to the upper side of the n-type well NW. Specifically, as shown in FIG. 9, the high-withstand-voltage field effect transistor 1Q includes a pair of impurity regions (p-type semiconductor regions) LDD2 that are formed in the surface of the n-type well NW while being separated from each other, and a diffusion region D2 formed on the outer side of the left impurity region LDD2. The high-withstand-voltage field effect transistor 1Q further includes a diffusion region D2 formed on the outer side of the right impurity region LDD2. A channel formation region is formed at a position between the pair of impurity regions LDD2 separated from each other. No (substantially no) nitrogen is segregated in the surface of the channel formation region of the high-withstand-voltage field effect transistor 1Q in the first embodiment. The high-withstand-voltage field effect transistor 1Q further includes a gate insulating film GOX2 formed on the channel formation region. The gate insulating film GOX2 includes, for example, a silicon oxide film.

The high-withstand-voltage field effect transistor 1Q further includes a gate electrode GE2 formed on the gate insulating film GOX2. The gate electrode GE2 is configured of the polysilicon film PF1 and the silicide film SI, for example. As shown in FIG. 9, the high-withstand-voltage field effect transistor 1Q further includes offset spacers OS formed on sidewalls on both sides of the gate electrode GE2, and sidewall spacers SW formed on the respective outer sides of the offset spacers OS. The offset spacers OS and the sidewall spacers SW are each formed of a silicon oxide film, for example. In this way, the high-withstand-voltage field effect transistor 1Q is configured.

A device structure of a low-withstand-voltage field effect transistor 2Q, which is formed in the low-withstand-voltage field effect transistor formation region 3A, is now described. In FIG. 9, the n-type well DNW2 and the p-type well PW2 are formed in the support substrate SB. The buried insulating layer BX including, for example, a silicon oxide film is formed on the p-type well PW2, and the semiconductor layer SM made of, for example, silicon is formed on the buried insulating layer BX. The element isolation part STI is formed so as to extend up to the support substrate SB through the semiconductor layer SM and the buried insulating layer BX, and the low-withstand-voltage field effect transistor 2Q is formed from the inside to the upper side of the semiconductor layer SM surrounded by the element isolation part STI. Specifically, as shown in FIG. 9, the low-withstand-voltage field effect transistor 2Q includes a pair of extension regions (n-type semiconductor regions) EX that are formed in the semiconductor layer SM and separated from each other, and a diffusion region D3 that is formed on the outer side of the left extension region EX and protrudes above the semiconductor layer SM. The low-withstand-voltage field effect transistor 2Q further includes a diffusion region D3 that is formed on the outer side of the right extension region EX and protrudes above the semiconductor layer SM. A channel formation region is formed at a position between the pair of extension regions EX separated from each other. No (substantially no) nitrogen is segregated in the surface of the channel formation region of the low-withstand-voltage field effect transistor 2Q in the first embodiment. The low-withstand-voltage field effect transistor 2Q further includes a gate insulating film GOX3 formed on the channel formation region. The gate insulating film GOX3 includes, for example, a silicon oxide film.

The low-withstand-voltage field effect transistor 2Q further includes a gate electrode GE3 formed on the gate insulating film GOX3. The gate electrode GE3 is configured of the polysilicon film PF1 and the silicide film SI, for example. As shown in FIG. 9, the low-withstand-voltage field effect transistor 2Q further includes offset spacers OS formed on sidewalls on both sides of the gate electrode GE3, and sidewall spacers SW formed on respective outer sides of the offset spacers OS. The offset spacers OS and the sidewall spacers SW are each formed of a silicon oxide film, for example. In this way, the low-withstand-voltage field effect transistor 2Q is configured.

Subsequently, as shown in FIG. 9, in the memory cell formation region 1A, an interlayer insulating film IL1 including, for example, a silicon oxide film is formed so as to cover the memory transistor MTr and the selection transistor STr, and an interlayer insulating film IL2 including, for example, a silicon oxide film is formed on the interlayer insulating film IL1. As shown in FIG. 9, in the interlayer insulating film IL1, a plug PG is formed so as to extend up to the diffusion region MD (silicide film SI) through the interlayer insulating film IL1, and another plug PG is formed so as to extend up to the diffusion region MS (silicide film SI) through the interlayer insulating film IL1. An interconnection M1 is formed in the interlayer insulating film IL2 while being electrically connected with the plugs PG.

Similarly, in the high-withstand-voltage field effect transistor formation region 2A in FIG. 9, the interlayer insulating film IL1 including, for example, a silicon oxide film is formed so as to cover the high-withstand-voltage field effect transistor 1Q, and the interlayer insulating film IL2 including, for example, a silicon oxide film is formed on the interlayer insulating film IL1. As shown in FIG. 9, plugs PG are formed in the interlayer insulating film IL1 so as to extend up to the diffusion region D2 (silicide film SI) through the interlayer insulating film IL1. The interconnection M1 is formed in the interlayer insulating film IL2 while being electrically connected with the plugs PG.

In the low-withstand-voltage field effect transistor formation region 3A in FIG. 9, the interlayer insulating film IL1 including, for example, a silicon oxide film is formed so as to cover the low-withstand-voltage field effect transistor 2Q, and the interlayer insulating film IL2 including, for example, a silicon oxide film is formed on the interlayer insulating film IL1. As shown in FIG. 9, plugs PG are formed in the interlayer insulating film IL1 so as to extend up to the diffusion region D3 (silicide film SI) through the interlayer insulating film IL1. The interconnection M1 is formed in the interlayer insulating film IL2 while being electrically connected with the plugs PG.

In this way, the semiconductor device of the first embodiment is configured.

Characteristics of First Embodiment (Device Structure)

A characteristic point in the device structure of the semiconductor device of the first embodiment is now described. As the characteristic point of the first embodiment, for example, as shown in FIG. 9, while nitrogen is segregated at the interface between the channel formation region of the memory transistor MTr and the potential barrier film BF1, no (substantially no) nitrogen is precipitated (segregated) at the interface between the channel formation region and the gate insulating film (GOX1, GOX2, GOX3) in each of the selection transistor STr, the high-withstand-voltage field effect transistor 1Q, and the low-withstand-voltage field effect transistor 2Q. Consequently, the semiconductor device of the first embodiment makes it possible to improve the retention characteristics of the memory transistor MTr, and suppress deterioration in transistor characteristics of each of other transistors (the selection transistor STr, the high-withstand-voltage field effect transistor 1Q, and the low-withstand-voltage field effect transistor 2Q). Specifically, for the memory transistor MTr, the characteristic point of the first embodiment allows nitrogen to be segregated at the interface between the channel formation region and the potential barrier film BF1, leading to a higher potential of the potential barrier film BF1 with respect to electron. As a result, leakage to a substrate side of electrons stored in the charge storage film is reduced, and thus the charge retention characteristics of the memory transistor MTr can be improved. The characteristic point of the first embodiment therefore makes it possible to suppress loss of information memorized in the memory transistor MTr, and thus improve reliability of the semiconductor device. On the other hand, the characteristic point of the first embodiment allows substantially no nitrogen to be segregated at the interface between the channel formation region of each of other transistors (the selection transistor STr, the high-withstand-voltage field effect transistor 1Q, and the low-withstand-voltage field effect transistor 2Q) and the gate insulating film (GOX1, GOX2, GOX3). Consequently, it is particularly possible to suppress deterioration such as "NBTI" in the p-channel-type field effect transistor due to nitrogen, and variations in threshold voltage in the n-channel-type field effect transistor due to nitrogen. That is, the characteristic point of the first embodiment makes it possible to improve the retention characteristics of the memory transistor MTr by introducing nitrogen, and suppress the secondary effect of deterioration in the characteristics of each of other transistors due to introduction of nitrogen. Consequently, the characteristic point of the first embodiment makes it possible to improve reliability of the semiconductor device including the memory cell and the field effect transistor while maintaining performance of the semiconductor device.

Method of Manufacturing Semiconductor Device

A method of manufacturing the semiconductor device having the characteristic point in the device structure is now described with reference to drawings.

Figure 10:
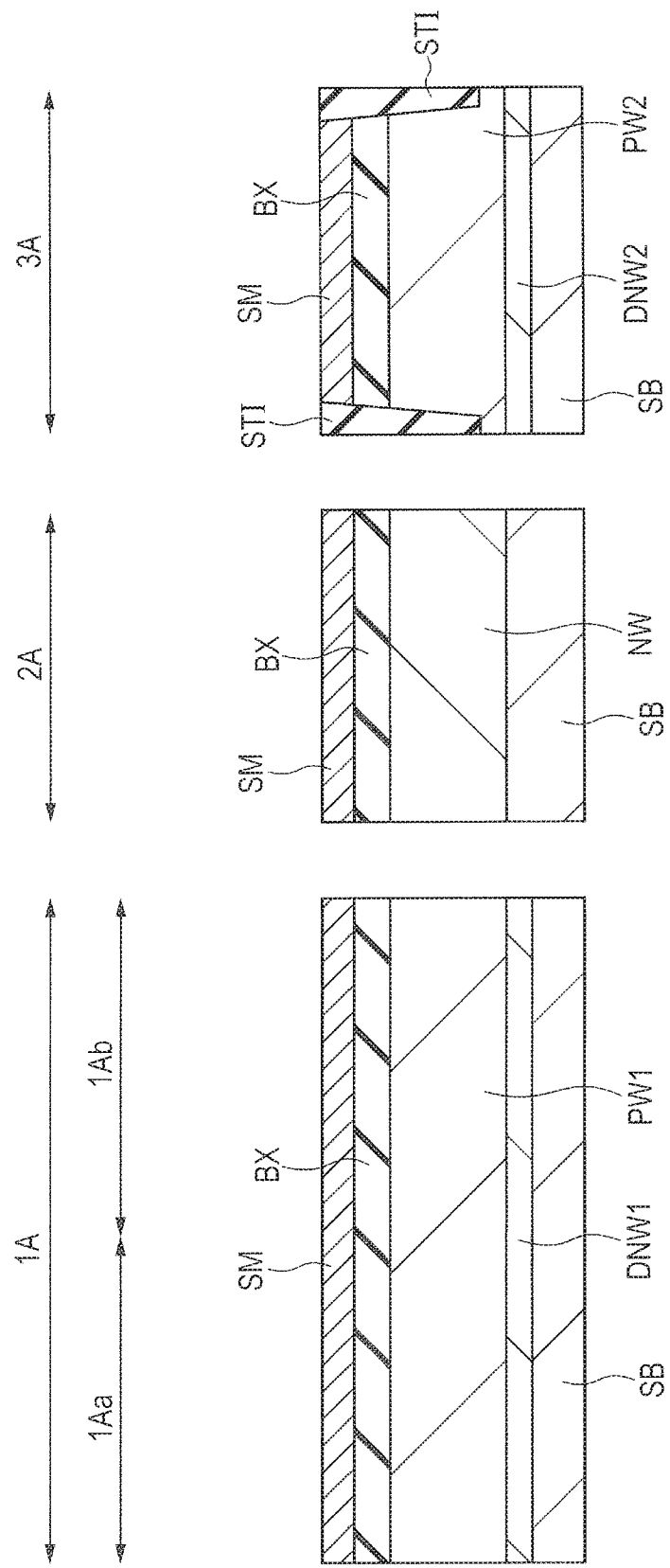
FIG. 10 is a sectional view illustrating a manufacturing process of the semiconductor device of the first embodiment.

FIG. 10 shows a so-called silicon on insulator (SOI) substrate including the support substrate SB, the buried insulating layer BX formed on the support substrate SB, and the semiconductor layer SM formed on the buried insulating layer BX.

The support substrate SB is preferably made of single-crystal silicon having a specific resistance of about 1 to 10 Ω·cm, and is made of, for example, p-type single-crystal silicon. The buried insulating layer BX includes, for example, a silicon oxide film, and has a thickness of about 10 to 20 nm, for example. The semiconductor layer SM is preferably made of single-crystal silicon having a specific resistance of about 1 to 10 Ω·cm, and has a thickness of about 10 to 20 nm, for example. No conductive impurity is introduced into the semiconductor layer SM by an ion implantation process or the like.

An exemplary step of providing such an SOI substrate is described below. The SOI substrate can be manufactured by a separation by implanted oxygen (SIMOX) process, for example. In the SIMOX process, oxygen ($O_2$) is ion-implanted at high energy into a semiconductor substrate made of silicon (Si), and the silicon is bonded with oxygen by subsequent heat treatment, and thus the buried insulating layer BX made of silicon oxide is formed at a position slightly deeper than the surface of the semiconductor substrate. In such a case, a thin silicon film remaining on the buried insulating layer BX forms the semiconductor layer SM, and the substrate under the buried insulating layer BX forms the support substrate SB. The SOI substrate may be formed by a laminating method. In the laminating method, for example, a surface of a first semiconductor substrate made of silicon is oxidized to form the buried insulating layer BX, and then a second semiconductor substrate made of silicon is laminated to the first semiconductor substrate by pressure bonding under high temperature, and then the second semiconductor substrate is thinned. In such a case, a thin film of the second semiconductor substrate remaining on the buried insulating layer BX forms the semiconductor layer SM, and the first semiconductor substrate under the buried insulating layer BX forms the support substrate SB. The SOI substrate may be manufactured by another method, for example, a smart cut process.

Subsequently, a trench is formed so as to extend up to the support substrate SB through the semiconductor layer SM and the buried insulating layer BX, and the trench is filled with an insulating film to form the element isolation part STI. Although the memory cell formation region 1A, the high-withstand-voltage field effect transistor formation region 2A, and the low-withstand-voltage field effect transistor formation region 3A are isolated from one another by the element isolation part STI, the element isolation part STI is particularly shown in the low-withstand-voltage field effect transistor formation region 3A in FIG. 10.

Subsequently, the n-type well NW is formed in the support substrate SB using a photolithography technique and an ion implantation process in the high-withstand-voltage field effect transistor formation region 2A. On the other hand, the n-type well DNW1 is formed in the support substrate SB, and then the p-type well PW1 is formed in the n-type well DNW1 in the memory cell formation region 1A. Ion implantation for adjustment of the threshold voltage may be performed onto the surface of the p-type well PW1 in the memory cell formation region 1A and the surface of the n-type well NW in the high-withstand-voltage field effect transistor formation region 2A.

Subsequently, the n-type well DNW2 is formed using a photolithography technique and an ion implantation process in the support substrate SB in the low-withstand-voltage field effect transistor formation region 3A, and then the p-type well PW2 is formed in the n-type well DNW2. Although part of the semiconductor layer SM and part of the buried insulating layer BX in the low-withstand-voltage field effect transistor formation region 3A are removed such that the p-type well PW2 is exposed and used as a power supply region in order to apply a voltage to the p-type well PW2, description of the power supply region is omitted herein. A p-type impurity region having a higher concentration than the p-type well PW2 may be formed on the surface of the p-type well PW2 to be in contact with the buried insulating layer BX.

Figure 11:
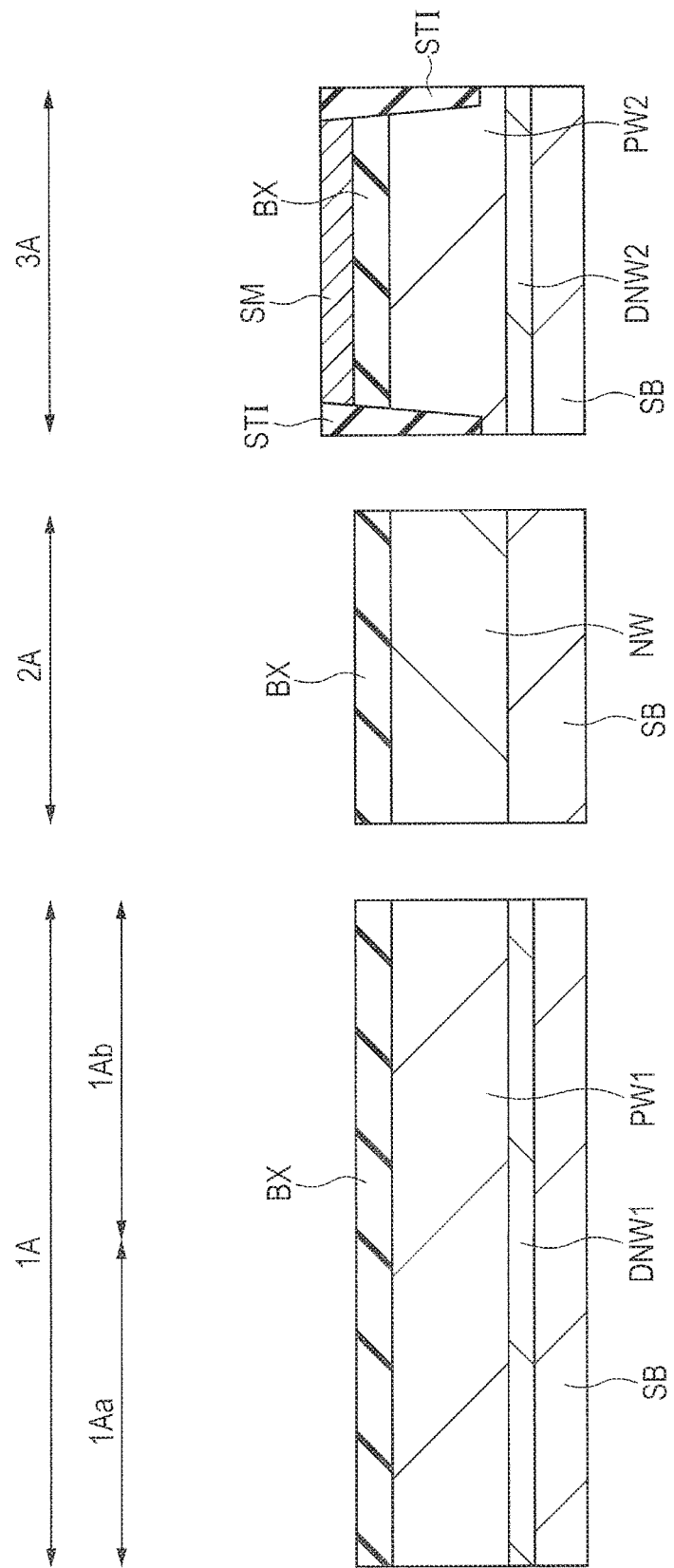
FIG. 11 is a sectional view illustrating the manufacturing process of the semiconductor device following FIG. 10.

Subsequently, as shown in FIG. 11, a photolithography technique and an etching technique are used to remove the semiconductor layer SM formed in each of the memory cell formation region 1A and the high-withstand-voltage field effect transistor formation region 2A. Subsequently, a photolithography technique and an ion implantation process are used to introduce a conductive impurity for adjustment of the threshold voltage into the surface of the p-type well PW1 in the selection transistor formation region 1Ab. Similarly, a photolithography technique and an ion implantation process are used to introduce a conductive impurity for adjustment of the threshold voltage into the surface of the n-type well NW in the high-withstand-voltage field effect transistor formation region 2A.

Figure 12:
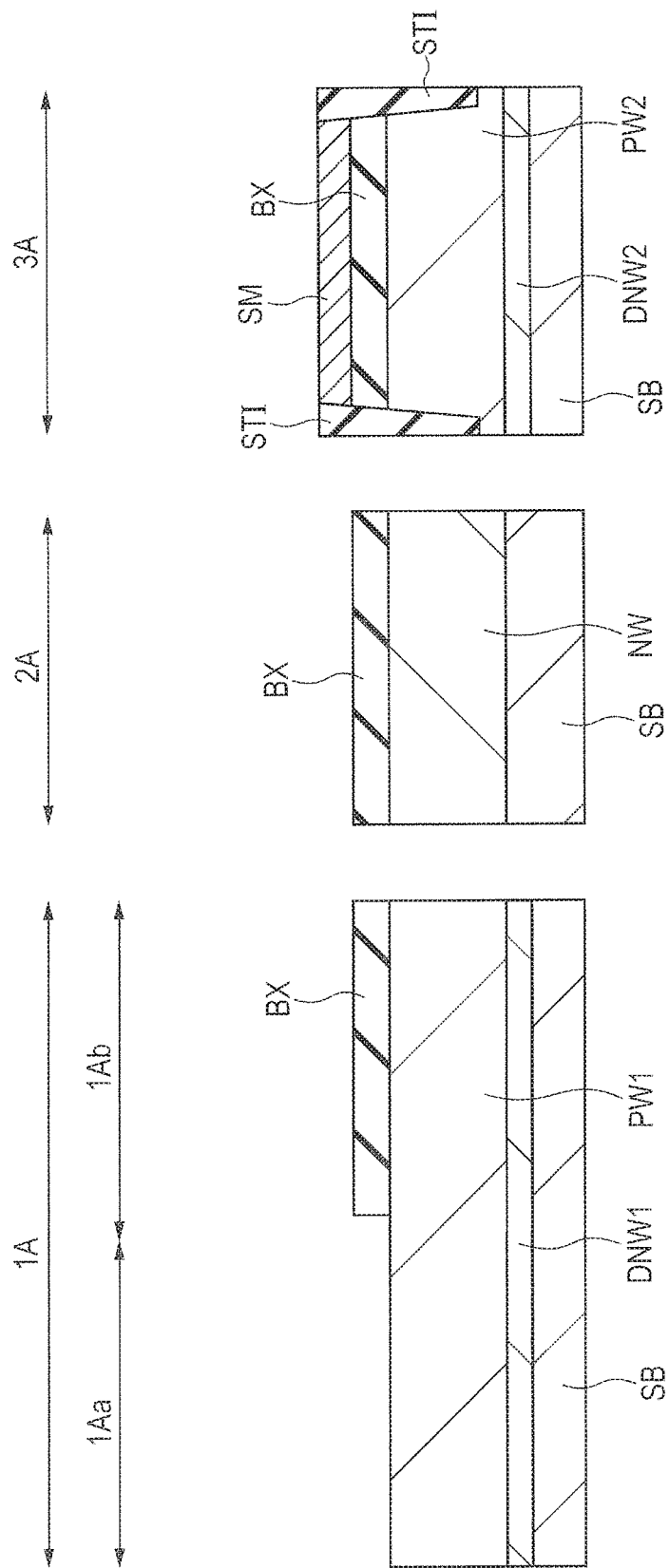
FIG. 12 is a sectional view illustrating the manufacturing process of the semiconductor device following FIG. 11.
Figure 13:
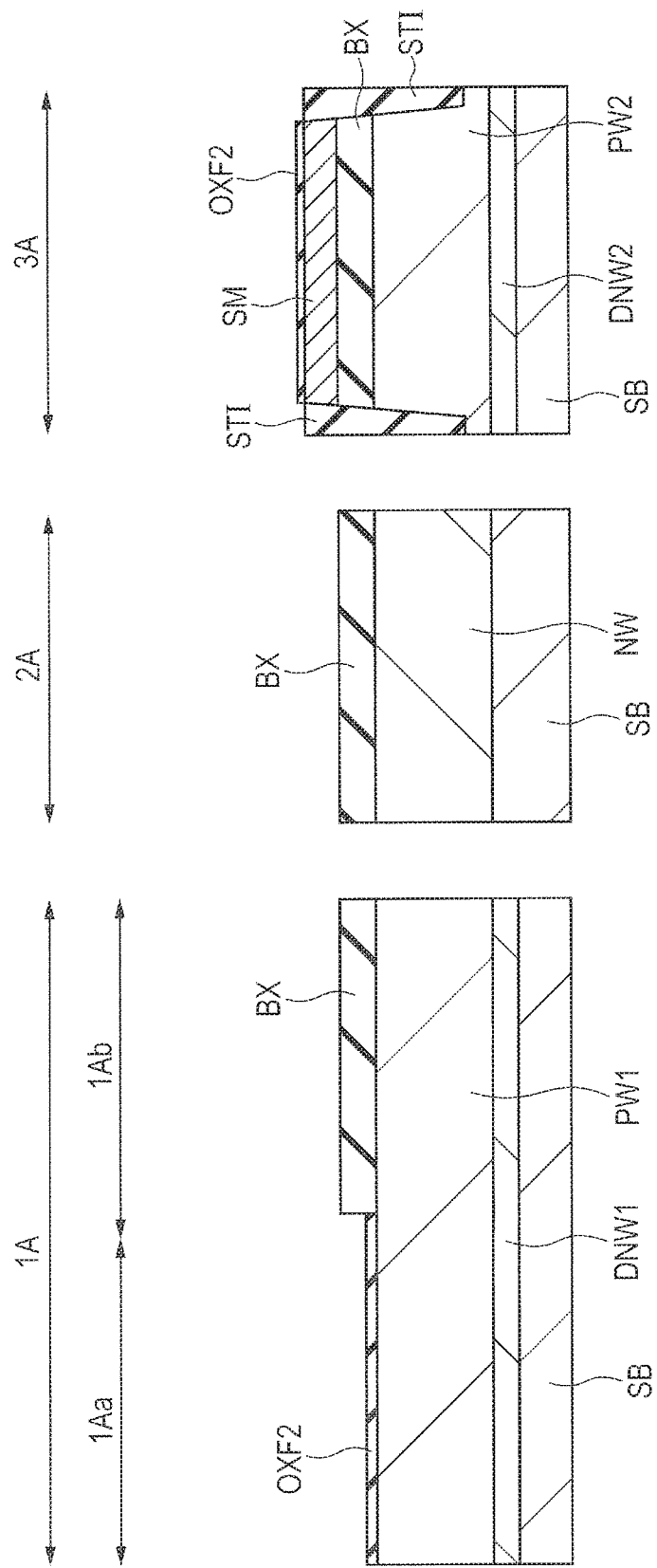
FIG. 13 is a sectional view illustrating the manufacturing process of the semiconductor device following FIG. 12.

Subsequently, as shown in FIG. 12, a photolithography technique and an etching technique are used to remove the buried insulating layer BX formed in the memory transistor formation region 1Aa. Subsequently, as shown in FIG. 13, for example, a thermal oxidation process is used to form the silicon oxide film OXF2 on the p-type well PW1 in the memory transistor formation region 1Aa. Since no silicon oxide film is formed on the silicon oxide film in the thermal oxidation process, no silicon oxide film OXF2 is formed on the buried insulating layer BX including the silicon oxide film in the selection transistor formation region 1Ab. Similarly, no silicon oxide film OXF2 is formed on the buried insulating layer BX including the silicon oxide film in the high-withstand-voltage field effect transistor formation region 2A. On the other hand, the silicon oxide film OXF2 is formed on the semiconductor layer SM in the low-withstand-voltage field effect transistor formation region 3A. The silicon oxide film OXF2 has a thickness of about 8 nm.

Figure 14:
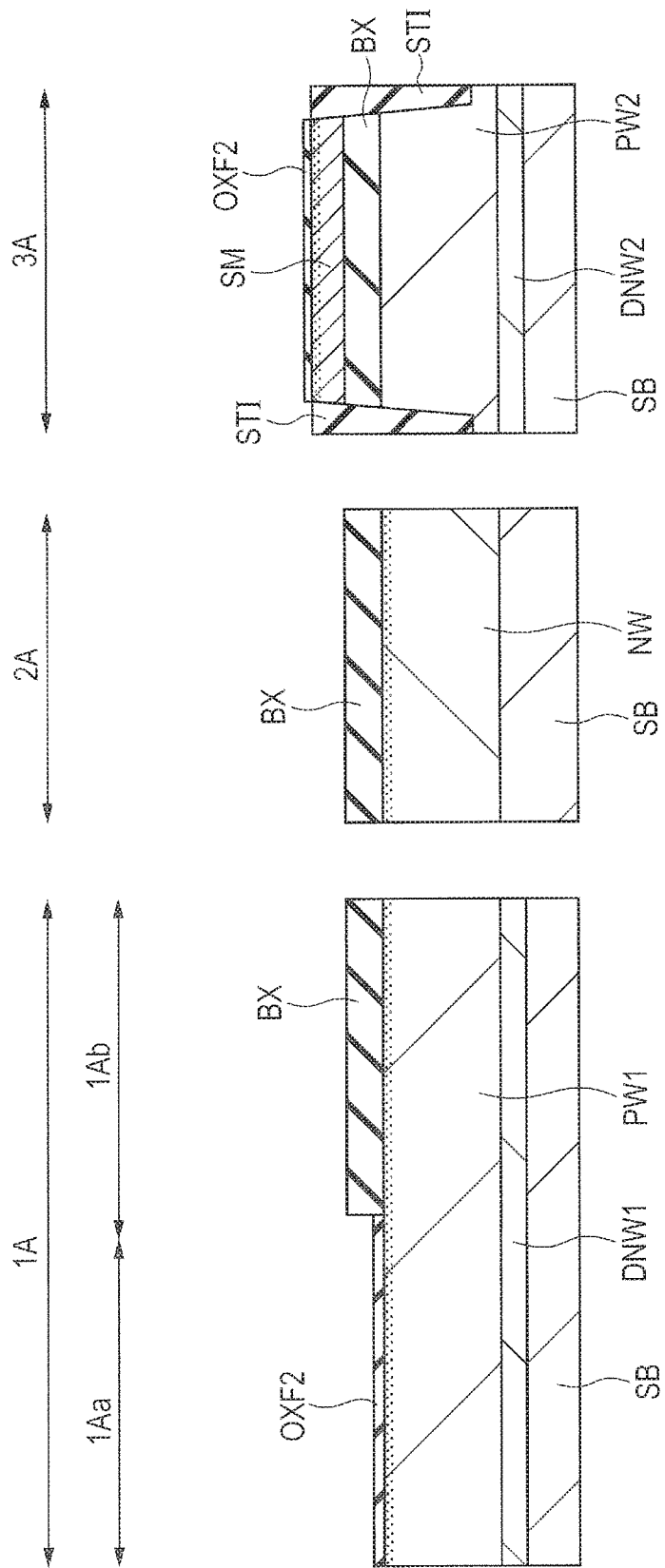
FIG. 14 is a sectional view illustrating the manufacturing process of the semiconductor device following FIG. 13.

Subsequently, as shown in FIG. 14, the SOI substrate is subjected to heating treatment in an atmosphere containing nitrogen typified by a nitrogen monoxide (NO) atmosphere or a nitrogen dioxide ($N_2O$) atmosphere, for example. The heating treatment in the atmosphere containing nitrogen is performed for about 60 sec at about 900° C. Consequently, nitrogen is introduced into the silicon oxide film OXF2 formed in the memory transistor formation region 1Aa. As shown in FIG. 14, performing the heating treatment allows nitrogen to be segregated in the surface of the support substrate SB in each of the memory transistor formation region 1Aa, the selection transistor formation region 1Ab, and the high-withstand-voltage field effect transistor formation region 2A, in other words, segregated at the interface between the silicon oxide film OXF2 and the p-type well PW1, at the interface between the buried insulating layer BX and the p-type well PW1, and at the interface between the buried insulating layer BX and the n-type well NW. In addition, nitrogen is segregated at the interface between the semiconductor layer SM and the silicon oxide film OXF2 in the low-withstand-voltage field effect transistor formation region 3A. In FIG. 14, the segregated nitrogen is schematically indicated by dots.

Figure 15:
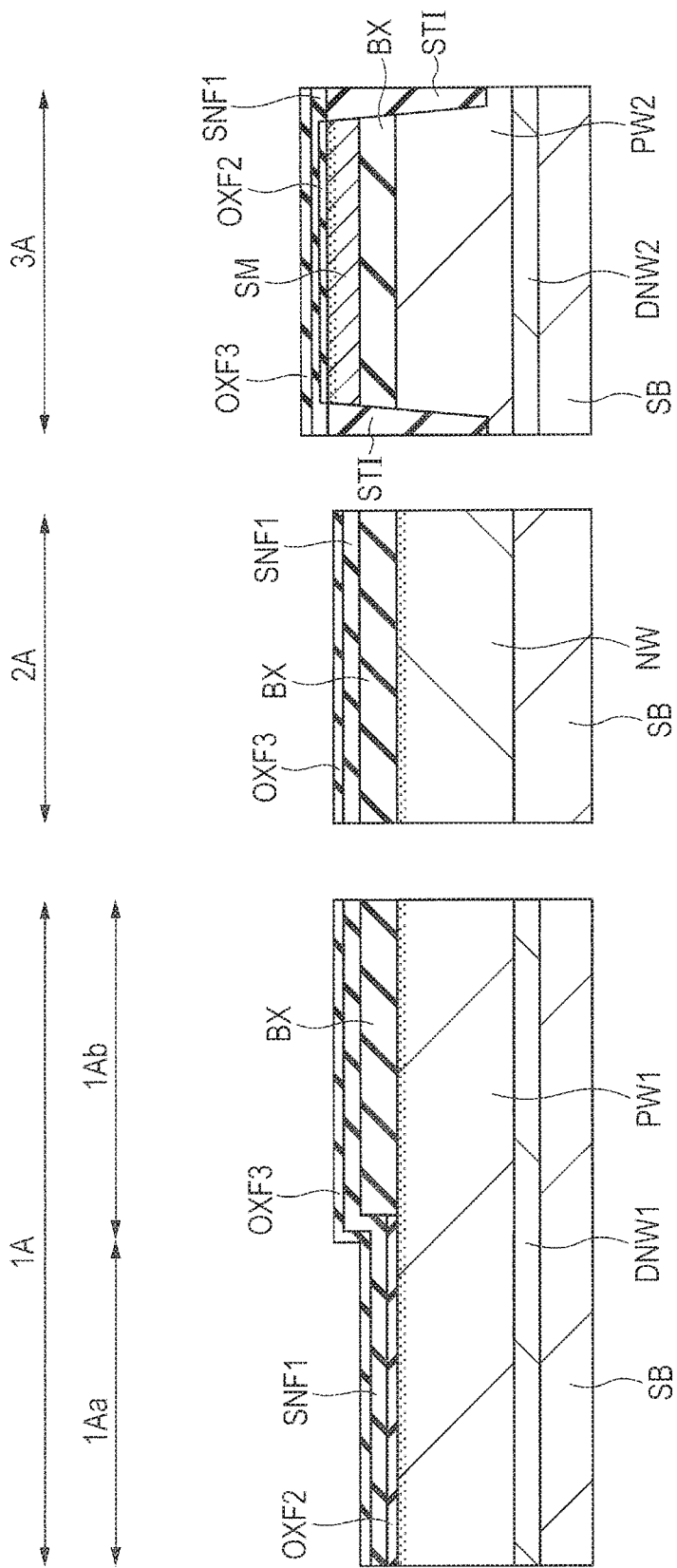
FIG. 15 is a sectional view illustrating the manufacturing process of the semiconductor device following FIG. 14.

Subsequently, as shown in FIG. 15, for example, a chemical vapor deposition (CVD) process or an atomic layer deposition (ALD) process is used to form the silicon nitride film SNF1 on the silicon oxide film OXF2 in the memory transistor formation region 1Aa, on the buried insulating layer BX in the selection transistor formation region 1Ab, on the buried insulating layer BX in the high-withstand-voltage field effect transistor formation region 2A, and on the silicon oxide film OXF2 in the low-withstand-voltage field effect transistor formation region 3A. The silicon nitride film SNF1 is merely an example of an insulating film having a trap level that can capture electrons, and another insulating film to be such an insulating film having the trap level may be used. The silicon nitride film SNF1 has a thickness of about 5 to 10 nm, for example.

Subsequently, for example, an in-situ steam generation (ISSG) oxidation process or a CVD process is used to form the silicon oxide film OXF3 on the memory cell formation region 1A, on the high-withstand-voltage field effect transistor formation region 2A, and on the low-withstand-voltage field effect transistor formation region 3A.

Figure 16:
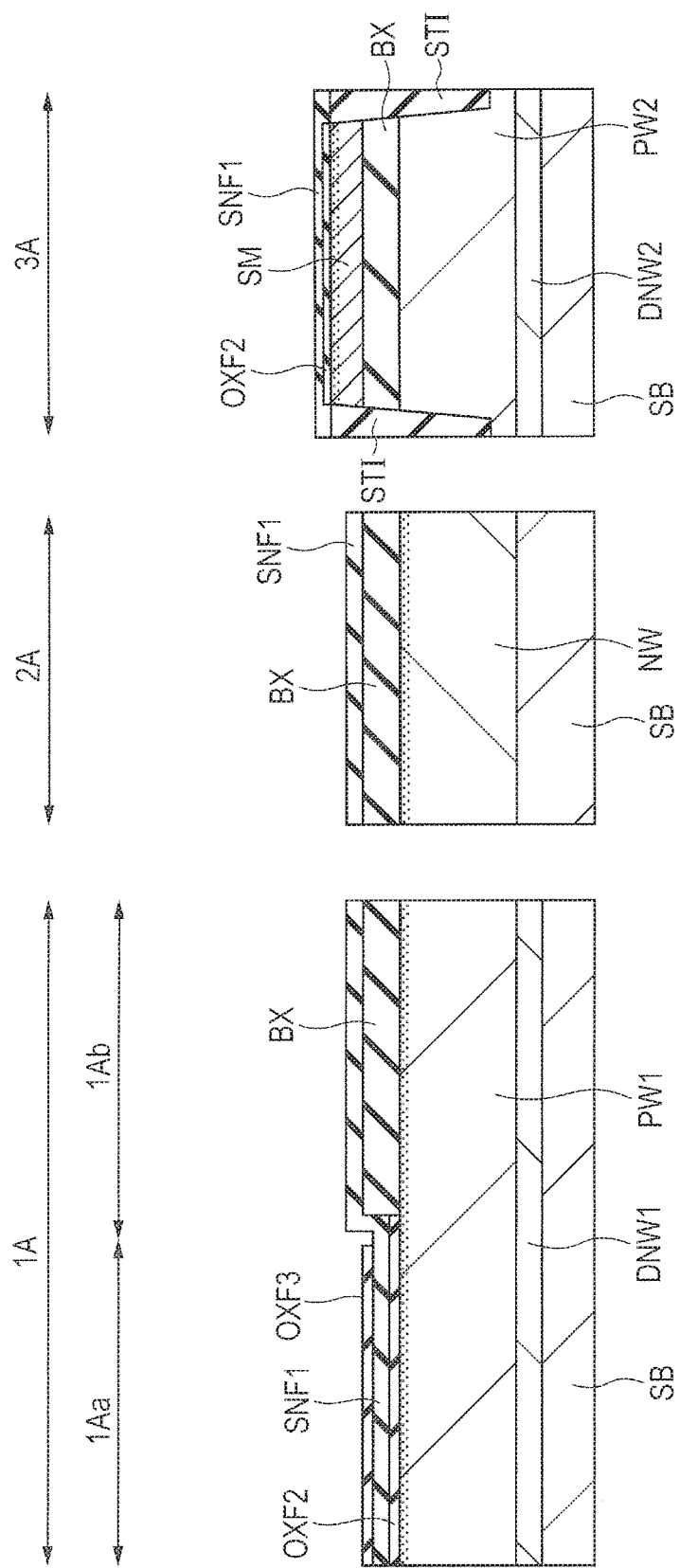
FIG. 16 is a sectional view illustrating the manufacturing process of the semiconductor device following FIG. 15.

Subsequently, as shown in FIG. 16, a photolithography technique and an etching technique are used to remove the silicon oxide film OXF3 formed in the selection transistor formation region 1Ab, in the high-withstand-voltage field effect transistor formation region 2A, and in the low-withstand-voltage field effect transistor formation region 3A. On the other hand, the silicon oxide film OXF3 is left in the memory transistor formation region 1Aa.

Figure 17:
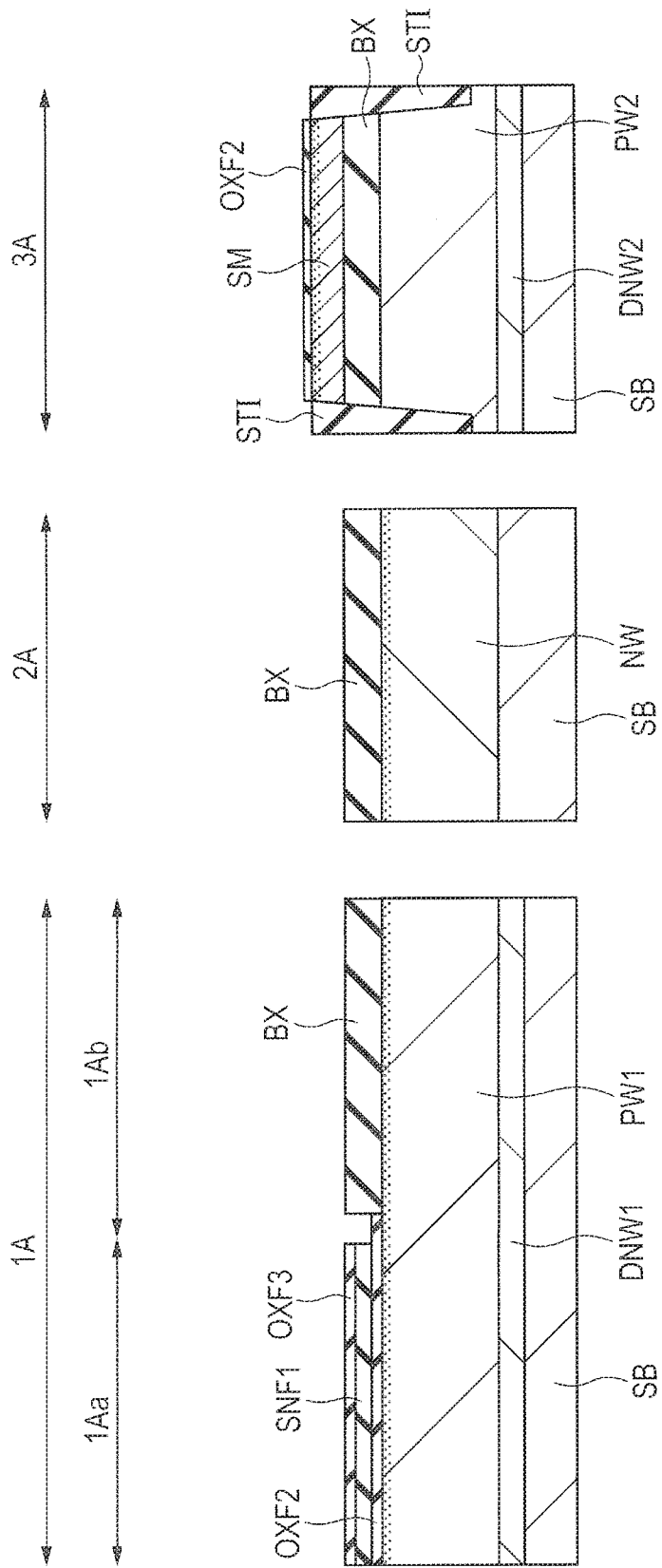
FIG. 17 is a sectional view illustrating the manufacturing process of the semiconductor device following FIG. 16.

Subsequently, as shown in FIG. 17, the silicon oxide film OXF3 formed in the memory transistor formation region 1Aa is used as a hard mask to remove the silicon nitride film SNF1 exposed in the selection transistor formation region 1Ab, in the high-withstand-voltage field effect transistor formation region 2A, and in the low-withstand-voltage field effect transistor formation region 3A. For example, the silicon nitride film SNF1 can be removed using hot phosphoric acid. Thus, the silicon oxide film OXF3 formed in the memory transistor formation region 1Aa is used as the hard mask. This is because a resist film cannot be used when hot phosphoric acid is used.

Figure 18:
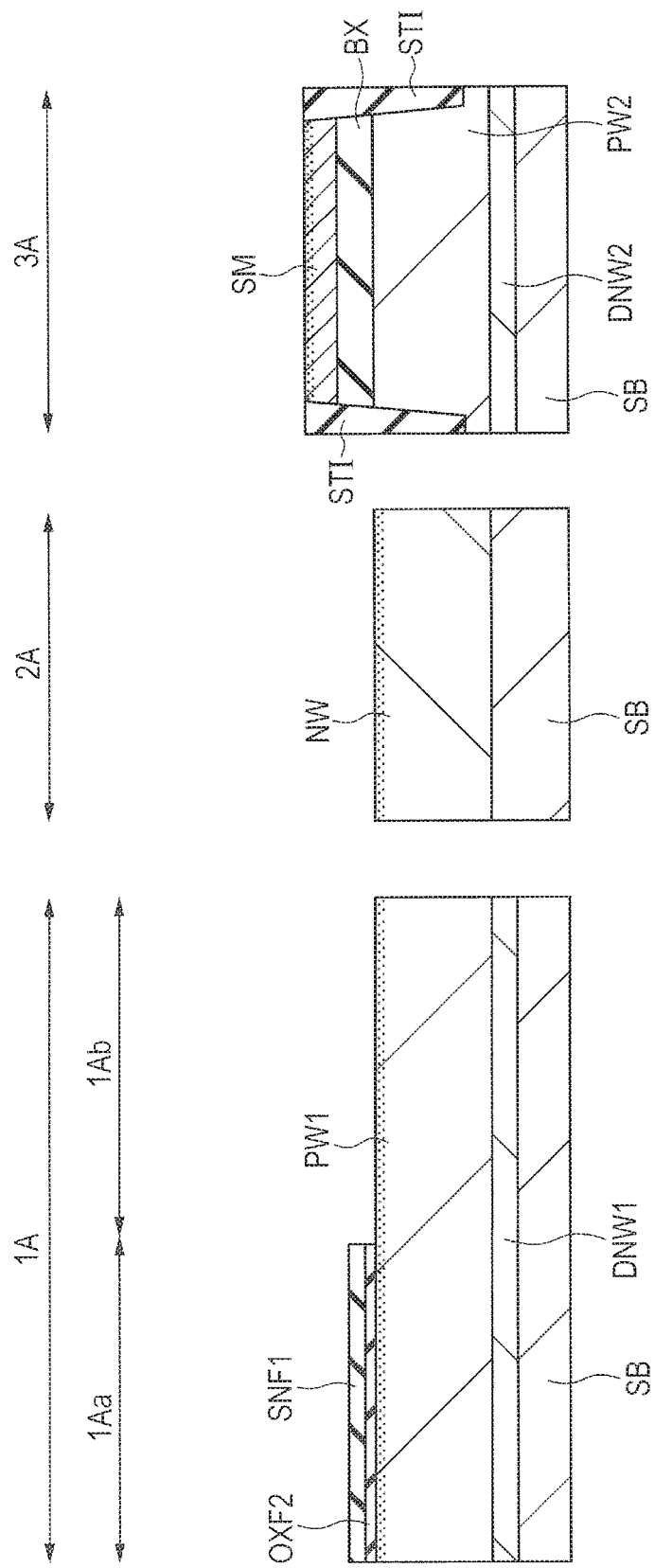
FIG. 18 is a sectional view illustrating the manufacturing process of the semiconductor device following FIG. 17.

Subsequently, as shown in FIG. 18, for example, hydrofluoric acid (HF) is used to remove the silicon oxide film OXF3 formed in the memory transistor formation region 1Aa, the buried insulating layer BX formed in the selection transistor formation region 1Ab and the high-withstand-voltage field effect transistor formation region 2A, and the silicon oxide film OXF2 formed in the low-withstand-voltage field effect transistor formation region 3A. As a result, the surface of the p-type well PW1 is exposed in the selection transistor formation region 1Ab, the surface of the n-type well NW is exposed in the high-withstand-voltage field effect transistor formation region 2A, and the surface of the semiconductor layer SM is exposed in the low-withstand-voltage field effect transistor formation region 3A.

Figure 19:
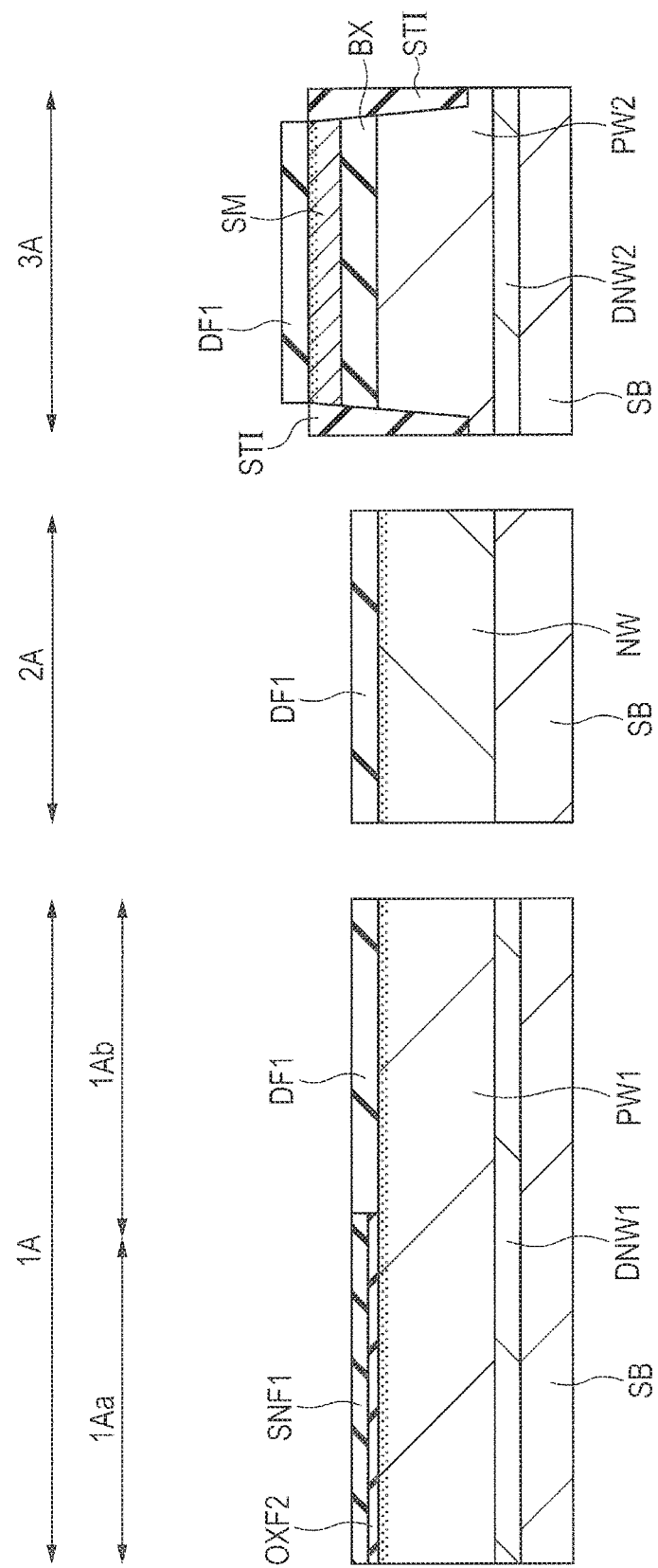
FIG. 19 is a sectional view illustrating the manufacturing process of the semiconductor device following FIG. 18.

Subsequently, as shown in FIG. 19, a sacrificial film DF1 including, for example, a silicon oxide film is formed on the surface of the support substrate SB (the surface of the p-type well PW1) in the selection transistor formation region 1Ab, on the surface of the support substrate SB (the surface of the n-type well NW) in the high-withstand-voltage field effect transistor formation region 2A, and on the surface of the semiconductor layer SM in the low-withstand-voltage field effect transistor formation region 3A. The sacrificial film DF1 can be used by using a rapid thermal anneal (RTO) process as one of thermal oxidation processes, for example. The sacrificial film DF1 is thus formed, and incorporates the nitrogen segregated in the surface of the p-type well PW1 in the selection transistor formation region 1Ab, in the surface of the n-type well NW in the high-withstand-voltage field effect transistor formation region 2A, and in the surface of the semiconductor layer SM in the low-withstand-voltage field effect transistor formation region 3A. This is because the sacrificial film DF1 is formed by the thermal oxidation process so as to erode a base material. Since a surface of a silicon nitride film having oxidation resistance cannot be oxidized by the rapid thermal anneal process, no sacrificial film DF1 is formed on the surface of the silicon nitride film SNF1 formed in the memory transistor formation region 1Aa.

Figure 20:
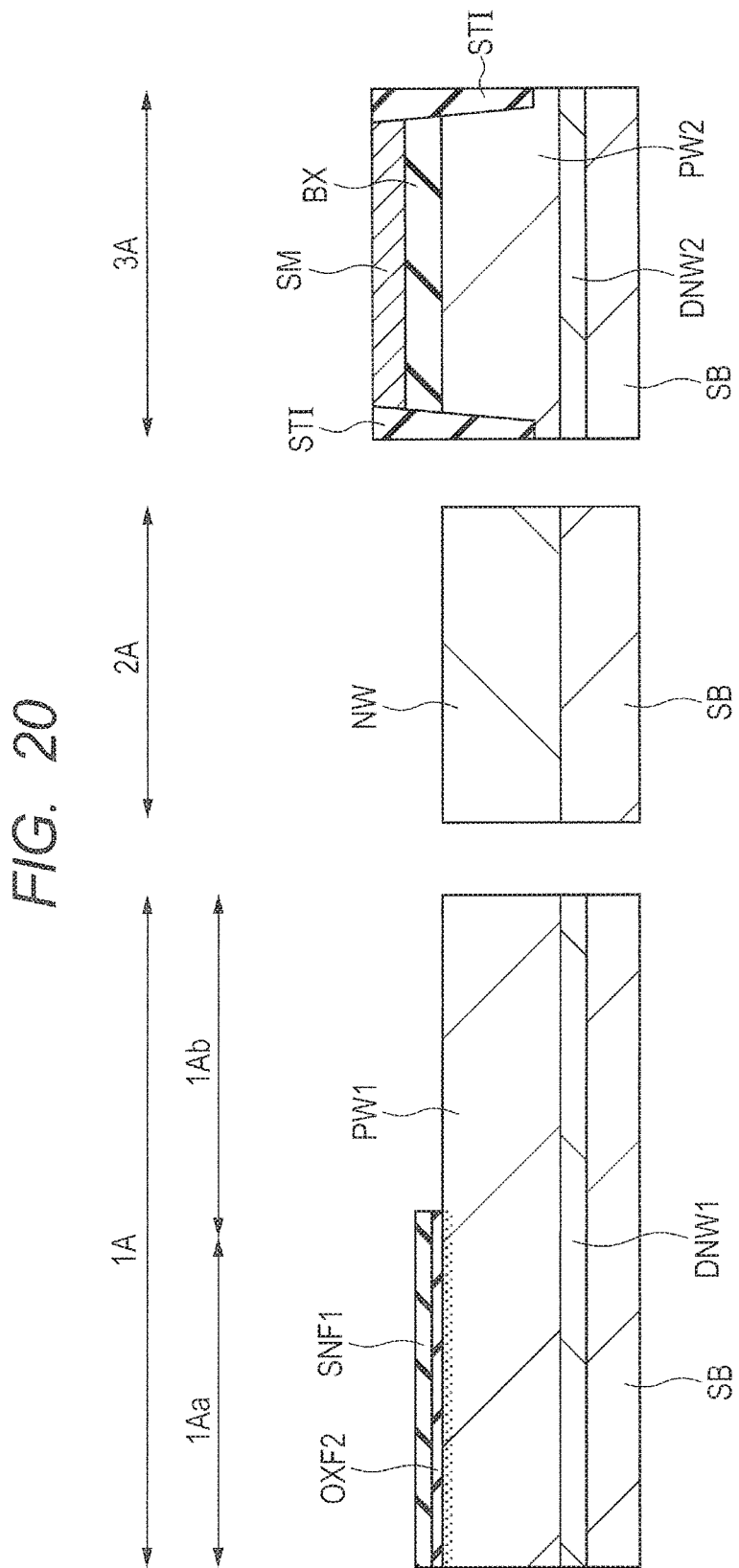
FIG. 20 is a sectional view illustrating the manufacturing process of the semiconductor device following FIG. 19.

Subsequently, as shown in FIG. 20, for example, hydrofluoric acid is used to remove the sacrificial film DF1 formed on the surface of the p-type well PW1 in the selection transistor formation region 1Ab, on the surface of the n-type well NW in the high-withstand-voltage field effect transistor formation region 2A, and on the surface of the semiconductor layer SM in the low-withstand-voltage field effect transistor formation region 3A. Consequently, the nitrogen, which is segregated in the surface of the p-type well PW1 in the selection transistor formation region 1Ab, in the surface of the n-type well NW in the high-withstand-voltage field effect transistor formation region 2A, and in the surface of the semiconductor layer SM in the low-withstand-voltage field effect transistor formation region 3A, is removed by removing the sacrificial film DF1. Although the first embodiment is described with an exemplary case where the sacrificial film DF1 is formed using the rapid thermal anneal process, a method of forming the sacrificial film DF1 is not limited thereto, and the sacrificial film DF1 may be formed using an ISSG oxidation process, for example.

Figure 21:
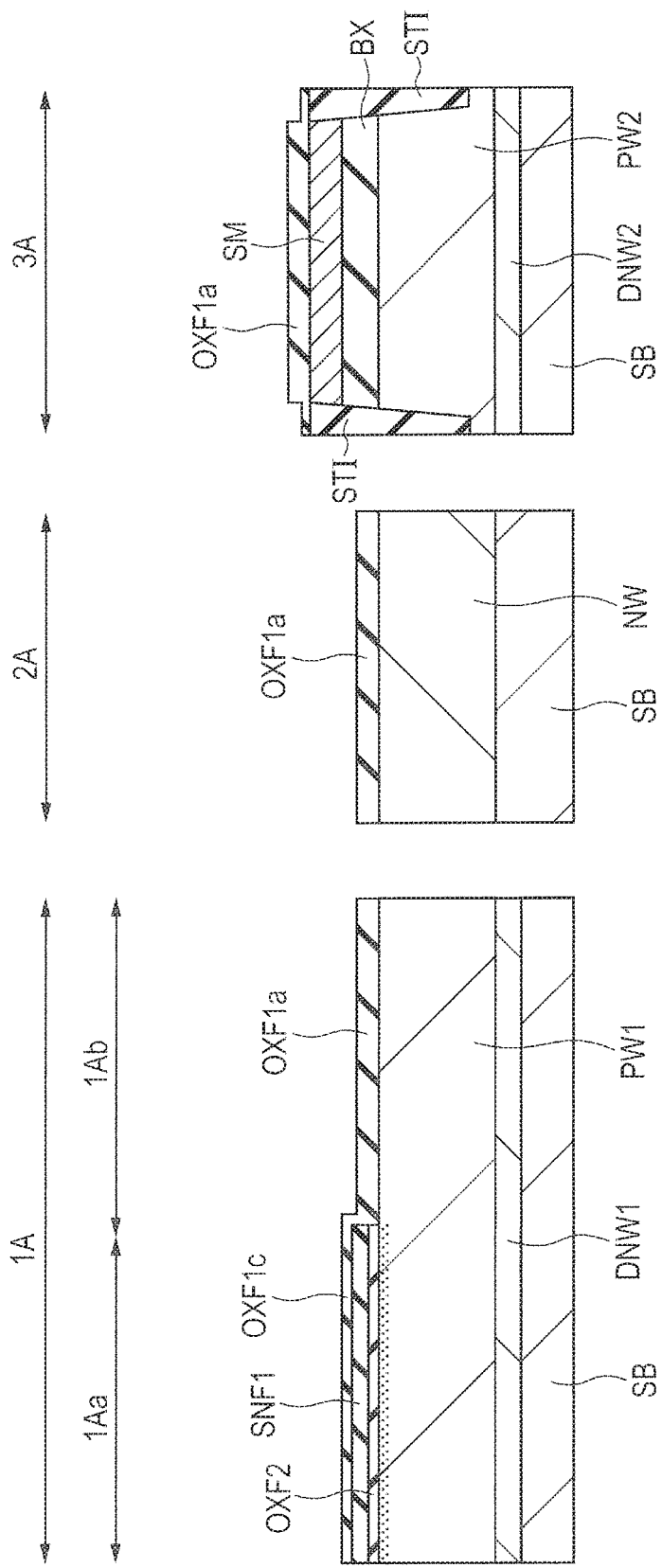
FIG. 21 is a sectional view illustrating the manufacturing process of the semiconductor device following FIG. 20.

Subsequently, as shown in FIG. 21, the rapid thermal anneal process and the ISSG oxidation process are performed in a combined manner. Consequently, the silicon oxide film OXF1a is formed on the surface of the p-type well PW1 in the selection transistor formation region 1Ab, on the surface of the n-type well NW in the high-withstand-voltage field effect transistor formation region 2A, and on the surface of the semiconductor layer SM in the low-withstand-voltage field effect transistor formation region 3A, and a silicon oxide film OXF1c is formed on the silicon nitride film SNF1 in the memory transistor formation region 1Aa. Thickness of the silicon oxide film OXF1c is smaller than thickness of the silicon oxide film OXF1a.

Figure 22:
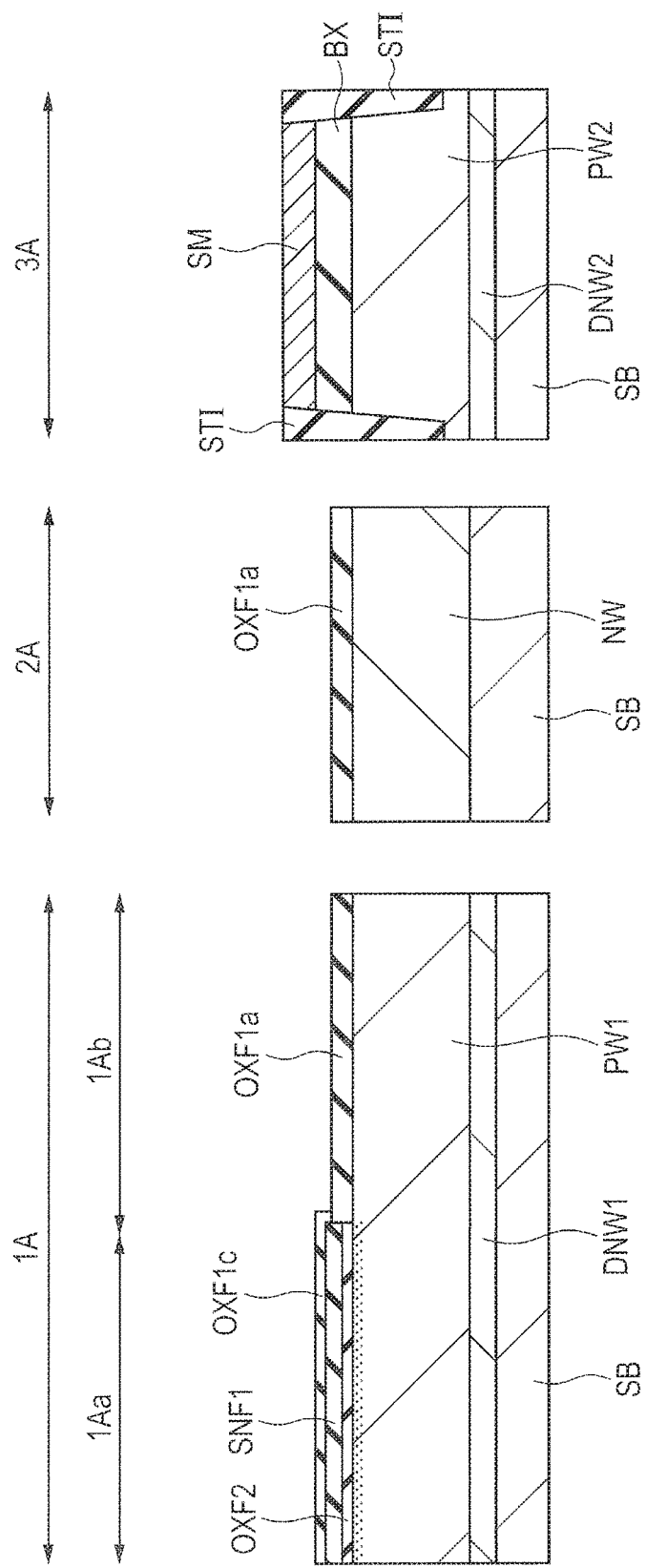
FIG. 22 is a sectional view illustrating the manufacturing process of the semiconductor device following FIG. 21.

Subsequently, as shown in FIG. 22, a photolithography technique and an etching technique are used to remove the silicon oxide film OXF1a formed in the low-withstand-voltage field effect transistor formation region 3A.

As described above, the SOI substrate is subjected to heating treatment (see FIG. 14) in an atmosphere containing nitrogen, thereby nitrogen is segregated in the surface of the semiconductor layer SM in the low-withstand-voltage field effect transistor formation region 3A. Such nitrogen is basically removed from the surface of the semiconductor layer SM by using the sacrificial film DF1 (see FIG. 19). On the other hand, if nitrogen remains in the surface of the semiconductor layer SM, the nitrogen may affect the characteristics of the low-withstand-voltage field effect transistor (the above-described "NBTI" or "variations in the threshold voltage). This is because impurity concentration of the semiconductor layer SM (channel formation region), in which a channel is formed, in the low-withstand-voltage field effect transistor formation region 3A is $1 \times 10^{18}/\text{cm}^3$ or less (preferably $1 \times 10^{17}/\text{cm}^3$ or less), which is lower than impurity concentration of a region (channel formation region), in which a channel is formed, in each of the selection transistor formation region 1Ab and the high-withstand-voltage field effect transistor formation region 2A. However, since the first embodiment has steps of forming and removing the silicon oxide film OXF1a as described above (see FIG. 22), even if nitrogen is not completely removed in the previous steps (see FIGS. 19 to 20), nitrogen can be more securely removed by using the silicon oxide film OXF1a.

Figure 23:
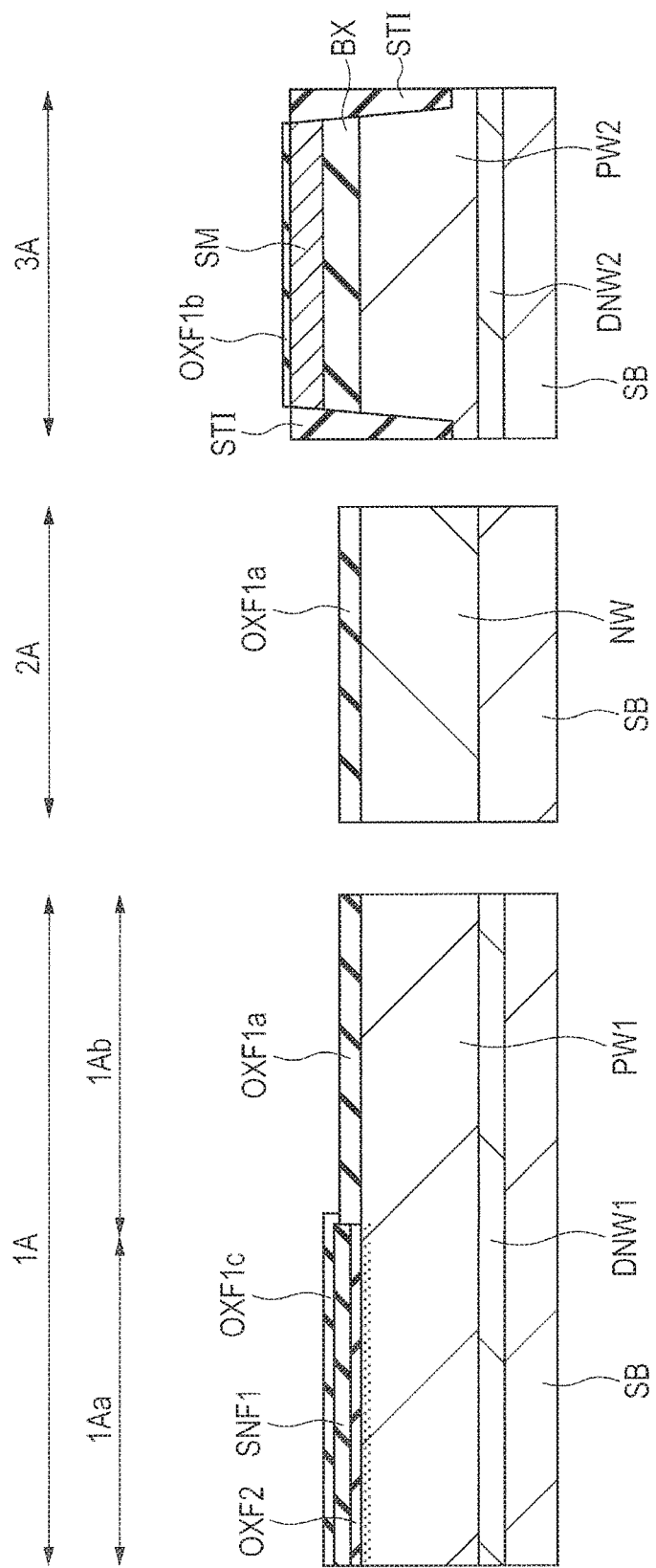
FIG. 23 is a sectional view illustrating the manufacturing process of the semiconductor device following FIG. 22.

Subsequently, as shown in FIG. 23, a thermal oxidation process is used to form the silicon oxide film OXF1b on the surface of the semiconductor layer SM in the low-withstand-voltage field effect transistor formation region 3A. Thickness of the silicon oxide film OXF1b is smaller than thickness of the silicon oxide film OXF1a.

Nitrogen plasma treatment with plasma containing nitrogen is performed on the surface of the silicon oxide film OXF1c in the memory transistor formation region 1Aa, the surface of the silicon oxide film OXF1a formed on the selection transistor formation region 1Ab and on the high-withstand-voltage field effect transistor formation region 2A, and the surface of the silicon oxide film OXF1b in the low-withstand-voltage field effect transistor formation region 3A. The nitrogen plasma treatment nitrides the surface of the silicon oxide film OXF1c in the memory transistor formation region 1Aa, the surface of the silicon oxide film OXF1a formed on the selection transistor formation region 1Ab and on the high-withstand-voltage field effect transistor formation region 2A, and the surface of the silicon oxide film OXF1b in the low-withstand-voltage field effect transistor formation region 3A. The nitrogen plasma treatment is different in this point from the heating treatment in the atmosphere containing nitrogen that causes nitrogen to be segregated at the interface between the silicon oxide film and the SOI substrate. That is, the nitrogen plasma treatment does not cause segregation of nitrogen at the interface between the silicon oxide film and the SOI substrate. Such nitrogen plasma treatment is performed for the following purpose. Specifically, it is possible to suppress diffusion to an SOI substrate side of a conductive impurity introduced into the gate electrode as described later. For example, for a p-channel-type field effect transistor, boron as a p-type impurity is introduced into a polysilicon film configuring the gate electrode. Boron has a large diffusion coefficient in silicon and thus easily diffuses to the SOI substrate side from the gate electrode, and may have an adverse effect on the electrical characteristics of the p-channel-type field effect transistor. With this regard, the nitrogen plasma treatment is performed in the first embodiment, making it possible to effectively suppress so-called penetration of boron to the SOI substrate side. Furthermore, the nitrogen plasma treatment makes it possible to form the silicon nitride film on the surface of the silicon oxide film to be the gate insulating film, and the dielectric constant of the silicon nitride film is higher than the dielectric constant of the silicon oxide film. This makes it possible to increase gate capacitance while the gate insulating film has a large physical thickness.

Figure 24:
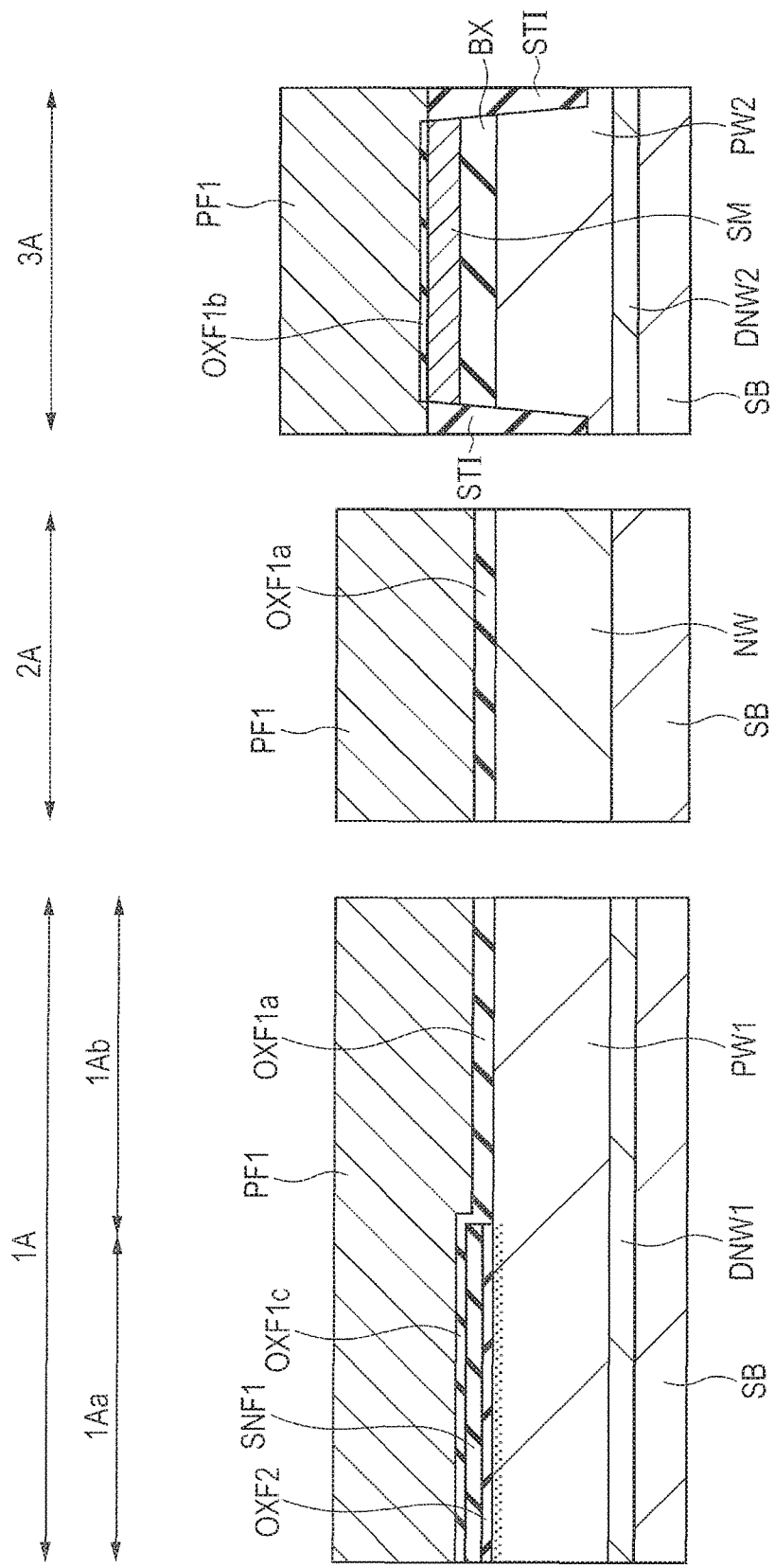
FIG. 24 is a sectional view illustrating the manufacturing process of the semiconductor device following FIG. 23.

Subsequently, as shown in FIG. 24, for example, a CVD process is used to form the polysilicon film PF1 on the memory cell formation region 1A, on the high-withstand-voltage field effect transistor formation region 2A, and on the low-withstand-voltage field effect transistor formation region 3A. Subsequently, while not shown, a photolithography technique and an ion implantation process are used to introduce a conductive impurity into the polysilicon film PF1. Specifically, the memory transistor formation region 1Aa, the selection transistor formation region 1Ab, and the low-withstand-voltage field effect transistor formation region 3A are described with an exemplary case of forming the n-channel-type field effect transistor; hence, an n-type impurity typified by phosphorous (P) or arsenic (As) is introduced into the polysilicon film PF1 in each of such regions. On the other hand, the high-withstand-voltage field effect transistor formation region 2A is described with an exemplary case of forming the p-channel-type field effect transistor; hence, a p-type impurity typified by boron (B) is introduced into the polysilicon film PF1 in such a region.

Subsequently, for example, a CVD process is used to form the silicon nitride film (SNF2) to be a cap insulating film on the polysilicon film PF1.

Figure 25:
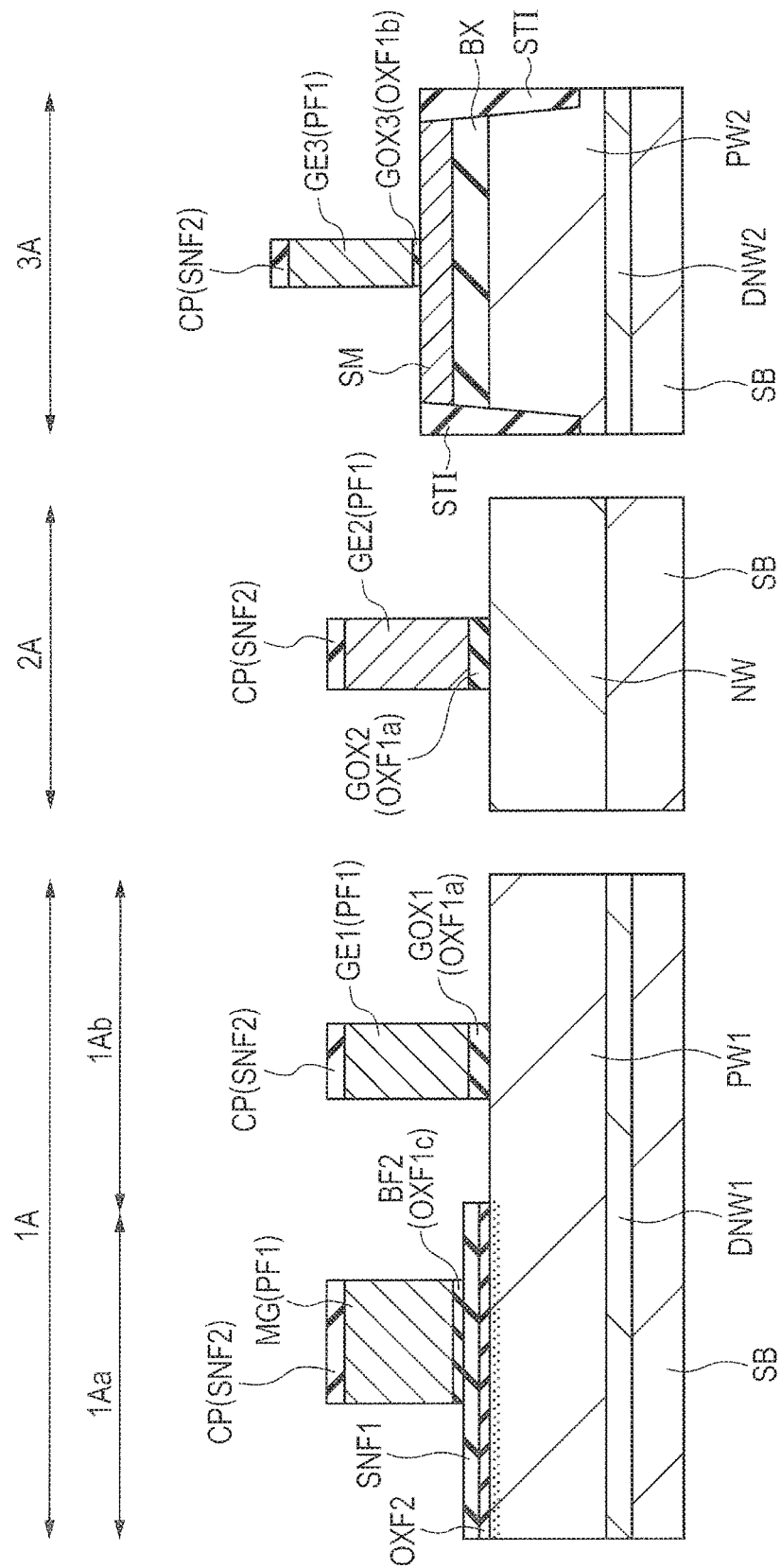
FIG. 25 is a sectional view illustrating the manufacturing process of the semiconductor device following FIG. 24.

Subsequently, as shown in FIG. 25, a photolithography technique and an etching technique are used to pattern the silicon nitride film SNF2 and the polysilicon film PF1. As a result, the memory gate electrode MG and a cap insulating film CP on the memory gate electrode MG are formed in the memory transistor formation region 1Aa. Similarly, the gate electrode GE1 and the cap insulating film CP on the gate electrode GE1 are formed in the selection transistor formation region 1Ab. The gate electrode GE2 and the cap insulating film CP on the gate electrode GE2 are formed in the high-withstand-voltage field effect transistor formation region 2A. The gate electrode GE3 and the cap insulating film CP on the gate electrode GE3 are formed in the low-withstand-voltage field effect transistor formation region 3A.

Subsequently, as shown in FIG. 25, in the memory transistor formation region 1Aa, the silicon oxide film OXF1c exposed from the memory gate electrode MG is removed to form the potential barrier film BF2 under the memory gate electrode MG. As shown in FIG. 25, in the selection transistor formation region 1Ab, the silicon oxide film OXF1a exposed from the gate electrode GE1 is removed to form the gate insulating film GOX1 under the gate electrode GE1. As shown in FIG. 25, in the high-withstand-voltage field effect transistor formation region 2A, the silicon oxide film OXF1a exposed from the gate electrode GE2 is removed to form the gate insulating film GOX2 under the gate electrode GE2. As shown in FIG. 25, in the low-withstand-voltage field effect transistor formation region 3A, the silicon oxide film OXF1b exposed from the gate electrode GE3 is removed to form the gate insulating film GOX3 under the gate electrode GE3.

Figure 26:
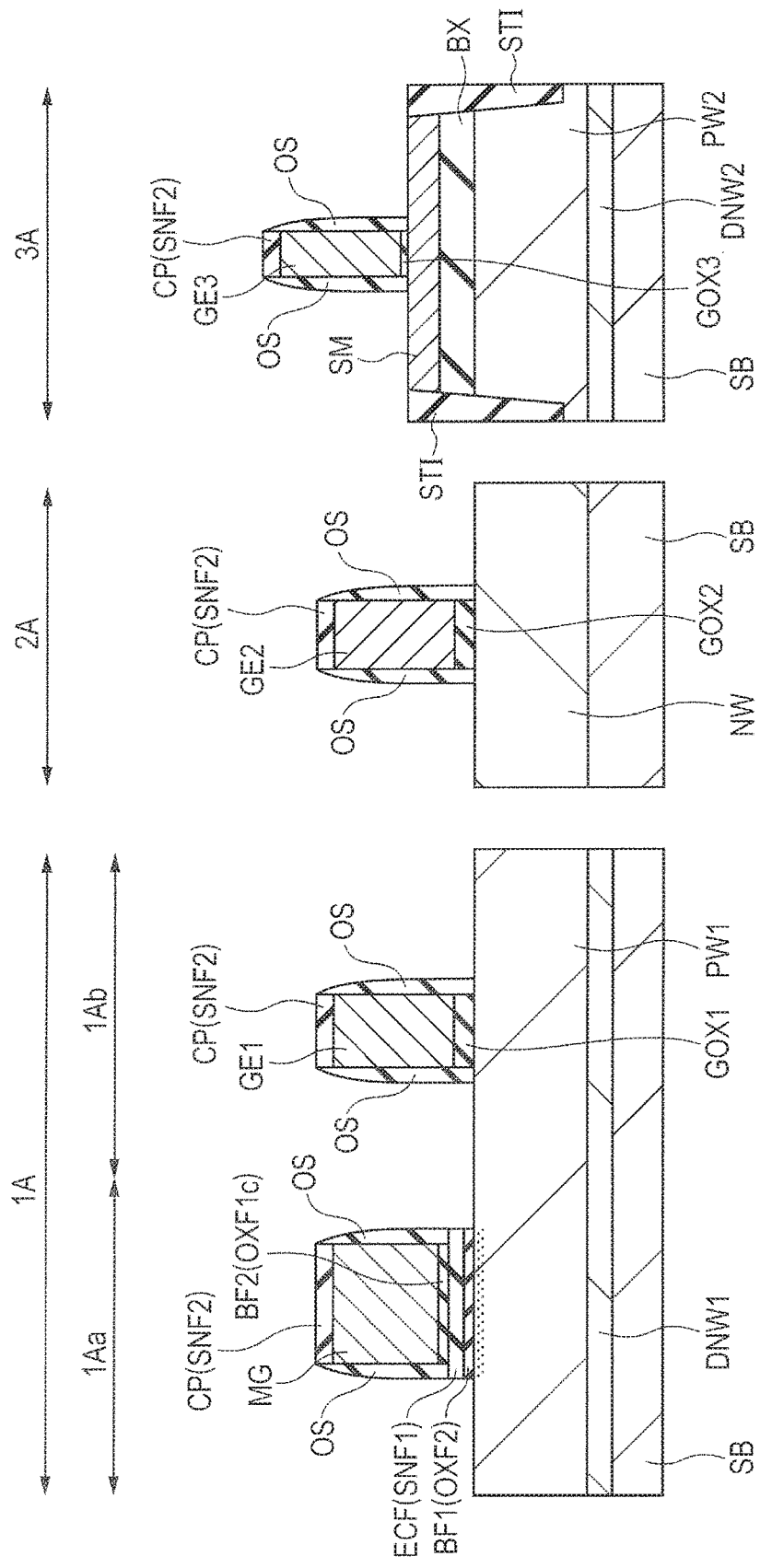
FIG. 26 is a sectional view illustrating the manufacturing process of the semiconductor device following FIG. 25.

Subsequently, FIG. 26 shows a formation step of the offset spacers OS.

First, an insulating film including a silicon oxide film is formed by using, for example, a CVD process on the memory cell formation region 1A, on the high-withstand-voltage field effect transistor formation region 2A, and on the low-withstand-voltage field effect transistor formation region 3A. Subsequently, the insulating film is subjected to anisotropic etching, thereby the offset spacer OS is formed on each of sidewalls of the memory gate electrode MG and the gate electrodes GE1 to GE3. In the memory transistor formation region 1Aa, the anisotropic etching is continuously performed to remove the silicon nitride film SNF1 and the silicon oxide film OXF2 exposed from the offset spacers OS. As a result, the charge storage film ECF is formed under the potential barrier film BF2, and the potential barrier film BF1 is formed under the charge storage film ECF.

Figure 27:
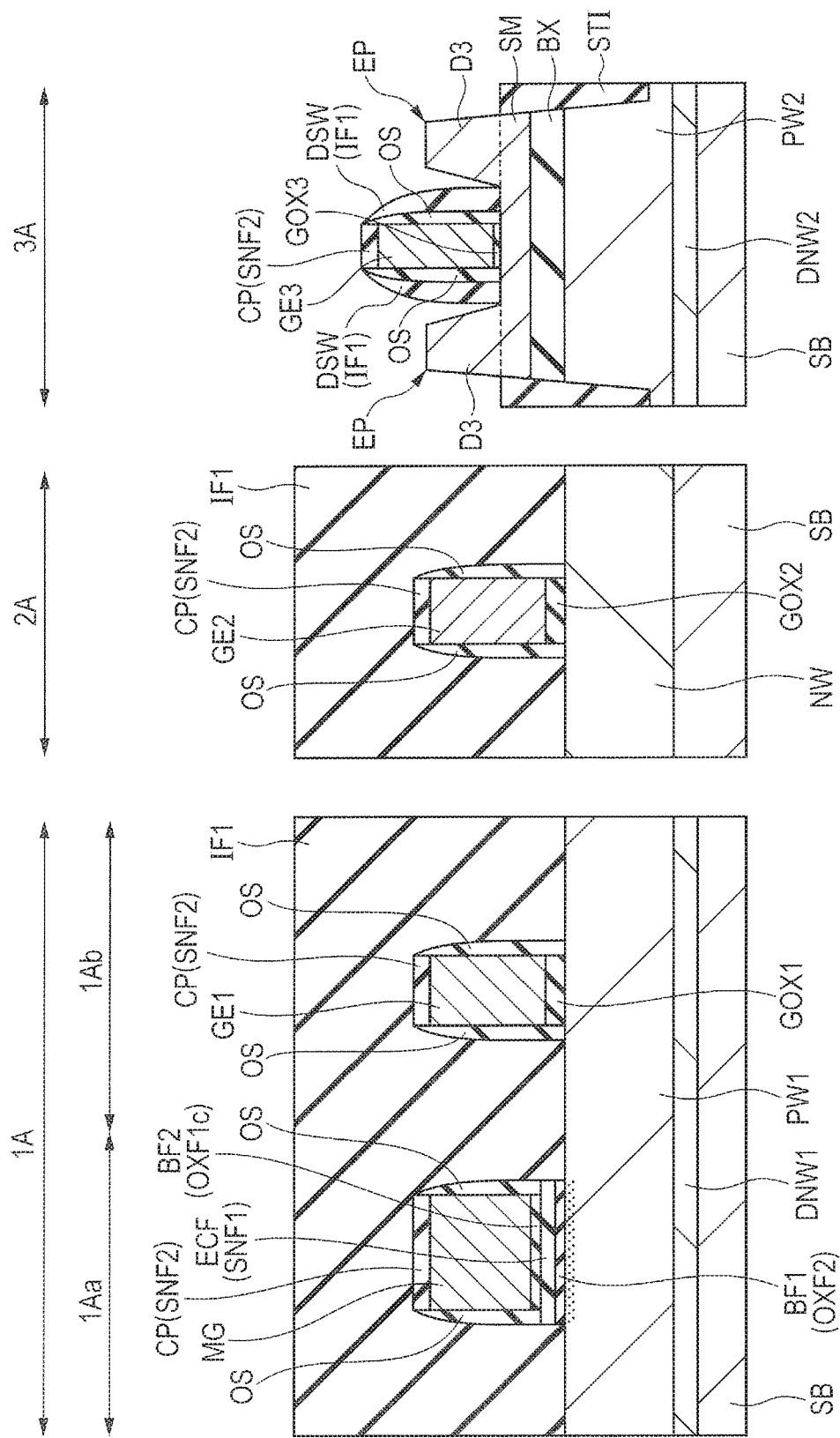
FIG. 27 is a sectional view illustrating the manufacturing process of the semiconductor device following FIG. 26.

Subsequently, FIG. 27 shows a step of forming dummy sidewall spacers DSW and an epitaxial layer EP in the low-withstand-voltage field effect transistor formation region 3A.

First, an insulating film IF1 including a silicon nitride film is formed using, for example, a CVD process on the memory cell formation region 1A, on the high-withstand-voltage field effect transistor formation region 2A, and on the low-withstand-voltage field effect transistor formation region 3A. Subsequently, the insulating film IF1 in the low-withstand-voltage field effect transistor formation region 3A is processed by anisotropic etching with an undepicted resist pattern, which selectively covers the insulating film IF1 in each of the memory cell formation region 1A and the high-withstand-voltage field effect transistor formation region 2A, as a mask. As a result, the dummy sidewall spacers DSW can be formed on the respective sidewalls of the gate electrode GE3 with the offset spacer OS in between in the low-withstand-voltage field effect transistor formation region 3A. Subsequently, the resist pattern is removed by asking treatment.

Subsequently, an epitaxial growth technique is used to form an epitaxial layer EP (semiconductor layer EP) made of, for example single-crystal silicon is formed on the semiconductor layer SM in the low-withstand-voltage field effect transistor formation region 3A. The semiconductor layer EP has a thickness of about 20 to 40 nm. The gate electrode GE3 in the low-withstand-voltage field effect transistor formation region 3A is covered with the cap insulating film CP, and thus no epitaxial layer EP is formed on the gate electrode GE3. The memory cell formation region 1A and the high-withstand-voltage field effect transistor formation region 2A are covered with the insulating film IF 1, and thus no epitaxial layer EP is formed in the regions 1A and 2A.

The epitaxial growth technique is desirably performed while no conductive impurity is introduced into the semiconductor layer SM by an ion implantation process, and for example, desirably performed before forming the extension regions EX described later.

This is because when the epitaxial layer EP is formed on the semiconductor layer SM damaged by the ion implantation process, crystallinity of silicon configuring the semiconductor layer SM is varied due to the damage, which prevents successful growth of the epitaxial layer EP. As a result, the epitaxial layer EP may not be formed having a desired thickness and a desired shape. In the first embodiment, therefore, the epitaxial layer EP is formed before forming the extension region EX.

Although the epitaxial layer EP is integrated with the semiconductor layer SM because they are made of the same material, a boundary of the epitaxial layer EP and the semiconductor layer SM is indicated by a broken line for ease in understanding of the invention in the first embodiment. In addition, the epitaxial layer EP is indicated by an arrow in the drawing since when the diffusion region is formed in the epitaxial layer EP and in the semiconductor layer SM in a later step, the epitaxial layer EP is extremely difficult to be determined.

Figure 28:
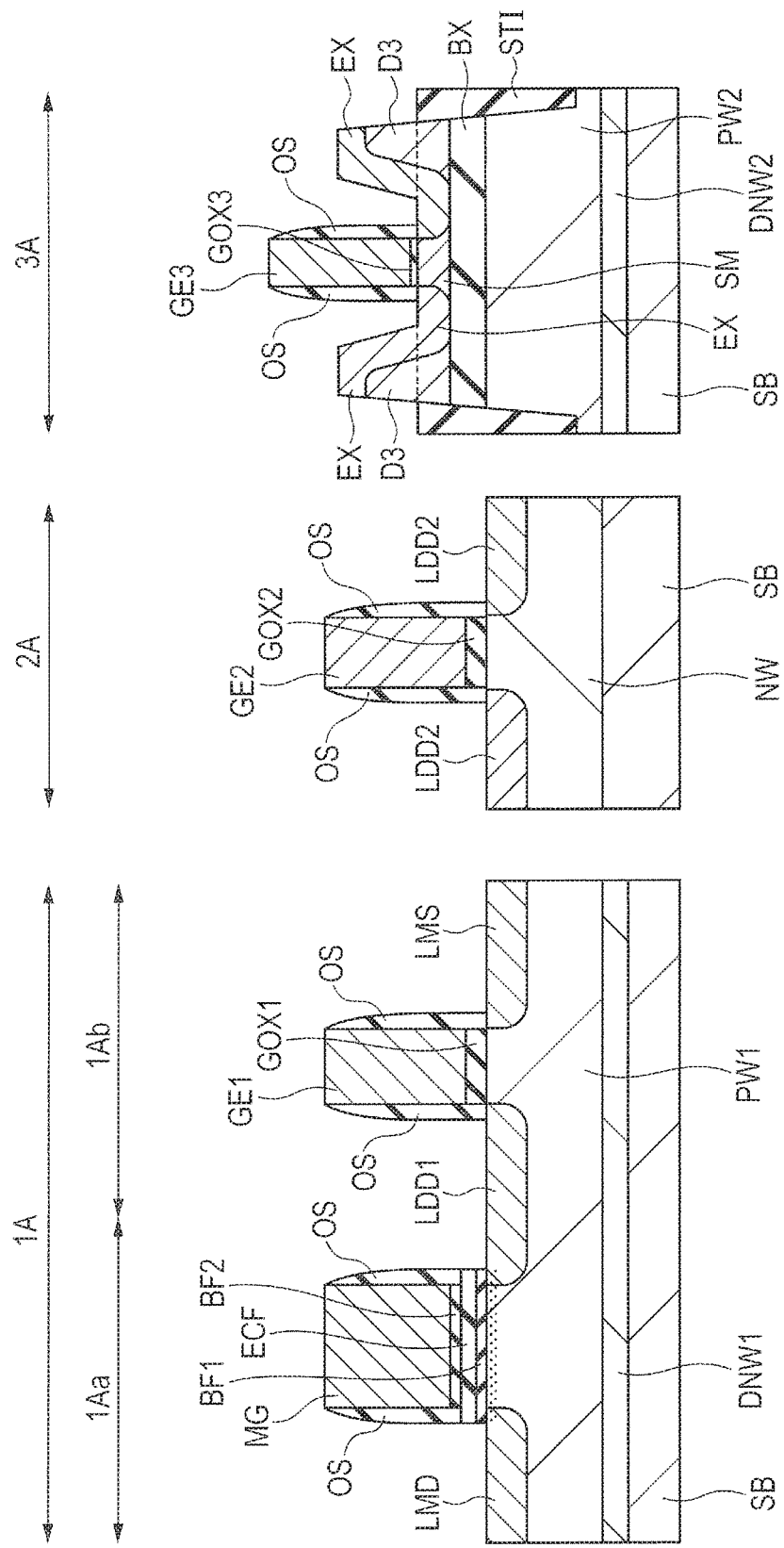
FIG. 28 is a sectional view illustrating the manufacturing process of the semiconductor device following FIG. 27.

Subsequently, as shown in FIG. 28, etching having high selectivity against the offset spacers OS is performed to remove the dummy sidewall spacers DSW and the cap insulating film CP from the low-withstand-voltage field effect transistor formation region 3A, and remove the insulating film IF1 and the cap insulating film CP from the memory cell formation region 1A and the high-withstand-voltage field effect transistor formation region 2A. Since the dummy sidewall spacers DSW, the insulating film IF1, and the cap insulating films CP are made of the same material, they can be removed together. Hence, since no mask is required to be added, leading to a simple manufacturing process.

Subsequently, a photolithography technique and an ion implantation process are used to form the impurity region in each of the memory cell formation region 1A, the high-withstand-voltage field effect transistor formation region 2A, and the low-withstand-voltage field effect transistor formation region 3A.

The impurity region LMS, the impurity region LDD1, and the impurity region LMD as n-type semiconductor regions are formed in the memory cell formation region 1A. The impurity region LMS, which configures part of the source region of the memory cell, is formed in the p-type well PW1 on one side of the gate electrode GE1. The impurity region LDD1, which electrically connects the selection transistor with the memory transistor, is formed in the p-type well PW1 between the left side of the gate electrode GE1 and the right side of the memory gate electrode MG. The impurity region LMD, which configures part of the drain region of the memory cell, is formed in the p-type well PW1 on the left side of the memory gate electrode MG.

The impurity regions LDD2 as a pair of p-type semiconductor regions are formed in the high-withstand-voltage field effect transistor formation region 2A. The respective impurity regions LDD2 configure part of the source region and part of the drain region of the high-withstand-voltage field effect transistor, and are formed in the n-type well NW on both sides of the gate electrode GE2. Nitrogen may be introduced into the impurity regions LDD2 formed in the high-withstand-voltage field effect transistor formation region 2A using an ion implantation process, for example. This makes it possible to improve hot carrier resistance of the high-withstand-voltage field effect transistor formed in the high-withstand-voltage field effect transistor formation region 2A.

The extension regions (impurity regions) EX as a pair of n-type semiconductor regions are formed in the low-withstand-voltage field effect transistor formation region 3A. The respective extension regions EX configure part of the source region and part of the drain region of the low-withstand-voltage field effect transistor, and are formed in the semiconductor layer SM and the epitaxial layer EP on both sides of the gate electrode GE3.

Figure 29:
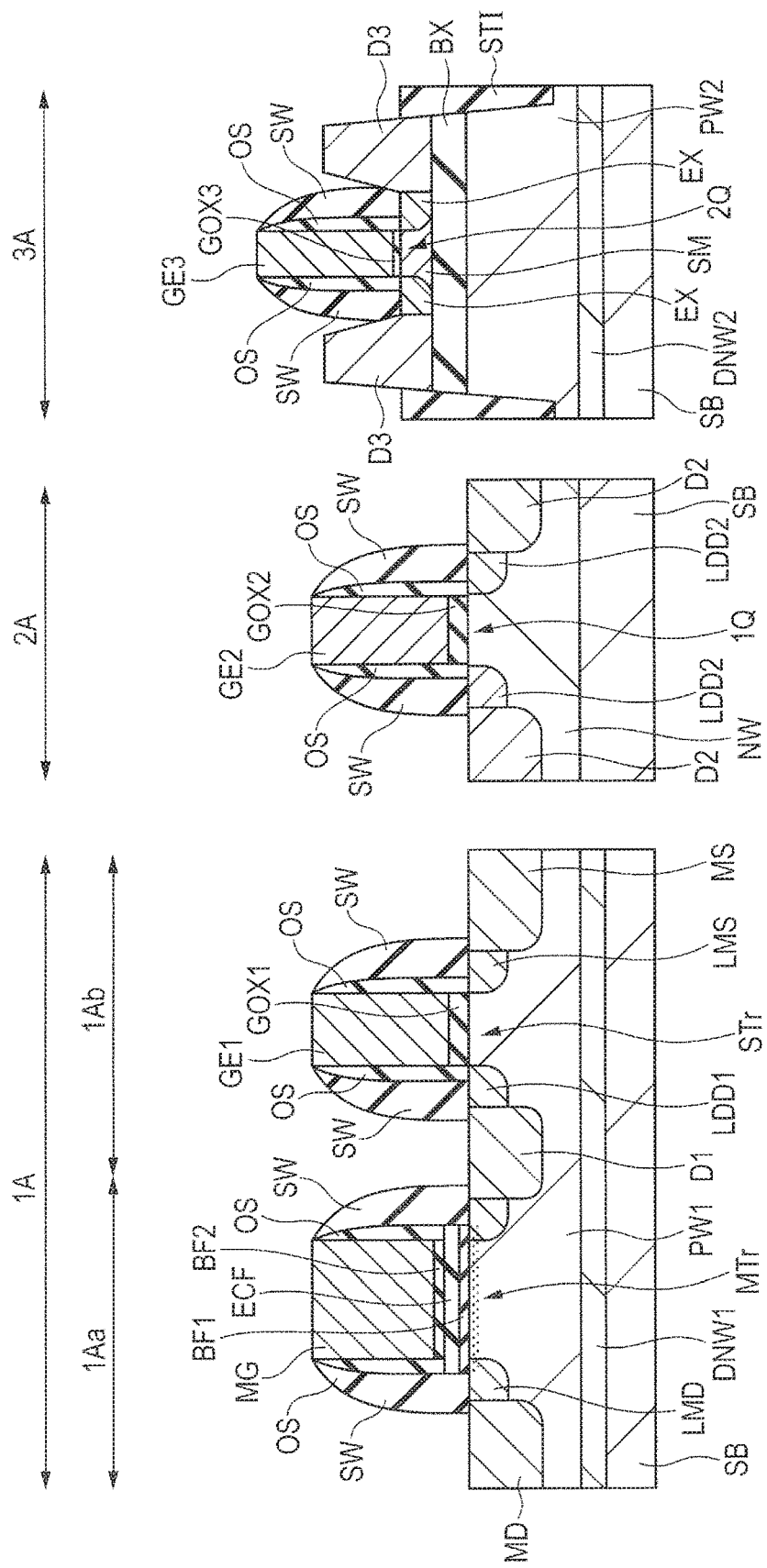
FIG. 29 is a sectional view illustrating the manufacturing process of the semiconductor device following FIG. 28.

Subsequently, FIG. 29 shows a step of forming the sidewall spacers SW and the diffusion regions on the memory cell formation region 1A, on the high-withstand-voltage field effect transistor formation region 2A, and on the low-withstand-voltage field effect transistor formation region 3A.

First, an insulating film including a silicon nitride film is formed using, for example, a CVD process on the memory cell formation region 1A, on the high-withstand-voltage field effect transistor formation region 2A, and on the low-withstand-voltage field effect transistor formation region 3A. Subsequently, the insulating film is subjected to anisotropic etching to form the sidewall spacer SW with the offset spacer OS in between on each of the sidewalls of the memory gate electrode MG and the gate electrodes GE1 to GE3.

Subsequently, a photolithography technique and an ion implantation process are used to form the diffusion regions MS, D1, and MD in the memory cell formation region 1A, form the diffusion region D2 in the high-withstand-voltage field effect transistor formation region 2A, and form the diffusion region D3 in the low-withstand-voltage field effect transistor formation region 3A.

In the memory cell formation region 1A, each of the diffusion regions MS, D1, and MD as the n-type semiconductor regions is exposed from the sidewall spacer SW, and is formed in the p-type well PW1, in which the impurity regions LMS, LDD1, and LMD are formed, while having a higher impurity concentration than any of the impurity regions (LMS, LDD1, and LMD). The diffusion region MS is connected with the impurity region LMS, and configures part of the source region of the memory cell. The diffusion region MD is connected with the impurity region LMD, and configures part of the drain region of the memory cell.

In the high-withstand-voltage field effect transistor formation region 2A, each of the diffusion regions D2 as the p-type semiconductor regions is exposed from the sidewall spacer SW and formed in the n-type well NW, in which the impurity regions LDD2 are formed, while having a higher impurity concentration than the impurity region LDD2. The respective diffusion regions D2 are connected with the impurity regions LDD2, and configure a part of the source region and a part of the drain region of the high-withstand-voltage field effect transistor.

In the low-withstand-voltage field effect transistor formation region 3A, each diffusion region D3 as the n-type semiconductor region is formed in the epitaxial layer EP and the semiconductor layer SM exposed from the sidewall spacer SW, and has a higher impurity concentration than the extension region EX. The diffusion region D3 is connected with the extension region EX, and configures a part of the source region or a part of the drain region of the high-withstand-voltage field effect transistor.

Steps of forming the silicide film, the plug, and the interconnection in the memory cell formation region 1A, in the high-withstand-voltage field effect transistor formation region 2A, and in the low-withstand-voltage field effect transistor formation region 3A are now described.

First, as shown in FIG. 9, the low-resistance silicide film SI is formed by a self aligned silicide (salicide) technique on each of the upper surfaces of the diffusion regions (MD, MS, D1 to D3), the memory gate electrode MG, and the gate electrodes GE1 to GE3.

Specifically, the silicide film SI can be formed as follows. First, a metal film to form the silicide film SI is formed on the memory cell formation region 1A, on the high-withstand-voltage field effect transistor formation region 2A, and on the low-withstand-voltage field effect transistor formation region 3A. The metal film includes, for example, a cobalt film, a nickel film, or a nickel-platinum alloy film. Subsequently, the SOI substrate is subjected to heat treatment to react the metal film with the diffusion regions (MD, MS, D1 to D3), memory gate electrode MG, and the gate electrodes GE1 to GE3. As a result, the silicide film SI is formed on each of the upper surfaces of the diffusion regions (MD, MS, D1 to D3), the memory gate electrode MG, and the gate electrodes GE1 to GE3. Subsequently, the unreacted metal film is removed. Such formation of the silicide film SI makes it possible to reduce the diffusion resistance and the contact resistance of each of the diffusion regions (MD, MS, D1 to D3), the memory gate electrode MG, and the gate electrodes GE1 to GE3.

In this way, the memory transistor MTr is formed in the memory transistor formation region 1Aa, and the selection transistor STr is formed in the selection transistor formation region 1Ab. Similarly, the high-withstand-voltage field effect transistor 1Q is formed in the high-withstand-voltage field effect transistor formation region 2A, and the low-withstand-voltage field effect transistor 2Q is formed in the low-withstand-voltage field effect transistor formation region 3A.

Subsequently, the interlayer insulating film IL1 is formed on the memory cell formation region 1A, on the high-withstand-voltage field effect transistor formation region 2A, and on the low-withstand-voltage field effect transistor formation region 3A. A single silicon oxide film or a stacked film including a silicon nitride film and a thick silicon oxide film formed on the silicon nitride film can be used as the interlayer insulating film IL1. The upper surface of the formed interlayer insulating film IL1 may be polished by a chemical mechanical polishing (CMP) process as necessary.

Subsequently, a photolithography technique and a dry etching technique are used to form contact holes so as to penetrate the interlayer insulating film IL1, and then the contact holes are filled with a conductive film mainly including tungsten (W). This makes it possible to form the plugs PG in the interlayer insulating film IL1. The respective plugs PG formed in the memory cell formation region 1A, in the high-withstand-voltage field effect transistor formation region 2A, and in the low-withstand-voltage field effect transistor formation region 3A are connected with the diffusion regions (MD, MS, D2, D3) through the silicide film SI. Subsequently, the interlayer insulating film IL2 is formed on the interlayer insulating film IL1 having the plugs PG. Subsequently, interconnection trenches are formed in the interlayer insulating film IL2, and then the interconnection trenches are filled with a conductive film mainly containing, for example, copper, thereby the interconnection M1 to be connected with the plugs PG is formed in the interlayer insulating film IL2. The structure of the interconnection M1 is a so-called damascene interconnection structure. Subsequently, while interconnections in the second and subsequent layers are formed using a dual damascene process or the like, such interconnection formation is not illustrated nor described herein.

The interconnection M1 and the overlying interconnections each do not limitedly have the damascene interconnection structure, and may be formed by patterning a conductive film. For example, the interconnections may each be a tungsten interconnection or an aluminum interconnection.

In this way, the semiconductor device of the first embodiment can be manufactured.

Characteristics in Manufacturing Method of First Embodiment

Characteristic points in the manufacturing method of the first embodiment are now described. In a first characteristic point in the manufacturing method of the first embodiment, the sacrificial film DF1 is formed by the thermal oxidation process or the ISSG oxidation process on the selection transistor formation region 1Ab, on the high-withstand-voltage field effect transistor formation region 2A, and on the low-withstand-voltage field effect transistor formation region 3A as shown in FIG. 19, and then the sacrificial film DF1 is removed as shown in FIG. 20. This makes it possible to remove the nitrogen precipitated (segregated) in the surface of the SOI substrate in a region in which the field effect transistors other than the memory transistor are formed. Specifically, since the sacrificial film DF1 is formed by the thermal oxidation process so as to erode the surface of the SOI substrate, the nitrogen segregated in the surface of the SOI substrate is incorporated in the sacrificial film DF1. Removal of the sacrificial film DF1 incorporating the nitrogen results in removal of the nitrogen segregated in the surface of the SOI substrate in the region in which each of the field effect transistors other than the memory transistor is formed. This makes it possible to suppress deterioration in transistor characteristics due to introduction of nitrogen, which is typified by "NBTI" mainly actualized in the p-channel-type field effect transistor or "variations in threshold voltage" actualized in the n-channel-type field effect transistor, in the field effect transistors other than the memory transistor. On the other hand, in the memory transistor formation region 1Aa, nitrogen is left in the surface of the SOI substrate, thereby the retention characteristics can be improved. As described above, according to the first characteristic point in the manufacturing method of the first embodiment, reduction in performance of each field effect transistor other than the memory transistor can be suppressed while reliability of the memory transistor is improved.

The sacrificial film DF1 can incorporate the nitrogen segregated in the surface of the SOI substrate using either of the thermal oxidation process and the ISSG oxidation process. In particular, as shown in FIG. 19, the thermal oxidation process (rapid thermal oxidation process) is desirably used rather than the ISSG oxidation process in light of forming no silicon oxide film on the silicon nitride film SNF1 formed in the memory transistor formation region 1Aa. The reason for this is as follows. When the ISSG oxidation process is used, the silicon oxide film is also formed on the surface of the oxidation-resistant silicon nitride film SNF1. On the other hand, when the rapid thermal oxidation process is used, no silicon oxide film is formed on the surface of the silicon nitride film SNF1. For example, the silicon nitride film SNF1 formed in the memory transistor formation region 1Aa is to be the charge storage film of the memory transistor, and has a predetermined thickness. With this regard, for example, if the ISSG oxidation process is used to form the sacrificial film DF1, the surface of the silicon nitride film SNF1 is eroded. As a result, the thickness of the silicon nitride film SNF1 is deviated from a designed value. On the other hand, if the rapid thermal oxidation process is used to form the sacrificial film DF1, the surface of the silicon nitride film SNF1 is not oxidized. As a result, when the rapid thermal oxidation process is used to form the sacrificial film DF1, it is possible to suppress deviation of the thickness of the silicon nitride film SNF1 from the designed value even if the silicon nitride film SNF1 is formed. As described above, the rapid thermal oxidation process is desirably used to form the sacrificial film DF1 rather than the ISSG oxidation process in light of forming the sacrificial film DF1 without variations in the characteristics of the memory transistor.

In a second characteristic point in the manufacturing method of the first embodiment, for example, as shown in FIG. 17, the silicon oxide film OXF3 formed in the memory transistor formation region 1Aa is removed together with the buried insulating layer BX formed in selection transistor formation region 1Ab and in the high-withstand-voltage field effect transistor formation region 2A, and the silicon oxide film OXF2 formed in the low-withstand-voltage field effect transistor formation region 2A. That is, in the first embodiment, the silicon oxide film OXF3 is not used as the potential barrier film (BF2). This is because when the silicon oxide film OXF3 is used as the potential barrier film (BF2) of the memory transistor, a mask, which covers the memory transistor formation region 1Aa and exposes other regions, is necessary to be added to etch the silicon oxide film OX3 during transition from the step of FIG. 17 to the step of FIG. 18. That is, when the silicon oxide film OXF3 is used as the potential barrier film (BF2) of the memory transistor, the mask is necessary to be added, which means an increase in manufacturing cost. With regard to this, for example, as shown in FIG. 18, when the silicon oxide film OXF3 is entirely removed, no additional mask is required. As a result, the increase in manufacturing cost can be suppressed.

It is suspicious that the silicon oxide film OXF3 need not be originally formed because it is entirely removed. However, even if the silicon oxide film OXF3 is entirely removed in the step of FIG. 18, the silicon oxide film OXF3 is technically meaningfully formed on the silicon nitride film SNF1. The technical meaning of forming the silicon oxide film OXF3 is described below.

For example, as shown in FIG. 17, the silicon nitride film SNF1 is removed from the selection transistor formation region 1Ab, from the high-withstand-voltage field effect transistor formation region 2A, and from the low-withstand-voltage field effect transistor formation region 3A. The silicon nitride film SNF1 is removed using hot phosphoric acid. For example, although it is considered that a resist pattern is formed so as to cover the memory transistor formation region 1Aa and expose other regions, and the silicon nitride film SNF1 is removed with the resist pattern as a mask, the resist pattern cannot be used in case of using the hot phosphoric acid. Hence, for example, as shown in FIG. 17, the silicon oxide film OXF3 in the memory transistor formation region 1Aa is used as a hard mask in place of using the resist pattern, and the silicon nitride film SNF1 is removed by the hot phosphoric acid from the regions other than the memory transistor formation region 1Aa. As described above, the silicon oxide film OXF3 is technically meaningful as the hard mask for removing the silicon nitride film SNF1 by the hot phosphoric acid from the regions other than the memory transistor formation region 1Aa. In this way, the silicon oxide film OXF3 is essentially used as the hard mask for removing the silicon nitride film SNF1 by hot phosphoric acid from the regions other than the memory transistor formation region 1Aa while being not used as the potential barrier film (BF2) of the memory transistor. On the premise of this point, the second characteristic point in the manufacturing method of the first embodiment is used, thereby, as shown in FIG. 18, the silicon oxide film OXF3 formed in the memory transistor formation region 1Aa is removed together with the buried insulating layer BX formed in the selection transistor formation region 1Ab and the high-withstand-voltage field effect transistor formation region 2A, and with the silicon oxide film OXF2 formed in the low-withstand-voltage field effect transistor formation region 3A. This eliminates the need of the additional mask required for leaving the silicon oxide film OXF3 in the memory transistor formation region 1Aa. As a result, an increase in manufacturing cost can be limited to a bare minimum.

In a third characteristic point in the manufacturing method of the first embodiment, for example, as shown in FIG. 21, the silicon oxide film OXF1c is formed in the memory transistor formation region 1Aa while the silicon oxide film OXF1a is concurrently formed in the regions other than the memory transistor formation region 1Aa. In other words, in the third characteristic point in the manufacturing method of the first embodiment, for example, as shown in FIG. 21, the silicon oxide film OXF1c and the silicon oxide film OXF1a having different thicknesses are formed in the same step. As a result, the manufacturing cost can be reduced compared with the case where the silicon oxide film OXF1c and the silicon oxide film OXF1a having different thicknesses are formed in different steps.

Specifically, the third characteristic point in the manufacturing method of the first embodiment is embodied noting that while the silicon oxide film cannot be formed on the silicon nitride film by the rapid thermal oxidation process, the silicon oxide film can be formed on the silicon nitride film by the ISSG oxidation process. Specifically, in FIG. 18, the third characteristic point in the manufacturing method of the first embodiment is embodied by using the rapid thermal oxidation process and the ISSG oxidation process in a combined manner. That is, the rapid thermal oxidation process and the ISSG oxidation process are combined, and thus the silicon oxide film is first formed by the rapid thermal oxidation process in the selection transistor formation region 1Ab, in the high-withstand-voltage field effect transistor formation region 2A, and in the low-withstand-voltage field effect transistor formation region 3A. No silicon oxide film is formed on the silicon nitride film SNF1 in the memory transistor formation region 1Aa. Subsequently, the rapid thermal oxidation process is changed to the ISSG oxidation process, and thus the silicon oxide film is also formed on the silicon nitride film SNF1 formed in the memory transistor formation region 1Aa. As a result, while the silicon oxide film is formed only by the ISSG oxidation process in the memory transistor formation region 1Aa, the silicon oxide film is further formed by the rapid thermal oxidation process in addition to the ISSG oxidation process in the regions other than the memory transistor formation region 1Aa. Thus, the combination of the rapid thermal oxidation process and the ISSG oxidation process makes it possible to differ the thickness of the silicon oxide film OXF1c formed in the memory transistor formation region 1Aa from the thickness of the silicon oxide film OXF1a formed in the regions other than the memory transistor formation region 1Aa. Specifically, thickness of the silicon oxide film OXF1a is larger than thickness of the silicon oxide film OXF1c. As described above, the third characteristic point in the manufacturing method of the first embodiment is achieved. As a result, an increase in manufacturing cost of the semiconductor device can be suppressed.

Second Embodiment

Method of Manufacturing Semiconductor Device

Figure 30:
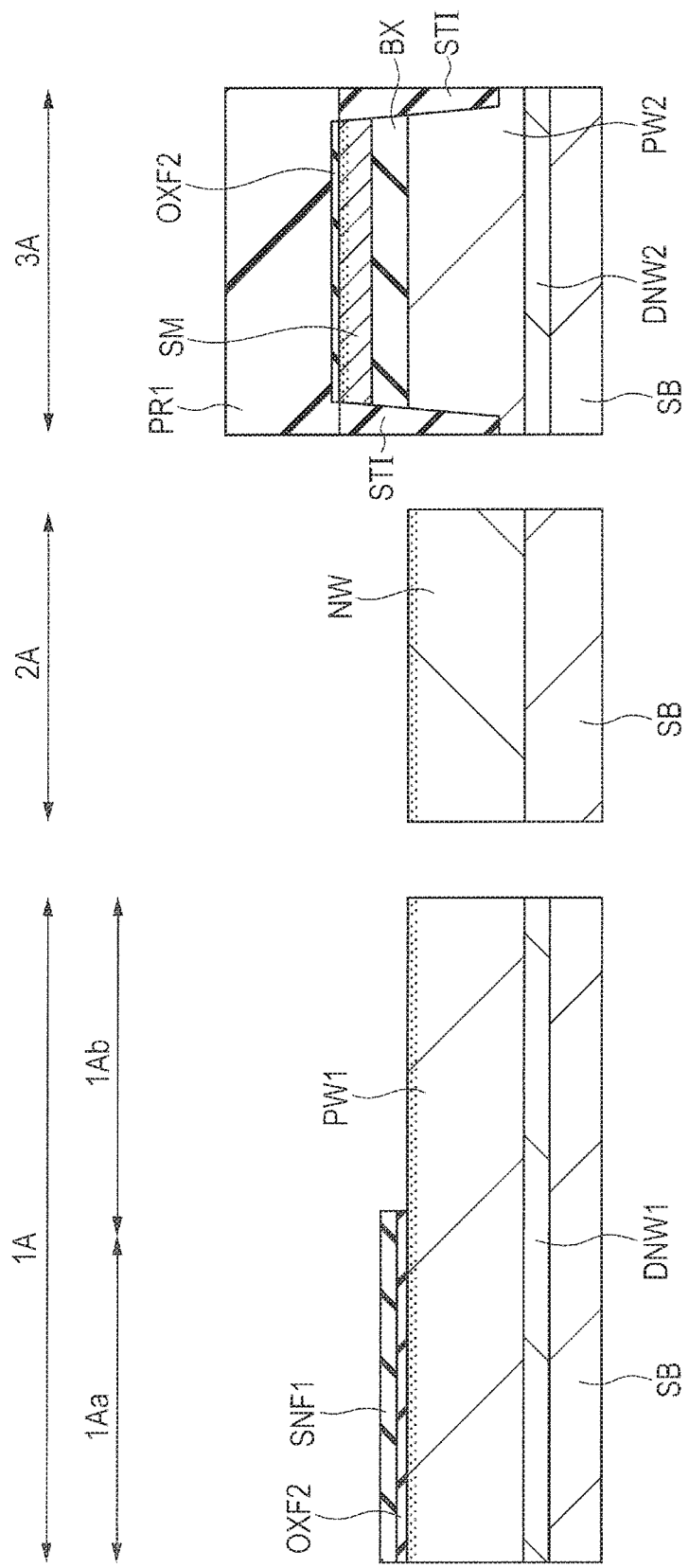
FIG. 30 is a sectional view illustrating a manufacturing process of a semiconductor device of a second embodiment.

A method of manufacturing a semiconductor device of a second embodiment is now described with reference to drawings. The steps of FIGS. 10 to 17 are similar to those of the method of manufacturing the semiconductor device of the first embodiment. Subsequently, as shown in FIG. 30, the low-withstand-voltage field effect transistor formation region 3A is covered with a resist film PR1, and then the silicon oxide film OXF3 formed in the memory transistor formation region 1Aa and the buried insulating layer BX formed in the selection transistor formation region 1Ab and in the high-withstand-voltage field effect transistor formation region 2A are removed by wet etching with hydrofluoric acid, for example. Since the low-withstand-voltage field effect transistor formation region 3A is covered with the resist film PR1, the silicon oxide film configuring the element isolation part STI is protected from the wet etching with hydrofluoric acid.

Figure 31:
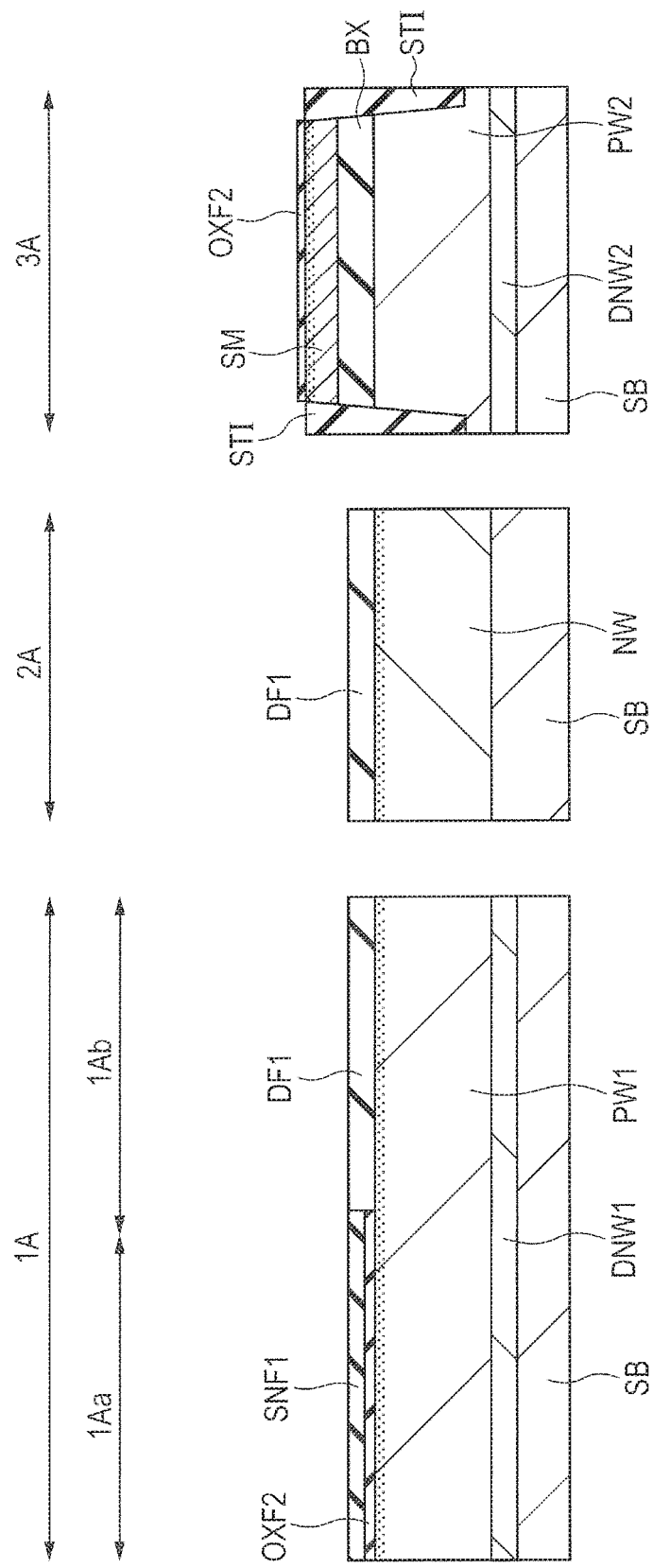
FIG. 31 is a sectional view illustrating the manufacturing process of the semiconductor device following FIG. 30.

Subsequently, the resist film PR1 is removed by using, for example, an asking technique, and then, as shown in FIG. 31, the sacrificial film DF1 is formed using the rapid thermal oxidation process or the ISSG oxidation process on the surface of the support substrate SB (surface of the p-type well PW1) in the selection transistor formation region 1Ab and on the surface of the support substrate SB (surface of the n-type well NW) in the high-withstand-voltage field effect transistor formation region 2A. That is, when the sacrificial film DF1 is formed by the rapid thermal oxidation process or the ISSG oxidation process while the resist film PR1 shown in FIG. 30 is left, the resist film PR1 is exposed to a high temperature equal to or higher than its heat resistant temperature. As a result, the resist film PR1 may be burnt down and the debris may adhere to an underlying material. Consequently, the sacrificial film DF1 is formed after removing the resist film PR1. The semiconductor layer SM is covered with the silicon oxide film OXF2 and thus not exposed in the low-withstand-voltage field effect transistor formation region 3A. Hence, when the sacrificial film DF1 is formed by the rapid thermal oxidation process or the ISSG oxidation process, no sacrificial film DF1 is formed on the semiconductor layer SM in the low-withstand-voltage field effect transistor formation region 3A. Consequently, nitrogen segregated in the surface of the p-type well PW1 in the selection transistor formation region 1Ab and nitrogen segregated in the surface of the n-type well NW in the high-withstand-voltage field effect transistor formation region 2A are incorporated in the sacrificial film DF1. On the other hand, nitrogen segregated in the surface of the semiconductor layer SM in the low-withstand-voltage field effect transistor formation region 3A still remains in the second embodiment.

Figure 32:
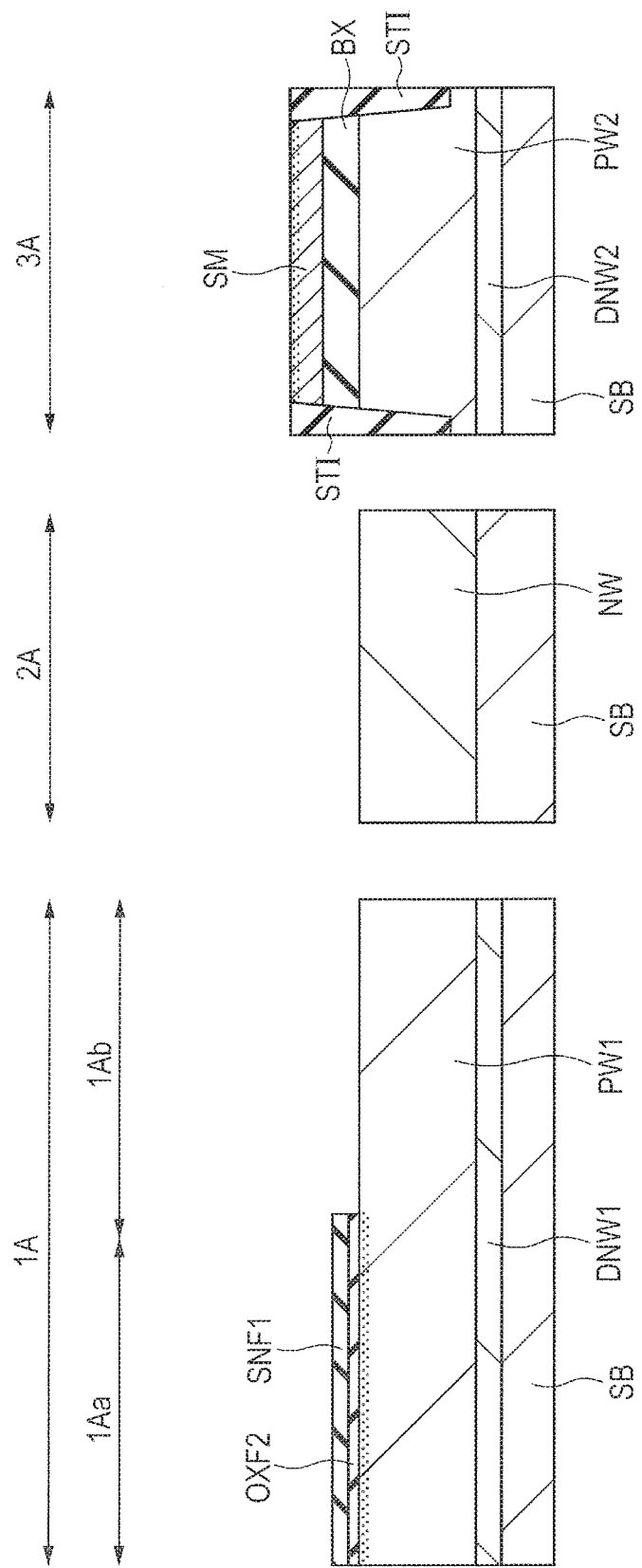
FIG. 32 is a sectional view illustrating the manufacturing process of the semiconductor device following FIG. 31.

Subsequently, as shown in FIG. 32, the sacrificial film DF1 formed in the selection transistor formation region 1Ab and the sacrificial film DF1 formed in the high-withstand-voltage field effect transistor formation region 2A are removed by wet etching with hydrofluoric acid, for example. Consequently, it is possible to remove nitrogen from the surface of the p-type well PW1 in the selection transistor formation region 1Ab and from the surface of the n-type well NW in the high-withstand-voltage field effect transistor formation region 2A.

Subsequently, the silicon oxide film OXF2 formed on the semiconductor layer SM is removed by wet etching with hydrofluoric acid to expose the surface of the semiconductor layer SM.

Figure 33:
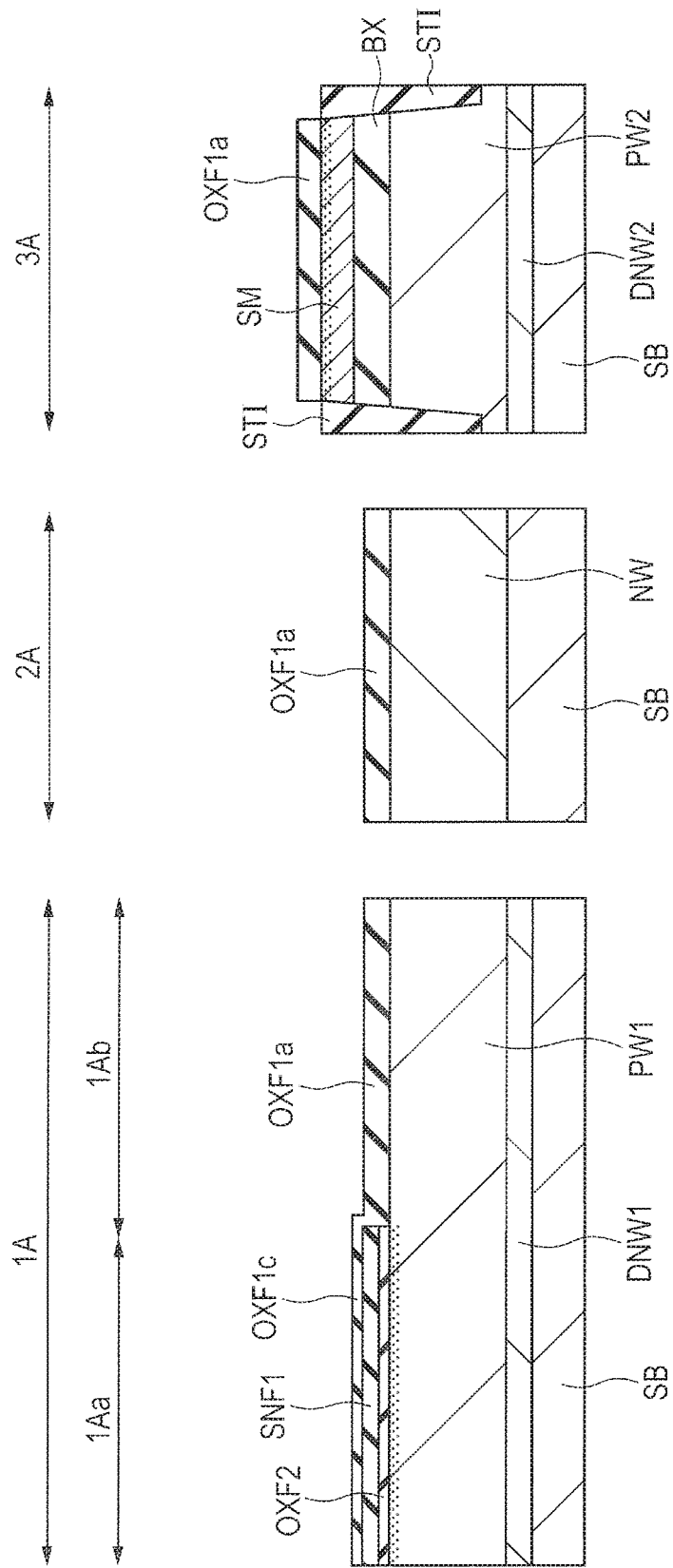
FIG. 33 is a sectional view illustrating the manufacturing process of the semiconductor device following FIG. 32.

Subsequently, as shown in FIG. 33, the rapid thermal oxidation process and the ISSG oxidation process are performed in a combined manner. Consequently, the silicon oxide film OXF1a is formed on the surface of the p-type well PW1 in the selection transistor formation region 1Ab, on the surface of the n-type well NW in the high-withstand-voltage field effect transistor formation region 2A, and on the surface of the semiconductor layer SM in the low-withstand-voltage field effect transistor formation region 3A, and the silicon oxide film OXF1c is formed on the silicon nitride film SNF1 in the memory transistor formation region 1Aa. Thickness of the silicon oxide film OXF1c is smaller than thickness of the silicon oxide film OXF1a. In addition, nitrogen segregated in the surface of the semiconductor layer SM is incorporated in the silicon oxide film OXF1a formed on the semiconductor layer SM in the low-withstand-voltage field effect transistor formation region 3A.

Figure 34:
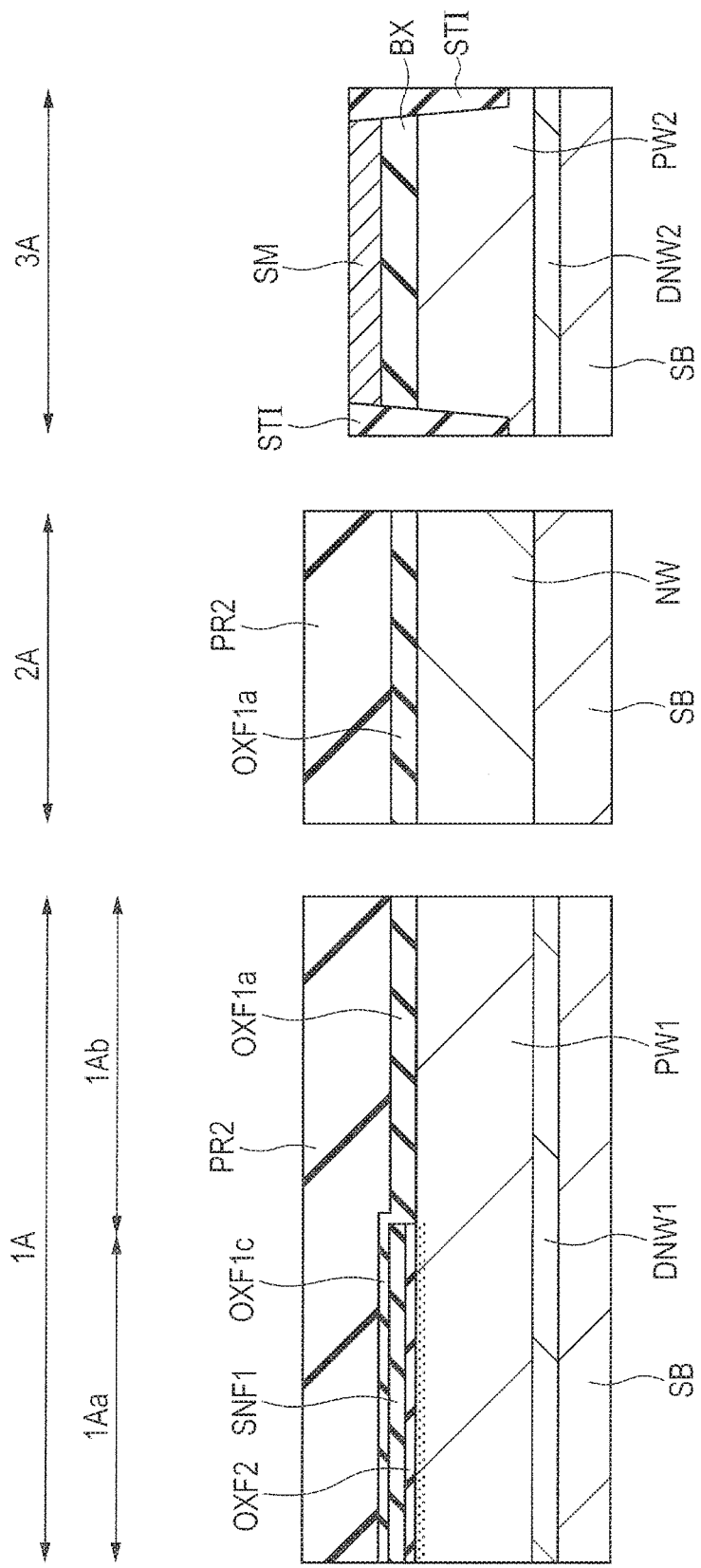
FIG. 34 is a sectional view illustrating the manufacturing process of the semiconductor device following FIG. 33.

Subsequently, as shown in FIG. 34, the resist film PR2 is patterned using a photolithography technique to cover the memory cell formation region 1A and the high-withstand-voltage field effect transistor formation region 2A, and expose the low-withstand-voltage field effect transistor formation region 3A. Subsequently, wet etching with hydrofluoric acid is performed with the patterned resist film PR2 as a mask.

Consequently, the silicon oxide film OXF1a exposed from the patterned resist film PR2 is removed in the low-withstand-voltage field effect transistor formation region 3A. In this way, nitrogen segregated in the surface of the semiconductor layer SM is removed from the low-withstand-voltage field effect transistor formation region 3A. Subsequent steps are similar to those of the method of manufacturing the semiconductor device of the first embodiment; hence, description of the steps is omitted.

Characteristics of Second Embodiment

A characteristic point of the second embodiment is now described. In the characteristic point of the second embodiment, nitrogen segregated in the surface of the semiconductor layer SM in the low-withstand-voltage field effect transistor formation region 3A is removed with the silicon oxide film OXF1a rather than with the sacrificial layer DF1. Consequently, it is possible to suppress an increase in shaving amount of the silicon oxide film in an area from the element isolation part STI defining the low-withstand-voltage field effect transistor formation region 3A to the buried insulating layer BX. As a result, it is possible to suppress an increase in leakage current between the gate electrode and the support substrate in the low-withstand-voltage field effect transistor formed in the low-withstand-voltage field effect transistor formation region 3A.

Figure 35:
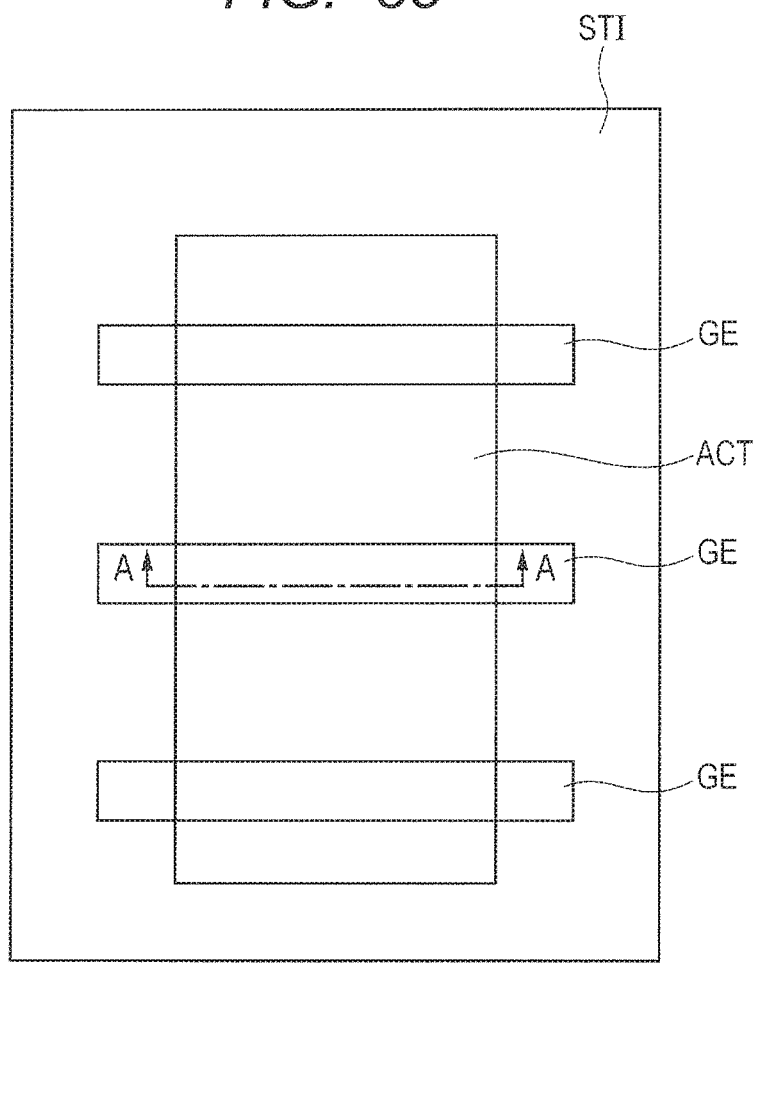
FIG. 35 is a view illustrating a planar layout configuration of a low-withstand-voltage field effect transistor formation region.
Figure 36:
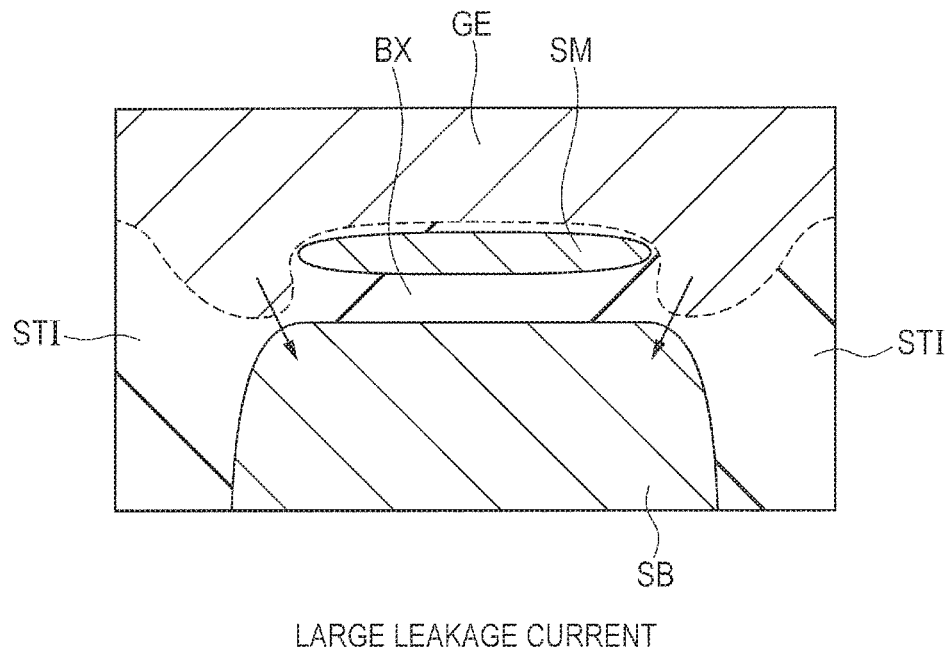
FIG. 36 is a schematic sectional view along a line A-A in FIG. 35, showing a case of a large shaving amount in an area from an element isolation part to a buried insulating layer.
Figure 37:
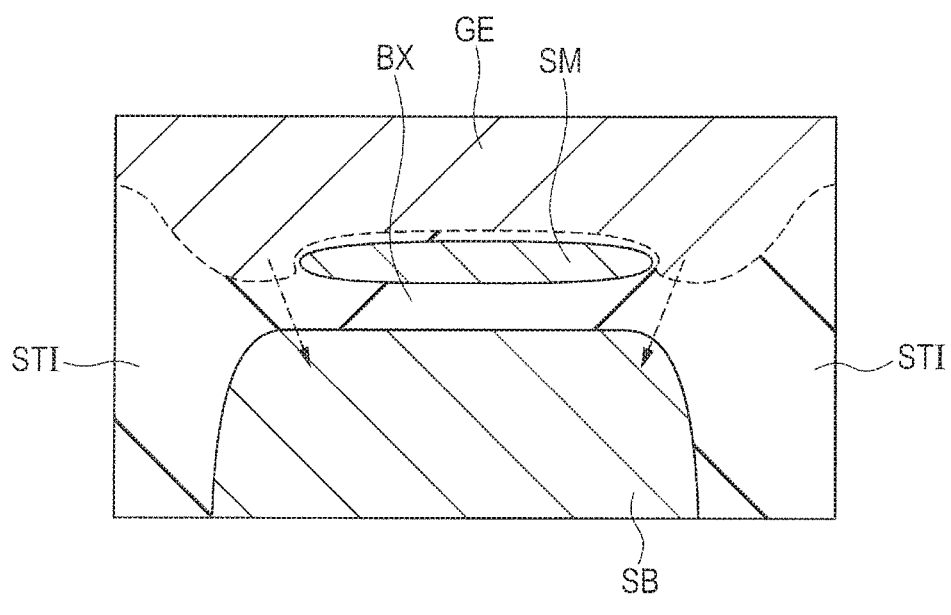
FIG. 37 is a schematic sectional view along the line A-A in FIG. 35, showing a case of a small shaving amount in the area from the element isolation part to the buried insulating layer.

This is described in detail below. FIG. 35 is a view schematically illustrating a planar layout configuration of the low-withstand-voltage field effect transistor formation region 3A, for example. In FIG. 35, an active region ACT is surrounded by the element isolation part STI, and a plurality of gate electrodes GE are each arranged in the y direction while extending in the x direction. FIG. 36 is a schematic sectional view along a line A-A in FIG. 35, for example. In FIG. 36, the element isolation part STI is formed on both sides of the support substrate SB, and the semiconductor layer SM is formed on the support substrate SB with the buried insulating layer BX in between. The element isolation part STI is connected with the buried insulating layer BX. The buried insulating layer BX has a thickness of about 10 to 20 nm, for example. The gate electrode GE is formed from on the element isolation part STI to on the semiconductor layer SM. As shown in FIG. 36, when the shaving amount of the silicon oxide film in the area from the element isolation part STI to the buried insulating layer BX increases, thickness of the buried insulating layer BX decreases and thus a distance between the gate electrode GE and the support substrate SB is reduced, leading to an increase in leakage current between the gate electrode GE and the support substrate SB. On the other hand, for example, as shown in FIG. 37, when the shaving amount of the silicon oxide film in the area from the element isolation part STI to the buried insulating layer BX is smaller, the distance between the gate electrode GE and the support substrate SB is increased, leading to a decrease in leakage current between the gate electrode GE and the support substrate SB. It is therefore necessary to make an effort such that shaving of the silicon oxide film does not occur to the utmost in the area from the element isolation part STI to the buried insulating layer BX.

With this regard, while the element isolation part STI and the buried insulating layer BX are formed of the silicon oxide film, the silicon oxide film is shaped (etched) when being exposed to hydrofluoric acid, for example. It is therefore desirable to decrease opportunities where the silicon oxide film in the area from the element isolation part STI to the buried insulating layer BX is exposed to hydrofluoric acid in light of suppressing shaving of the silicon oxide film in that area.

For example, the method of manufacturing the semiconductor device of the first embodiment uses hydrofluoric acid for removing the buried insulating layer BX formed in each of the selection transistor formation region 1Ab and the high-withstand-voltage field effect transistor formation region 2A, and removing the silicon oxide film OXF2 formed in the low-withstand-voltage field effect transistor formation region 3A during transition from the step of FIG. 17 to the step of FIG. 18. As a result, the element isolation part STI defining the low-withstand-voltage field effect transistor formation region 3A is exposed to the hydrofluoric acid (first time). Subsequently, hydrofluoric acid is used for removing the sacrificial film DF1 formed in each of the selection transistor formation region 1Ab, the high-withstand-voltage field effect transistor formation region 2A, and the low-withstand-voltage field effect transistor formation region 3A during transition from the step of FIG. 19 to the step of FIG. 20. As a result, the element isolation part STI defining the low-withstand-voltage field effect transistor formation region 3A is exposed to the hydrofluoric acid (second time). Furthermore, hydrofluoric acid is used for removing the silicon oxide film OXF1a formed in the low-withstand-voltage field effect transistor formation region 3A during transition from the step of FIG. 21 to the step of FIG. 22. As a result, the element isolation part STI defining the low-withstand-voltage field effect transistor formation region 3A is exposed to the hydrofluoric acid (third time). As described above, the method of manufacturing the semiconductor device of the first embodiment has three opportunities where the element isolation part STI defining the low-withstand-voltage field effect transistor formation region 3A is exposed to the hydrofluoric acid.

On the other hand, in the method of manufacturing the semiconductor device of the second embodiment, as shown in FIG. 30, since the low-withstand-voltage field effect transistor formation region 3A is covered with the resist film PR1, the element isolation part STI defining the low-withstand-voltage field effect transistor formation region 3A is not exposed to the hydrofluoric acid used for removing the buried insulating layer BX formed in each of the selection transistor formation region 1Ab and the high-withstand-voltage field effect transistor formation region 2A. That is, the method of manufacturing the semiconductor device of the second embodiment has only two opportunities where the element isolation part STI defining the low-withstand-voltage field effect transistor formation region 3A is exposed to the hydrofluoric acid.

In this way, the second embodiment has the characteristic point of removing the nitrogen introduced in the semiconductor layer SM in the low-withstand-voltage field effect transistor formation region 3A with the silicon oxide film OXF1a rather than with the sacrificial film DF1. As a result, it is possible to decrease the opportunities where the element isolation part STI defining the low-withstand-voltage field effect transistor formation region 3A is exposed to the hydrofluoric acid. This means that the second embodiment reduces the shaving amount of the silicon oxide film in the area from the element isolation part STI to the buried insulating layer BX compared with the first embodiment. As a result, the second embodiment can reduce the leakage current between the gate electrode GE and the support substrate SB compared with the first embodiment.

Modification

The first and second embodiments have been described with an example where the memory cell and the high-withstand-voltage field effect transistor are formed on the support substrate SB, while the low-withstand-voltage field effect transistor is formed on the semiconductor layer SM that is formed on the support substrate SB with the buried insulating layer BX in between. However, the basic idea of each of the first and second embodiments is not limited to such a configuration, and may be widely applied to a configuration where the memory cell, the high-withstand-voltage field effect transistor, and the low-withstand-voltage field effect transistor are formed in a bulk substrate.

Although the invention achieved by the inventors has been described in detail according to some embodiments thereof hereinbefore, the invention should not be limited thereto, and it will be appreciated that various modifications or alterations thereof may be made within the scope without departing from the gist of the invention.

What is claimed is:

1. A method of manufacturing a semiconductor device having a first field effect transistor formation region and a memory transistor formation region, the method comprising the steps of:
   (a) forming a first insulating film on a surface of a substrate in the memory transistor formation region;
   (b) after the step (a), performing heat treatment on the substrate in an atmosphere containing nitrogen to introduce nitrogen into the first insulating film in the memory transistor formation region;
   (c) after the step (b), forming a second insulating film having a trap level on the first insulating film in the memory transistor formation region, and on the first field effect transistor formation region;
   (d) after the step (c), exposing the surface of the substrate in the first field effect transistor formation region;
   (e) after the step (d), forming a sacrificial film on the surface of the substrate in the first field effect transistor formation region;
   (f) after the step (e), removing the sacrificial film;
   (g) after the step (f), forming a third insulating film on the surface of the substrate in the first field effect transistor formation region and on the second insulating film in the memory transistor formation region;
   (h) after the step (g), forming a first conductor film from on the third insulating film formed in the first field effect transistor formation region to on the third insulating film formed in the memory transistor formation region; and
   (i) after the step (h), patterning the first conductor film to form a first gate electrode in the first field effect transistor formation region and forma memory gate electrode in the memory transistor formation region.

2. The method according to claim 1,
   wherein the sacrificial film is a silicon oxide film, and
   wherein in the step (e), a thermal oxidation process is used.

3. The method according to claim 2, wherein in the step (e), a rapid thermal oxidation process is used.

4. The method according to claim 2, wherein in the step (e), an in-situ steam generation (ISSG) oxidation process is used.

5. The method according to claim 1,
wherein the second insulating film is a silicon nitride film,
wherein the third insulating film is a silicon oxide film, and
wherein in the step (g), a combination of a rapid thermal oxidation process and an ISSG oxidation process is used.

6. The method according to claim 5, wherein thickness of the third insulating film formed in the first field effect transistor formation region is larger than thickness of the third insulating film formed in the memory transistor formation region.

7. The method according to claim 1, wherein the first field effect transistor formation region is a region in which a selection transistor for selecting a memory transistor to be formed in the memory transistor formation region is to be formed.

8. The method according to claim 1, wherein the first field effect transistor formation region is a region in which a high-withstand-voltage field effect transistor is to be formed.

9. The method according to claim 1, wherein the first field effect transistor formation region is a region in which a field effect transistor for configuring an input-output circuit is to be formed.

10. The method according to claim 1, wherein the first field effect transistor formation region is a region in which a p-channel-type field effect transistor is to be formed.

11. The method according to claim 1,
wherein the third insulating film is a silicon oxide film, the method further comprising, after the step (g) and before the step (h), a step of:
performing plasma treatment with plasma containing nitrogen on a surface of the third insulating film.

12. The method according to claim 1,
wherein the semiconductor device includes a second field effect transistor formation region having a buried insulating layer formed on the substrate and a semiconductor layer formed on the buried insulating layer, and
wherein an impurity concentration of the semiconductor layer in the second field effect transistor formation region is lower than an impurity concentration of the channel formation region in the first field effect transistor formation region.

13. The method according to claim 12,
wherein in the step (a), the first insulating film is formed on the surface of the substrate in the memory transistor formation region and on the semiconductor layer in the second field effect transistor formation region,
wherein in the step (c), the second insulating film is formed on the buried insulating layer in the first field effect transistor formation region, on the first insulating film in the second field effect transistor formation region, and on the first insulating film in the memory transistor formation region,
wherein in the step (d), exposing the surface of the substrate in the first field effect transistor formation region and exposing the semiconductor layer in the second field effect transistor formation region,
wherein in the step (e), forming the sacrificial film on the surface of the substrate in the first field effect transistor formation region and on the semiconductor layer in the second field effect transistor formation region,
wherein in the step (f), removing the sacrificial film formed in each of the first field effect transistor formation region and the second field effect transistor formation region,
wherein in the step (g), forming the third insulating film on the surface of the substrate in the first field effect transistor formation region, on the semiconductor layer in the second field effect transistor formation region, and on the second insulating film in the memory transistor formation region,
wherein the method further comprises, after the step (g) and before the step (h), the steps of:
(j) removing the third insulating film formed in the second field effect transistor formation region; and
(k) after the step (j), forming a fourth insulating film thinner than the third insulating film on the semiconductor layer in the second field effect transistor formation region,
wherein in the step (h) performed after the step (k), the first conductor film is formed on the third insulating film formed in the first field effect transistor formation region, on the third insulating film formed in the memory transistor formation region, and on the fourth insulating film formed in the second field effect transistor formation region, and
wherein in the step (i), the first conductor film is patterned to form the first gate electrode in the first field effect transistor formation region, form the memory gate electrode in the memory transistor formation region, and form a second gate electrode in the second field effect transistor formation region.

14. The method according to claim 12,
wherein in the step (a), the first insulating film is formed on the surface of the substrate in the memory transistor formation region and on the semiconductor layer in the second field effect transistor formation region,
wherein in the step (c), the second insulating film is formed on the buried insulating layer in the first field effect transistor formation region, on the first insulating film in the second field effect transistor formation region, and on the first insulating film in the memory transistor formation region,
wherein in the step (e), the sacrificial film is formed on the surface of the substrate in the first field effect transistor formation region while the second field effect transistor formation region is covered with the first insulating film,
wherein in the step (f), the sacrificial film is removed, and the first insulating film formed in the second field effect transistor formation region is removed,
wherein in the step (g), the third insulating film is formed on the surface of the substrate in the first field effect transistor formation region, on the semiconductor layer in the second field effect transistor formation region, and on the second insulating film in the memory transistor formation region,
wherein the method further comprises, after the step (g) and before the step (h), the steps of:
(j) removing the third insulating film formed in the second field effect transistor formation region; and
(k) after the step (j), forming a fourth insulating film thinner than the third insulating film on the semiconductor layer in the second field effect transistor formation region,
wherein in the step (h) performed after the step (k), the first conductor film is formed on the third insulating film formed in the first field effect transistor formation region, on the third insulating film formed in the memory transistor formation region, and on the fourth insulating film formed in the second field effect transistor formation region, and wherein in the step (i), the first conductor film is patterned to form the first gate electrode in the first field effect transistor formation region, form the memory gate electrode in the memory transistor formation region, and form a second gate electrode in the second field effect transistor formation region.

* * * * *